US008968973B2

(12) United States Patent
Kanna et al.

(10) Patent No.: US 8,968,973 B2
(45) Date of Patent: Mar. 3, 2015

(54) COLOR FILTER AND PRODUCTION METHOD THEREOF, AND SOLID-STATE IMAGE SENSOR USING THE SAME

(75) Inventors: Shinichi Kanna, Shizuoka-ken (JP); Kazuya Oota, Kanagawa (JP); Yosuke Murakami, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 451 days.

(21) Appl. No.: 12/533,019

(22) Filed: Jul. 31, 2009

(65) Prior Publication Data

US 2010/0040963 A1 Feb. 18, 2010

(30) Foreign Application Priority Data

Aug. 14, 2008 (JP) .................. 2008-209083

(51) Int. Cl.
*G02B 5/20* (2006.01)
(52) U.S. Cl.
USPC ............................................................. 430/7
(58) Field of Classification Search
None
See application file for complete search history.

(56) References Cited

U.S. PATENT DOCUMENTS

| 5,278,009 A | 1/1994 | Iida et al. | |
|---|---|---|---|
| 2002/0172873 A1* | 11/2002 | Ueda et al. | 430/7 |
| 2002/0192596 A1* | 12/2002 | Ueda et al. | 430/281.1 |
| 2006/0229376 A1* | 10/2006 | Hayashi et al. | 522/6 |
| 2007/0203255 A1* | 8/2007 | Sasaki | 522/49 |
| 2009/0017265 A1 | 1/2009 | Eriguchi et al. | |
| 2011/0117496 A1 | 5/2011 | Eriguchi et al. | |

FOREIGN PATENT DOCUMENTS

| GB | 2 344 346 A | * | 6/2000 |
|---|---|---|---|
| JP | 62-113106 A | | 5/1987 |
| JP | 2-027317 A | | 1/1990 |
| JP | 3-251819 A | | 11/1991 |
| JP | 4-236212 A | | 8/1992 |
| JP | 6-75375 A | | 3/1994 |
| JP | 7-140654 A | | 6/1995 |
| JP | 9-325210 A | * | 12/1997 |
| JP | 2002-229205 A | | 8/2002 |
| JP | 2007-316182 A | | 12/2007 |
| JP | 2008-15204 A | | 1/2008 |
| JP | 2008-015204 A | | 1/2008 |
| JP | 2008-83422 A | | 4/2008 |
| JP | 2008-089708 A | | 4/2008 |
| JP | 2008-165021 | | 7/2008 |
| JP | 2008-197370 A | * | 8/2008 |
| JP | 2009-186657 | | 8/2009 |
| WO | 2007/119384 A | | 10/2007 |

OTHER PUBLICATIONS

Computer-generated translation of JP 2008-197370 (Aug. 2008).*
Computer-generated transaltion of JP 9-325210 (Dec. 1997).*
Computer-generated transaltion of JP 2008-015204 (Jan. 2008).*
Corresponding EPO Official communication.
Japanese Office Action dated Jul. 3, 2012 issued in the corresponding Japanese Application.
Japanese Office Action dated Apr. 16, 2013, issued in corresponding Japanese Patent Application.
Taiwanese Office Action dated Jul. 10, 2014, issued in corresponding Taiwanese Patent Application.
English language translation of the following: Office action dated Aug. 19, 2014 from the JPO in a Japanese patent application corresponding to the instant patent applicaion. This office action translation is submitted now in order to supplement the understanding of patent document JP2009-186657 which is cited in the office action and is being disclosed in the instant Information Disclosure Statement.
English language translation of the following: Office action dated Mar. 26, 2014 from the TIPO in a Taiwanese patent application corresponding to the instant patent application. This office action translation is submitted now in order to supplement the understanding of patent document JP2008-165021 which is cited in the office action and is being disclosed in the instant Information Disclosure Statement.

* cited by examiner

*Primary Examiner* — John A. McPherson
(74) *Attorney, Agent, or Firm* — Solaris Intellectual Property Group, PLLC

(57) ABSTRACT

A method of producing a color filter includes (a) forming a colored pattern on a substrate by exposing and developing a colored curable composition containing a dye, a polymerizable monomer and an organic solvent, (b) forming a transparent protective film on the colored pattern, and (c) irradiating at least the transparent protective film with light after forming the transparent protective film on the colored pattern.

8 Claims, No Drawings

COLOR FILTER AND PRODUCTION METHOD THEREOF, AND SOLID-STATE IMAGE SENSOR USING THE SAME

CROSS-REFERENCE TO RELATED APPLICATION

This application claims priority under 35 USC 119 from Japanese Patent Application No. 2008-209083 filed on Aug. 14, 2008, the disclosure of which is incorporated by reference herein.

BACKGROUND OF THE INVENTION

1. Field of Invention

The invention relates to a color filter used for a liquid crystal display device or a solid-state image sensor, a production method of the color filter, and a solid-state image sensor using the color filter.

2. Description of the Related Art

As a method of producing a color filter used for a liquid crystal display device (LCD and the like) or a solid-state image sensor (CCD, CMOS and the like), a pigment dispersion method has been widely known.

The pigment dispersion method is a method of producing a color filter by a photolithographic method using a colored photosensitive composition in which a pigment is dispersed in a photosensitive composition. In this method, since the patterns are formed by the photolithographic method, the method exhibits a high accuracy in positioning and is suitable for producing a color filter having a large size and a high definition. When a color filter is produced by the pigment dispersion method, a photosensitive composition is applied on a glass substrate with a spin coater, a roll coater or the like to form a coated layer and the coated layer is pattern-exposed and developed to form colored pixels. This operation is performed repeatedly for the respective colors, whereby a color filter can be obtained.

As examples of the pigment dispersion method, a method using a negative photosensitive composition in which an alkali soluble resin is used in combination with a photopolymerizable monomer and a photopolymerization initiator is described (for example, see Japanese Patent Application Laid-Open (JP-A) Nos. 2-181704, 2-199403, 5-273411, and 7-140654).

In recent years, further high definition has been required for the color filter for solid-state image sensors in particular. However, in conventional pigment dispersion systems, it is difficult to further increase resolution, and there is a problem of unevenness of color which is generated due to the influence of coarse particles of pigment. Accordingly, the pigment dispersion system has not been suitable for the use of solid-state image sensors, in which, for example, minute patterns with a pixel size of from 1.5 μm square to 3.0 μm square are required.

In response, there has been proposed a technique in which a dye is used in place of a pigment (for example, see JP-A No. 6-75375). Furthermore, in recent years, a colored pattern with a thin film (for example, 1 μm or less in thickness) is required in the color filter used for a solid-state image sensor, in order to improve image quality which is achieved through good light-condensing and color separation properties. Accordingly, the dye concentration in a color filter must be increased in order to reduce the film thickness in view of obtaining sufficient color density.

In the production process of a color filter, a transparent protective film may be formed on a colored pattern having, for example, red (R), green (G) and blue (B). In general, the transparent protective film is formed in such a manner that a coating liquid for a protective film is coated on a colored pattern and then the protective film is subjected to heat treatment to be cured. For example, there is disclosed a technique, in which a thermosetting resin composition, which contains a polymer including an epoxy group-containing structural unit, an oxetanyl group-containing structural unit and an alkoxysilyl group-containing structural unit, and a polymer including an epoxy group-containing structural unit and an acrylate-based structural unit, is used, and the thermosetting resin composition is coated on the surface of a color filter at the side of the colored layer and is cured to form a protective film (for example, refer to JP-A No. 2008-83422).

SUMMARY OF THE INVENTION

In the forming process of a protective film, when a coating liquid is subjected to a heat treatment at a high temperature after the coating liquid is coated, dyes may be exuded from a colored pattern provided at a lower side of the protective film, whereby the color purity (namely, color hue), contrast, and further color vividness and definition (sharpness) of an image may be deteriorated in the finally obtained color filter. This phenomenon becomes more significant when the dye concentration contained in the colored pattern increases.

The invention has been made in view of the above circumstances, and an object of the invention is to provide a method of producing a color filter with high color purity and definition in which exuding of the dye and color mixing is prevented, and to provide a color filter capable of displaying an image with high color purity and definition and a solid-state image sensor using the color filter.

Aspects of the invention include those described below.

<1> A method of producing a color filter including: (a) forming a colored pattern on a substrate by exposing and developing a colored curable composition containing a dye, a polymerizable monomer and an organic solvent; (b) forming a transparent protective film on the colored pattern; and (c) irradiating at least the transparent protective film with light after forming the transparent protective film on the colored pattern.

<2> The method of producing a color filter according to <1>, wherein the colored curable composition further contains a photopolymerization initiator and at least one of a fluorine-based surfactant or a silicone-based surfactant.

<3> The method of producing a color filter according to <1> or <2>, wherein the transparent protective film in (b) is formed by using a transparent curable composition containing a photopolymerization initiator, a polymerizable unsaturated compound and an organic solvent.

<4> The method of producing a color filter according to any one of <1> to <3>, wherein the transparent protective film in (c) is irradiated with light having a wavelength of 365 nm, 405 nm or 436 nm (for example, the i-line ray, h-line ray or g-line ray).

<5> The method of producing a color filter according to any one of <1> to <3>,
wherein the transparent protective film in (c) is irradiated with light including ultraviolet light having a wavelength of 300 nm or less (for example, light emitted from a high-pressure mercury lamp).

<6> The method of producing a color filter according to any one of <3> to <5>, wherein the transparent protective film in (c) is irradiated with light such that the reaction rate of a polymerizable group of the polymerizable unsaturated compound (hereinafter, referred to as the "monomer reaction rate") in the transparent protective film is 50% or more.

<7> The method of producing a color filter according to any one of <1> to <6>, wherein the dye is an acid dye.

<8> The method of producing a color filter according to any one of <1> to <7>, wherein the content of the dye is 40% by mass or more with respect to the total solid content of the colored curable composition.

<9> The method of producing a color filter according to any one of <3> to <8>, wherein the photopolymerization initiator in the transparent curable composition is an oxime compound.

<10> A color filter formed by the method of producing a color filter according to any one of <1> to <9>.

<11> A solid-state image sensor having the color filter according to <10>.

DETAILED DESCRIPTION OF THE INVENTION

Hereinafter, the method of producing a color filter, a color filter obtained by the method and a solid-state image sensor according to the invention are described in detail.

Color Filter and Method of Producing Color Filter

The method of producing the color filter according to the invention includes: (a) forming a colored pattern on a substrate by exposing and developing a colored curable composition containing a dye, a polymerizable monomer and an organic solvent (which hereinafter may be referred to as a "colored pattern forming process"); (b) forming a transparent protective film on the formed colored pattern (which hereinafter may be referred to as a "transparent protective film forming process"); and (c) irradiating at least the transparent protective film with light after forming the transparent protective film on the colored pattern (which hereinafter may be referred to as a "light irradiation treatment process"). The method of producing a color filter of the invention may further contain other processes.

In the invention, since the transparent protective film formed on the colored pattern is cured by a light irradiation treatment, not by a thermal curing, sufficient curing properties can be obtained while suppressing exuding of the dye from the colored pattern. Accordingly, the color purity and color density of colored patterns (pixels) adjacent to each other, and the definition, sharpness and contrast of an image when displaying the image, can be effectively enhanced.

In particular, the method can be effective for producing a color filter for a solid-state image sensor, since a color filter for a solid-state image sensor has a pixel pattern with smaller size than that of other color filters such as a color filter for an LCD or the like (for example, in a color filter for a solid-state image sensor, the length of a side of a pixel pattern viewed from the normal line of a substrate may be 2 µm or less (for example, 0.5 µm to 2.0 µm). A color filter for a solid-state image sensor also has a high content of dye due to its thin film thickness (for example, 1 µm or less), and lacks a partitioning wall pattern such as a black matrix between the color pixels.

(a) Colored Pattern Forming Process

In the colored pattern forming process in the invention, a colored curable composition that contains a dye, a polymerizable monomer, and an organic solvent is exposed and developed to form a colored pattern on a substrate. The colored pattern serves as pixel areas that are colored with the dye and that constitute a color filter.

Preparation of Colored Curable Composition

When the colored curable composition is prepared, components for constituting the composition may be directly added into the same mixture, or, alternatively, the respective components may be dissolved in two or more different solvents, which are then sequentially added to form a composition. When performing the compounding, the order in which the components are compounded, and the conditions of operation are not particularly limited. For example, the composition may be formed by simultaneously dissolving all the components in a solvent. In another example, in accordance with the necessity, the components are dissolved in two or more different solutions appropriately, and the obtained solutions are mixed at the time of use (at the time of coating).

The colored curable composition prepared as above may be filtrated before use, by using a filter such as the MILLIPORE Filter (trademark), preferably using a pore size of from 0.01 µm to 3.0 µm, and more preferably from 0.05 µm to 0.5 µm.

Pattern Formation using Colored Curable Composition

A method of forming a colored pattern (color filter) using the colored curable composition is explained.

First, the prepared colored curable composition is coated on a substrate, by a coating method such as a rotation coating, cast coating, or roll coating to form a curable composition layer (colored layer) sensitive to radiation (coating process), and the curable composition layer may be subjected to a preheating (prebaking) to be dried as needed.

Examples of the substrate include soda glass, a borosilicate glass (such as PYREX (registered trademark) glass), quartz glass, and substrates each obtained by attaching a transparent conductive film to any of these materials, which are used in a liquid crystal display and the like; photoelectric conversion element substrates that are used in image sensors, such as a silicone substrate; and a complementary metal-oxide semiconductor (CMOS). These substrates may have black stripes that separate the respective pixels.

Furthermore, on these substrates, an undercoat layer may be provided, if necessary, for the purpose of improving the adhesion with upper layers, preventing material diffusion, or flattening the substrate surface.

Regarding the prebaking condition, the prebaking may be conducted by heating at a temperature of from 70° C. to 130° C. for about 0.5 minutes to about 15 minutes using a hot plate or an oven.

The thickness of the colored layer formed with the colored curable composition is appropriately selected in accordance with the intended use, and, in general, the thickness is preferably from 0.2 µm to 5.0 µm, more preferably from 0.3 µm to 2.5 µm and still more preferably from 0.3 µm to 1.5 µm. Here, the thickness of the colored layer represents the thickness of the layer after the prebaking.

Next, the colored layer formed with the colored curable composition is irradiated with light or radiation through a predetermined mask pattern (exposure process).

The light or the radiation used at the irradiation is preferably g-line, h-line, i-line, KrF radiation or ArF radiation, and more preferably i-line. When i-line is used at the irradiation, the irradiation is preferably conducted with an exposure amount of from 100 mJ/cm$^2$ to 10,000 mJ/cm$^2$.

Exposure of the colored curable composition of the invention may be conducted by any of a proximity method, a mirror projection method, or a stepper method. It is preferable to conduct exposure by the stepper method (a reduction-projection exposure method using a reduction-projection exposure apparatus). In the stepper method, patterns are formed by conducting exposure while changing the exposure amount step by step. The rectangularity of patterns can be improved by conducting exposure by the stepper method. Examples of an exposure apparatus used for the stepper exposure include an i-line stepper (trade name: FPA-3000i5+, manufactured by Canon Inc.).

Development is performed after the exposure (development process). A negative-working or positive-working colored pattern (resist pattern) may be formed by the development with a developer.

As the developer, aqueous alkaline solutions or various combinations of organic solvents may be used, as long as the developer dissolves uncured portions and does not dissolve cured potions (for example, portions irradiated with radiation) of the colored curable composition. Specifically, various combinations of organic solvents or aqueous alkaline solutions may be used. Examples of the organic solvents include solvents that can be used when the colored curable composition of the invention is prepared, which will be described below.

The aqueous alkaline solution is preferably an aqueous alkaline solution obtained by dissolving an alkaline compound in pure water to have a concentration of from 0.001% by mass to 10% by mass, more preferably from 0.01% by mass to 1% by mass. Examples of the alkaline compound include sodium hydroxide, potassium hydroxide, sodium carbonate, sodium silicate, sodium metasilicate, aqueous ammonia, ethylamine, diethylamine, dimethylethanolamine, tetramethylammonium hydroxide, tetraethylammonium hydroxide, choline, pyrrole, piperidine, and 1,8-diazabicyclo-[5.4.0]-7-undecene.

When such an aqueous alkaline solution is used as a developer, washing with water is usually performed after the development.

When an aqueous alkaline solution is used as a developer, the concentration of alkali is preferably regulated so as to have a pH value of from 11 to 13, and more preferably a pH value of from 11.5 to 12.5. In particular, an aqueous alkaline solution containing tetraethyl ammonium hydroxide at a concentration of from 0.001% by mass to 10% by mass (preferably 0.01% by mass to 5% by mass) may be used.

The developing time is preferably from 30 s to 300 s, and more preferably from 30 s to 120 s.

The development temperature is preferably from 20° C. to 40° C., and more preferably 23° C.

The development may be performed by a paddle method, a shower method, a spray method or the like. Moreover, washing with water may be performed after development with an aqueous alkaline solution. The washing method may be selected in accordance with the intended purpose. For example, a rinse treatment may be performed in which, while a silicon wafer is rotated at a revolution rate of from 10 rpm to 500 rpm, pure water is showered down on the silicon wafer from a discharge nozzle from above the center of rotation of the silicon wafer.

Thereafter, as a post-curing process, the formed colored pattern may be subjected to post-heating and/or post-exposing to cure the pattern, as required.

The post-heating may be performed preferably from 100° C. to 300° C., and more preferably from 150° C. to 250° C., using a hot plate or an oven. The post-heating time is preferably from 30 s to 30,000 s, and more preferably from 60 s to 1,000 s The post-exposure may be performed with g-line, h-line, i-line, KrF radiation, ArF radiation, ultraviolet (UV) light, electron beam, X-rays or the like, preferably with g-line, h-line, i-line or ultraviolet (UV) light, and more preferably with UV light. It is preferable that the irradiation with UV light (UV curing) is performed at low temperatures such as from 20° C. to 50° C. (preferably from 25° C. to 40° C.). It is preferable that the wavelength distribution of UV light includes a wavelength range of from 200 nm to 300 nm. As the light source, for example, a high-pressure mercury lamp, a low-pressure mercury lamp or the like may be used. The irradiation time may be from 10 s to 180 s, preferably from 20 s to 120 s, and more preferably from 30 s to 60 s.

Either of the post-exposure or the post-heating may be performed first. It is preferable that the post-exposure is performed prior to the post-heating. This is because the curing can be promoted by the post-exposure, thereby suppressing the shape deformation due to heat sagging, drooping and footing of the pattern, which would be otherwise observed during the post-heating.

The colored pattern thus obtained forms part of pixels of a color filter. When producing a color filter having a colored pattern (that is, color pixels) with plural color hues, the pattern forming process (and, optionally, the curing process, as needed) is repeated in accordance with the number of colors as desired, so that a color filter with desired number of color hues can be produced.

Each of the components for forming the colored curable composition is described below in detail.

The colored curable composition of the invention includes at least a dye, a polymerizable monomer and an organic solvent, and, if necessary, the colored curable composition may further include at least one of a photopolymerization initiator, a binder component such as an alkali-soluble binder, a surfactant such as a fluorine-based surfactant or a silicone-based surfactant, and other components.

Dye

The colored curable composition of the invention includes at least one kind of dye. The dye to be used is not particularly limited, and may be selected from known dyes for color filters. Among them, organic solvent-soluble dyes that are soluble in organic solvents are preferable.

For example, the colorants disclosed in JP-A Nos. 64-90403, 64-91102, 1-94301 and 6-11614, Japanese Patent No. 2592207, U.S. Pat. Nos. 4,808,501, 5,667,920 and 5,059,500, JP-A Nos. 5-333207, 6-35183, 6-51115, and 6-194828 may be used.

Regarding the chemical structure of the dye, for example, azo dyes such as pyrazole azo dyes, anilinoazo dyes, arylazo dyes, pyrazolotriazole azo dyes, and pyridone azo dyes; triphenylmethane dyes, anthraquinone dyes, anthrapyridone dyes, benzylidene dyes, oxonol dyes, cyanine dyes, phenothiazine dyes, pyrrolopyrazole azomethine dyes, xanthene dyes, phthalocyanine dyes, benzopyran dyes, and indigo dyes may be used. Among them, pyrazole azo dyes, anilinoazo dyes, pyrazolotriazole azo dyes, pyridone azo dyes, anthraquinone dyes, and anthrapyridone dyes are preferable.

When the composition is formulated as a resist that can be developed with water or an alkali solution, acid dyes and/or derivatives thereof are preferable in order to completely remove the binder and/or dye by the development. Other preferable examples of dyes that can be used include direct dyes, basic dyes, mordant dyes, acid mordant dyes, azoic dyes, disperse dyes, oil-soluble dyes and food dyes, and derivatives thereof.

The acid dye and derivatives thereof will be described below.

Acid Dye and Derivatives Thereof

The acid dye is not particularly limited as long as it has an acidic group such as a sulfonic acid group, a carboxylic acid group or a phenolic hydroxyl group. The acid dye may be selected in consideration of each required property such as solubility in the below-mentioned organic solvent, solubility in a developer used for the development, salt forming ability with basic compounds, light absorbance, interaction with other components in the curable composition, light fastness, or heat resistance.

Specific examples of the acidic dye include the following. However, in the invention, the acidic dye is not limited thereto. Examples include:

acid alizarin violet N;

acid black 1, 2, 24, 48;

acid blue 1, 7, 9, 15, 18, 23, 25, 27, 29, 40, 42, 45, 51, 62, 70, 74, 80, 83, 86, 87, 90, 92, 96, 103, 112, 113, 120, 129, 138, 147, 150, 158, 171, 182, 192, 210, 242, 243, 256, 259, 267, 278, 280, 285, 290, 296, 315, 324:1, 335, 340;

acid chrome violet K;

acid Fuchsin;

acid green 1, 3, 5, 9, 16, 25, 27, 50, 58, 63, 65, 80, 104, 105, 106, 109;

acid orange 6, 7, 8, 10, 12, 26, 50, 51, 52, 56, 62, 63, 64, 74, 75, 94, 95, 107, 108, 169, 173;

acid red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 182, 183, 198, 206, 211, 215, 216, 217, 227, 228, 249, 252, 257, 258, 260, 261, 266, 268, 270, 274, 277, 280, 281, 308, 312, 315, 316, 339, 341, 345, 346, 349, 382, 383, 394, 401, 412, 417, 418, 422, 426;

acid violet 6B, 7, 9, 17, 19;

acid yellow 1, 3, 7, 9, 11, 17, 23, 25, 29, 34, 36, 38, 40, 42, 54, 65, 72, 73, 76, 79, 98, 99, 111, 112, 113, 114, 116, 119, 123, 128, 134, 135, 138, 139, 140, 144, 150, 155, 157, 160, 161, 163, 168, 169, 172, 177, 178, 179, 184, 190, 193, 196, 197, 199, 202, 203, 204, 205, 207, 212, 214, 220, 221, 228, 230, 232, 235, 238, 240, 242, 243, 251;

Direct Yellow 2, 33, 34, 35, 38, 39, 43, 47, 50, 54, 58, 68, 69, 70, 71, 86, 93, 94, 95, 98, 102, 108, 109, 129, 136, 138, 141;

Direct Orange 34, 39, 41, 46, 50, 52, 56, 57, 61, 64, 65, 68, 70, 96, 97, 106, 107;

Direct Red 79, 82, 83, 84, 91, 92, 96, 97, 98, 99, 105, 106, 107, 172, 173, 176, 177, 179, 181, 182, 184, 204, 207, 211, 213, 218, 220, 221, 222, 232, 233, 234, 241, 243, 246, 250;

Direct Violet 47, 52, 54, 59, 60, 65, 66, 79, 80, 81, 82, 84, 89, 90, 93, 95, 96, 103, 104;

Direct Blue 57, 77, 80, 81, 84, 85, 86, 90, 93, 94, 95, 97, 98, 99, 100, 101, 106, 107, 108, 109, 113, 114, 115, 117, 119, 137, 149, 150, 153, 155, 156, 158, 159, 160, 161, 162, 163, 164, 166, 167, 170, 171, 172, 173, 188, 189, 190, 192, 193, 194, 196, 198, 199, 200, 207, 209, 210, 212, 213, 214, 222, 228, 229, 237, 238, 242, 243, 244, 245, 247, 248, 250, 251, 252, 256, 257, 259, 260, 268, 274, 275, 293;

Direct Green 25, 27, 31, 32, 34, 37, 63, 65, 66, 67, 68, 69, 72, 77, 79, 82;

Mordant Yellow 5, 8, 10, 16, 20, 26, 30, 31, 33, 42, 43, 45, 56, 50, 61, 62, 65;

Mordant Orange 3, 4, 5, 8, 12, 13, 14, 20, 21, 23, 24, 28, 29, 32, 34, 35, 36, 37, 42, 43, 47, 48;

Mordant Red 1, 2, 3, 4, 9, 11, 12, 14, 17, 18, 19, 22, 23, 24, 25, 26, 30, 32, 33, 36, 37, 38, 39, 41, 43, 45, 46, 48, 53, 56, 63, 71, 74, 85, 86, 88, 90, 94, 95;

Mordant Violet 2, 4, 5, 7, 14, 22, 24, 30, 31, 32, 37, 40, 41, 44, 45, 47, 48, 53, 58;

Mordant Blue 2, 3, 7, 8, 9, 12, 13, 15, 16, 19, 20, 21, 22, 23, 24, 26, 30, 31, 32, 39, 40, 41, 43, 44, 48, 49, 53, 61, 74, 77, 83, 84;

Mordant Green 1, 3, 4, 5, 10, 15, 19, 26, 29, 33, 34, 35, 41, 43, 53;

Food Yellow 3; and derivatives of these dyes.

Among them, acid black 24; acid blue 23, 25, 29, 62, 80, 86, 87, 92, 138, 158, 182, 243, 324:1; acid orange 8, 51, 56, 63, 74; acid red 1, 4, 8, 34, 37, 42, 52, 57, 80, 97, 114, 143, 145, 151, 183, 217, 249; acid violet 7; acid yellow 17, 25, 29, 34, 42, 72, 76, 99, 111, 112, 114, 116, 134, 155, 169, 172, 184, 220, 228, 230, 232, 243; acid green 25; and derivatives thereof are preferable.

Preferable examples of the acid dye further include azo dyes, xanthene dyes, and phthalocyanine dyes other than those described above, and also include C.I. solvent blue 44 and 38, C. I. Solvent orange 45, rhodamine B, rhodamine 110, 3-[(5-chloro-2-phenoxyphenyl)hydrazono]-3,4-dihydro-4-oxo-5-[(phenylsulfonyl)amino]-2,7-Naphthalenedisulfonic acid, and derivatives thereof.

Examples of usable derivatives of acid dyes include an inorganic salt of an acid dye having an acidic group such as a sulfonic acid group or a carboxylic acid group; a salt of an acid dye with a nitrogen-containing compound; and an amide compound such as a sulfonamidated form of an acid dye. The derivatives of acid dyes are not particularly limited as long as they are soluble in the colored curable composition when the colored curable composition is prepared as a solution. The derivatives of acid dyes may be selected in consideration of each required property such as solubility in an organic solvent, solubility in a developer used for the development, light absorbance, interaction with other components in the curable composition, light-fastness, or heat resistance.

The salt of an acid dye with a nitrogen-containing compound will be described below. The salt of an acid dye with a nitrogen-containing compound may be effective in improving solubility of the acid dye (imparting solubility in organic solvents), heat resistance or light-fastness.

The nitrogen-containing compound that forms a salt with the acid dye, and the nitrogen-containing compound that forms an amide bond with the acid dye may be selected in consideration of each property such as solubility of the salt or amide compound in an organic solvent or a developer, salt forming ability, the light absorbance and color value of the dye, interaction with other components in the composition, and heat resistance and light-fastness as a coloring agent. When the nitrogen-containing compound is selected in consideration of only the light absorbance and color value, the nitrogen-containing compound having molecular weight as small as possible is preferable. The molecular weight of the nitrogen-containing compound is preferably 300 or less, more preferably 280 or less, and still more preferably 250 or less.

The molar ratio of nitrogen-containing compound to acidic dye (hereinafter, the ration is referred to as "n") in the salt of an acidic dye and a nitrogen-containing compound will be described. n represents a value defining the molar ratio between the acidic dye molecule and the nitrogen-containing compound (an amine compound) serving as a counter ion, and may be selected arbitrarily depending on the salt forming condition of the acidic dye with the amine compound. Specifically, a salt in which the ratio of the number of the basic functional groups of the amine compound to the number of the acidic functional groups of the acidic dye is in a range of $0 < n \leq 5$ is often used in practical applications. The molar ratio is selected in consideration of each required property such as solubility in an organic solvent and a developer, salt forming ability, absorbance, interaction with other components in the curable composition, light-fastness, or heat resistance. When the molar ratio is selected in consideration of only the absorbance, n is preferably in a range of $0 < n \leq 4.5$; more preferably in a range of $0 < n \leq 4$; and still more preferably in a range of $0 < n \leq 3.5$.

Since the acidity of the above acidic dyes derives from introduction of an acidic group into their structures, the dyes can be converted to a non-acidic dye by changing the introduced substituent. Although the acidic dyes may be effective in an alkaline development, the acidic dyes may sometimes be developed excessively. Therefore, there are cases in which a non-acidic dye is preferably used. Examples of the non-acidic dye that can be used include dyes having structures in which the acidic groups of the above acidic dyes have been removed.

Next, compounds that are preferable as dyes will be explained.

Compounds Represented by Formula (M1)

In the invention, at least one kind of azo dye represented by the following formula (M1) is preferably contained as a dye.

Formula (M1)

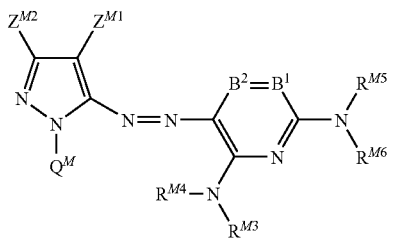

In Formula (M1), $Z^{M1}$ represents an electron-withdrawing group having a Hammett's substituent constant $\sigma_p$ of 0.20 or more. Preferably, $Z^{M1}$ represents an electron-withdrawing group having a $\sigma_p$ of from 0.30 to 1.0. Specific examples of preferable electron-withdrawing substituents include those described below, among which an acyl group having 2 to 12 carbon atoms, an alkyloxy carbonyl group having 2 to 12 carbon atoms, a nitro group, a cyano group, an alkylsulfonyl group having 1 to 12 carbon atoms, an arylsulfonyl group having 6 to 18 carbon atoms, a carbamoyl group having 1 to 12 carbon atoms, and an alkyl halide group having 1 to 12 carbon atoms are preferable. Among them, a cyano group, an alkylsulfonyl group having 1 to 12 carbon atoms, and an arylsulfonyl group having 6 to 18 carbon atoms are preferable, and a cyano group is more preferable.

In Formula (M1), $B^1$ and $B^2$ each independently represent —$CR^{M1}$=, —$CR^{M2}$=, or a nitrogen atom. Preferably, $B^1$ represents —$CR^{M1}$= and $B^2$ represents —$CR^{M2}$=.

$R^{M1}$ and $R^{M2}$ each independently represent a hydrogen atom, a halogen atom, an aliphatic group, an aromatic group, a heterocyclic group, a cyano group, a carboxyl group, a carbamoyl group, an alkoxy carbonyl group, an aryloxy carbonyl group, an acyl group, a hydroxyl group, an alkoxy group, an aryloxy group, a silyloxy group, an acyloxy group, a carbamoyloxy group, a heterocyclyloxy group, an alkoxy carbonyloxy group, an aryloxy carbonyloxy group, "an amino group substituted with an alkyl group, an aryl group or a heterocyclic group", an acyl amino group, a ureido group, a sulfamoylamino group, an alkoxycarbonylamino group, an aryloxycarbonylamino group, an alkylsulfonylamino group, an arylsulfonylamino group, a nitro group, an alkylthio group, an arylthio group, an alkylsulfonyl group, an arylsulfonyl group, an alkylsulfinyl group, an arylsulfinyl group, a sulfamoyl group, a sulfo group or a heterocyclylthio group, and each of these groups may be further substituted.

Preferable examples of the group represented by $R^{M1}$ or $R^{M2}$ include a hydrogen atom, an alkyl group, an alkoxycarbonyl group, a carboxyl group, a carbamoyl group and a cyano group, and each of these groups may further have a substituent.

In Formula (M1), $Z^{M2}$ has the same definition as that of $R^{M1}$ and $R^{M2}$, and preferable examples thereof include a hydrogen atom, an aliphatic group, an aromatic group and a heterocyclic group. $Z^{M2}$ more preferably represents an aliphatic group or an aromatic group.

In Formula (M1), $R^{M5}$ and $R^{M6}$ each independently represent a hydrogen atom, an aliphatic group, an aromatic group, a heterocyclic group, an acyl group, an alkoxycarbonyl group, an aryloxycarbonyl group, a carbamoyl group, an alkylsulfonyl group, an arylsulfonyl group or a sulfamoyl group, and each of these group may further have a substituent. Preferable examples of the group represented by $R^{M5}$ or $R^{M6}$ include a hydrogen atom, an aliphatic group, an aromatic group, a heterocyclic group, an acyl group, an alkylsulfonyl group, and an arylsulfonyl group. The group represented by $R^{M5}$ or $R^{M6}$ is more preferably a hydrogen atom, an aromatic group, a heterocyclic group, an acyl group, an alkylsulfonyl group or an arylsulfonyl group, and still more preferably a hydrogen atom, an aryl group or a heterocyclic group. It is also preferable that these preferable groups further have a substituent. However, $R^{M5}$ and $R^{M6}$ do not simultaneously represent hydrogen atoms.

Further, $R^{M1}$ and $R^{M5}$, and/or $R^{M5}$ and $R^{M6}$ may be linked to each other to form a 5-membered ring or a 6-membered ring.

In Formula (M1), $R^{M3}$ and $R^{M4}$ each independently represent a hydrogen atom, an aliphatic group, an aromatic group, a heterocyclic group, an acyl group, an alkoxycarbonyl group, an aryloxycarbonyl group, a carbamoyl group, an alkylsulfonyl group, an arylsulfonyl group or a sulfamoyl group. Among them, a hydrogen atom, an aromatic group, a heterocyclic group, an acyl group, an alkylsulfonyl group and an arylsulfonyl group are preferable, and a hydrogen atom, an aromatic group and a heterocyclic group are more preferable.

In Formula (M1), $Q^M$ represents a monocyclic 5-membered heterocyclic group. The heterocyclic group may be unsubstituted or substituted. The heterocyclic group may be a saturated ring or may have an unsaturated bond. Preferable examples of the atoms constituting $Q^M$ include a nitrogen atom, an oxygen atom, a sulfur atom and a carbon atom. Examples of the 5-membered heterocyclic ring include a 1,2,4-thiadiazole ring, a 1,3,4-thiadiazole ring, a 1,2,5-thiadiazole ring, a furan ring, a thiophene ring, a pyrrole ring, an oxazole ring, an isoxazol ring, a thiazole ring, an isothiazole ring, an imidazole ring, a pyrazole ring, a triazole ring, a furazan ring, a pyrroline ring, a pyrrolidine ring, an imidazoline ring, an imidazolidine ring, a pyrazoline ring, a pyrazolidine ring, a 1,2-oxathiolane ring and a 2H-tetrazole ring. However, condensed heterocyclic rings are excluded.

In Formula (M1), it is more preferable that "$Z^{M1}$ represents a cyano group, an alkylsulfonyl group having 1 to 12 carbon atoms, or an arylsulfonyl group (preferably a cyano group) having 6 to 18 carbon atoms; $R^{M1}$ and $R^{M2}$ each independently represent a hydrogen atom, an alkyl group, an alkoxycarbonyl group, a carboxyl group, a carbamoyl group or a cyano group; $Z^{M2}$ represents a hydrogen atom, an aliphatic group, an aromatic group or a heterocyclic group (preferably an aliphatic group or an aromatic group); $R^{M5}$ and $R^{M6}$ each independently represent a hydrogen atom, an aromatic group, a heterocyclic group, an acyl group, an alkylsulfonyl group or an arylsulfonyl group (preferably a hydrogen atom, an aryl group or a heterocyclic group); $R^{M3}$ and $R^{M4}$ each independently represent a hydrogen atom, an aromatic group, a heterocyclic group, an acyl group, an alkylsulfonyl group or an arylsulfonyl group (preferably a hydrogen atom, an aromatic group or a heterocyclic group); and $Q^M$ represents a monocyclic 5-membered heterocyclic group".

When the azo dye represented by Formula (M1) is a water-soluble dye, it is preferable that an ionic hydrophilic group is further contained at the position of any of $Q^M$, $R^{M1}$, $R^{M2}$, $R^{M5}$ and $R^{M6}$. Examples of the ionic hydrophilic group include a sulfo group, a carboxyl group, and a quaternary ammonium group. The ionic hydrophilic group is preferably a carboxyl group or a sulfo group, and more preferably a sulfo group. The carboxyl group and the sulfo group may be in a salt form. Examples of a counter ion for forming the salt include an alkali metal ion (for example, a sodium ion or a potassium ion) and an organic cation (for example, a tetramethylguanidium ion).

Each group in Formula (M1) may further have a substituent, and examples of the substituent include a halogen atom, an aliphatic group, an aromatic group, a heterocyclic group, a cyano group, a carboxyl group, a carbamoyl group, an alkoxycarbonyl group, an aryloxycarbonyl group, an acyl group, a hydroxyl group, an alkoxy group, an aryloxy group, a silyloxy group, an acyloxy group, a carbamoyloxy group, a heterocyclyloxy group, an alkoxycarbonyloxy group, an aryloxycarbonyloxy group, an "amino group substituted with an alkyl group, an aryl group or a heterocyclic group", an acylamino group, a ureido group, a sulfamoylamino group, an alkoxycarbonylamino group, an aryloxycarbonylamino group, an alkylsulfonylamino group, an arylsulfonylamino group, an aryloxycarbonylamino group, a nitro group, an alkylthio group, an arylthio group, an alkylsulfonyl group, an arylsulfonyl group, an alkylsulfinyl group, an arylsulfinyl group, a sulfamoyl group, a sulfo group, a heterocyclylthio group, and an ionic hydrophilic group. Each of these groups may further be substituted with one or more of these groups.

Examples of the compounds (azo dyes) represented by Formula (M1) (Exemplary Compounds ma-1 to ma-7, mb-1 to mb-7, mc-1 to mc-7, md-1 to md-7, me-1 to me-7, mf-1 to mf-7 and mx-1 to mx-4) are shown below. However, the invention is not limited to these compounds.

| Azo Dye | $Q^M$ | $R^{M6}$ |
|---|---|---|
| ma-1 | 3-methyl-1,2,4-thiadiazol-5-yl | —CH$_2$CH$_2$CH$_2$OH |
| ma-2 | 3-methyl-1,2,4-thiadiazol-5-yl | —CH$_2$CH(CH$_2$CH$_3$)CH$_2$CH$_2$CH$_3$ |
| ma-3 | 3-methyl-1,2,4-thiadiazol-5-yl | —COCH$_2$CH$_2$CH$_2$OH |
| ma-4 | 3-methyl-1,2,4-thiadiazol-5-yl | —CH$_2$CH$_2$CH$_2$COOH |

-continued
| | | |
|---|---|---|
| ma-5 | 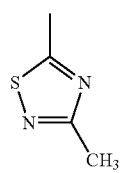 | 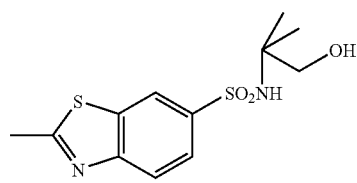 |
| ma-6 | 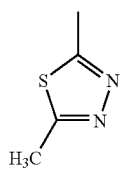 | —CH$_2$CH$_2$CH$_2$OH |
| ma-7 | 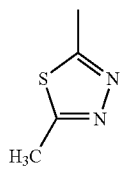 | 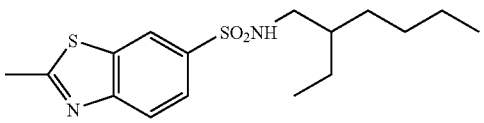 |
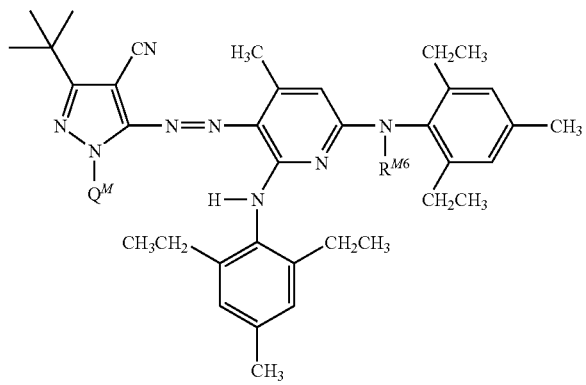
| Azo Dye | Q$^M$ | R$^{M6}$ |
|---|---|---|
| mb-1 | 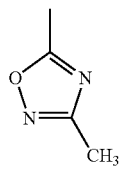 | —CH$_2$CH$_2$OH |
| mb-2 | 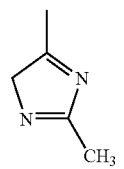 | 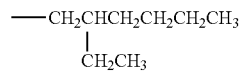 |
| mb-3 | 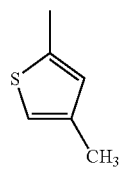 | —COCH$_2$CH$_2$CH$_2$OH |

-continued
mb-4 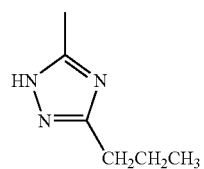 —CH₂CH₂CH₂COOH
mb-5 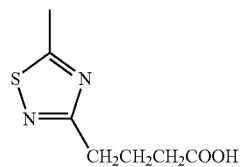 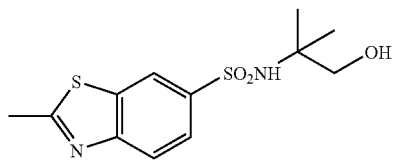
mb-6 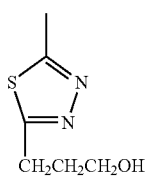 —CH₂CH₂CH₂OH
mb-7 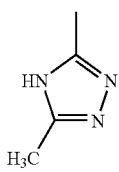 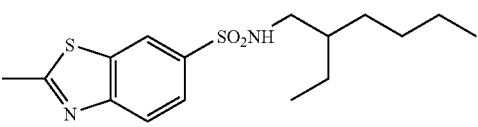
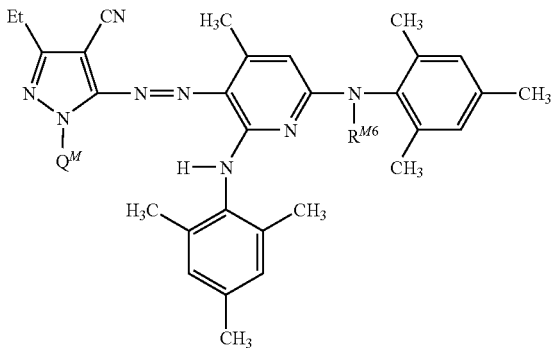
| Azo Dye | $Q^M$ | $R^{M6}$ |
|---|---|---|
| mc-1 | 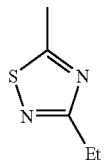 | —CH₂CH₂OH |
| mc-2 | 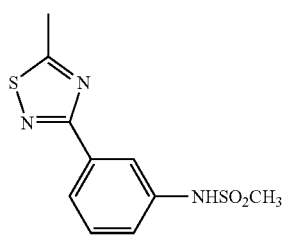 | —CH₂CH(CH₂CH₃)CH₂CH₂CH₂CH₃ |

-continued
| | | |
|---|---|---|
| mc-3 | 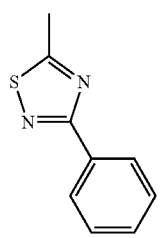 | —COCH$_2$CH$_2$CH$_2$OH |
| mc-4 | 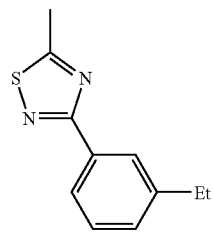 | —CH$_2$CH$_2$CH$_2$COOH |
| mc-5 | 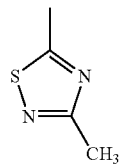 | 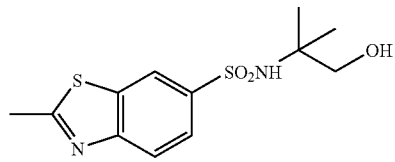 |
| mc-6 | 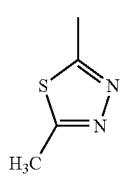 | —CH$_2$CH$_2$OH |
| mc-7 | 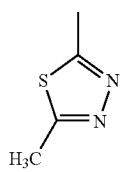 | 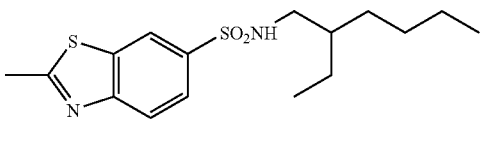 |
| Azo Dye | $Q^M$ | $R^{M6}$ |
|---|---|---|
| md-1 | 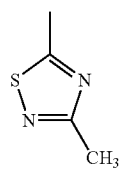 | —CH$_2$CH$_2$OH |

-continued
md-2 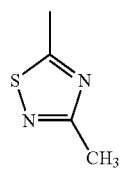 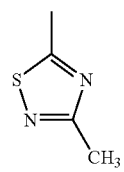
md-3 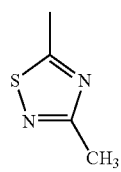 —H
md-4 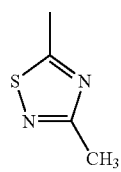 —CH$_2$CH$_2$CH$_2$COOH
md-5 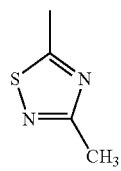 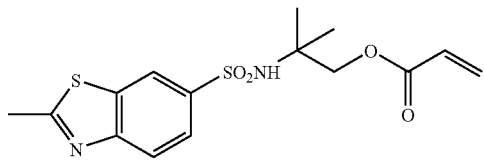
md-6 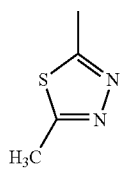 —CH$_2$CH$_2$CH$_2$OH
md-7 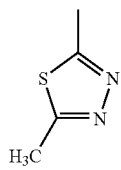 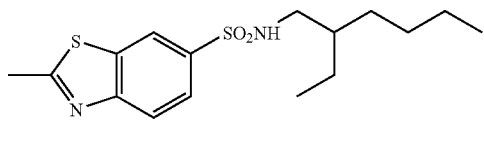

-continued
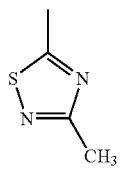
| Azo Dye | $Q^M$ | $R^{M6}$ |
|---|---|---|
| me-1 | 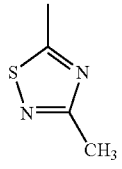 | —CH$_2$CH$_2$CH$_3$ |
| me-2 | 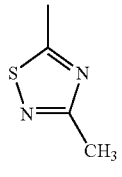 | —CH$_2$CHCH$_2$CH$_2$CH$_3$ <br>                 CH$_2$CH$_3$ |
| me-3 | 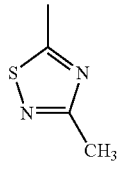 | —COCH$_3$ |
| me-4 | 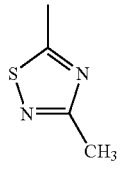 | —H |
| me-5 | 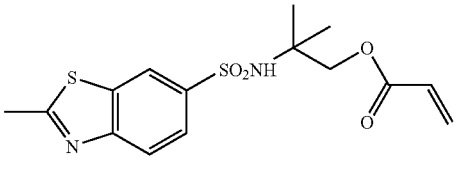 | 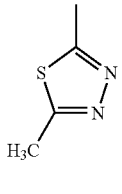 |
| me-6 | 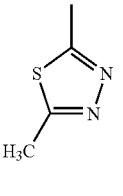 | 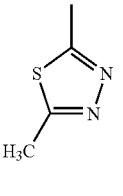 |

-continued

| | | |
|---|---|---|
| me-7 | (2-methyl-1,3,4-thiadiazol-5-yl) | 2-methylbenzothiazole-6-SO₂NH-CH₂CH(C₂H₅)CH₂CH₂CH₂CH₃ |

[Azo dye structure with substituents $Q^M$ and $R^{M6}$]

| Azo Dye | $Q^M$ | $R^{M6}$ |
|---|---|---|
| mf-1 | 2,4-dimethylthiophen-5-yl | —CH₂CH₂CH₂OH |
| mf-2 | 2,4-dimethylfuran-5-yl | —CH₂CH(CH₂CH₃)CH₂CH₂CH₃ |
| mf-3 | 2,4-dimethyl-1H-pyrrol-5-yl | —COCH₂CH₂CH₂OH |
| mf-4 | 2,4-dimethylthiazol-5-yl | —CH₂CH₂NHSO₂CH₃ |
| mf-5 | 2,5-dimethyloxazol-4-yl | 2-methylbenzothiazole-6-SO₂NH-C(CH₃)₂CH₂OH |
| mf-6 | cyclopentyl | —CH₂CH₂CH₂OH |

-continued
mf-7
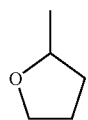 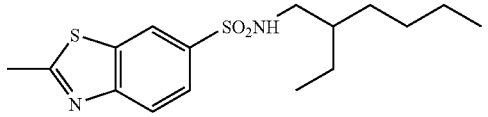
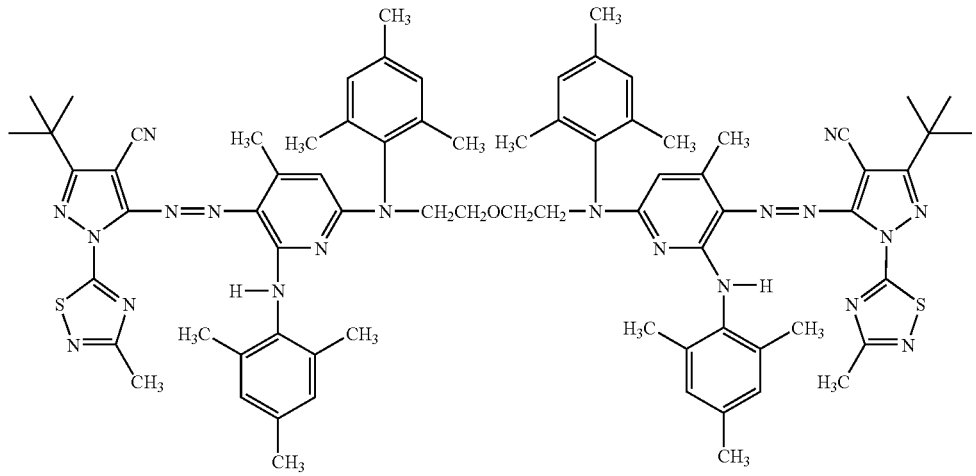
mx-1
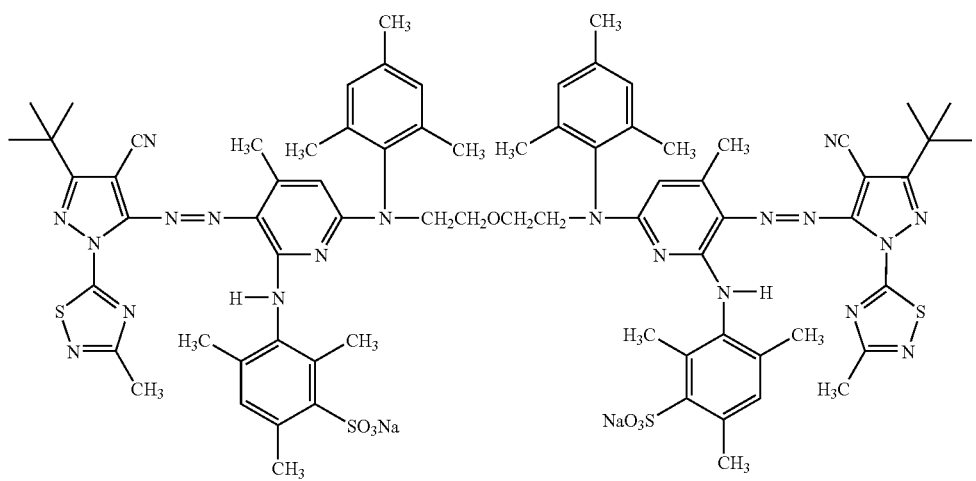
mx-2
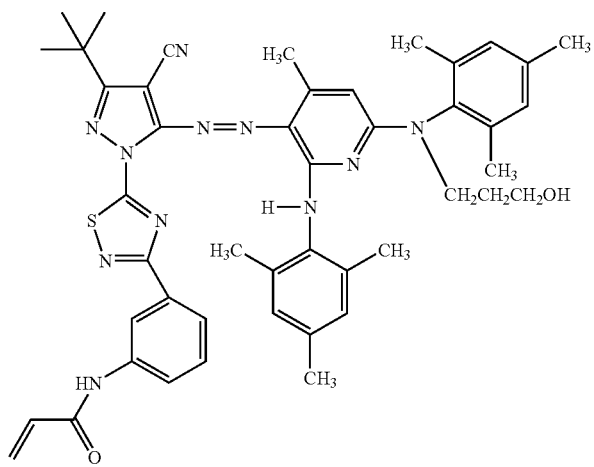
mx-3

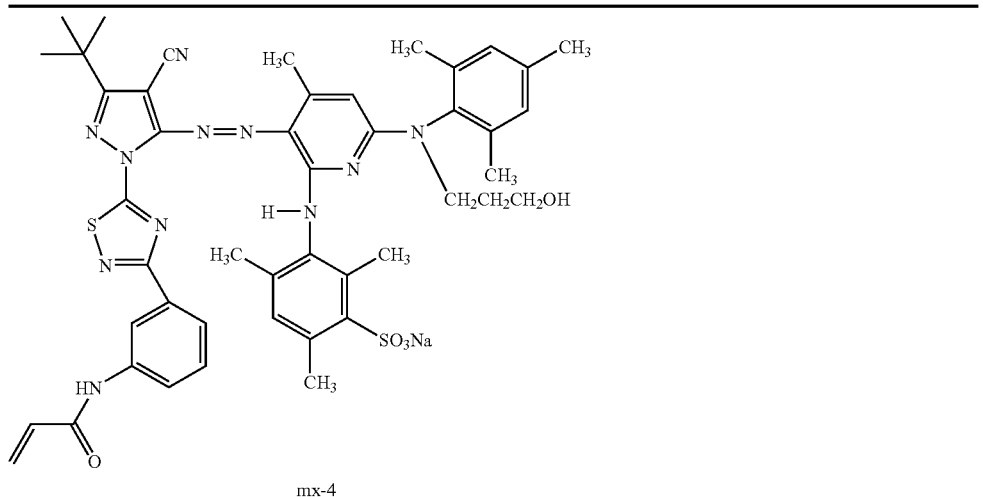

mx-4

The compounds (azo dyes) represented by Formula (M1) can be synthesized, for example, with reference to the method described in paragraphs [0074] to [0077] of JP-A No. 2006-39301, which is incorporated herein by reference.

Compound Represented by Formula (Y1)

Further, it is preferable that the colored curable composition of the invention includes at least one kind of compound represented by the following Formula (Y1) as a dye:

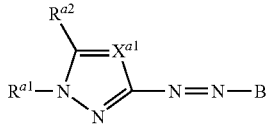

Formula (Y1)

Definition of Substituent

Here, the term, substituent, used in the description of the compound represented by Formula (Y1) and the compound represented by the Formula (K1) described below is explained.

The substituent may be any substitutable group (in other words, any group that can be introduced by substitution), and examples thereof include an alkyl group, an alkenyl group, an alkynyl group, an aryl group, a heterocyclic group, an acyl group, an acyloxy group, an acylamino group, an alkyloxy group, an alkenyloxy group, an alkynyloxy group, an aryloxy group, a heterocyclyloxy group, an alkyloxycarbonyl group, an alkenyloxycarbonyl group, an alkynyloxycarbonyl group, an aryloxycarbonyl group, a heterocyclyloxycarbonyl group, a carbamoyl group, an alkylsulfonyl group, an alkenylsulfonyl group, an alkynylsulfonyl group, an arylsulfonyl group, a heterocyclylsulfonyl group, an alkylsulfonyloxy group, an alkenylsulfonyloxy group, an alkynylsulfonyloxy group, an arylsulfonyloxy group, a heterocyclylsulfonyloxy group, a sulfamoyl group, an alkylsulfonamide group, an alkenylsulfonamide group, an alkynylsulfonamide group, an arylsulfonamide group, a heterocyclylsulfonamide group, an amino group, an alkylamino group, an alkenylamino group, an alkynylamino group, an arylamino group, a heterocyclylamino group, an alkyloxycarbonylamino group, an alkenyloxycarbonylamino group, an alkynyloxycarbonylamino group, an aryloxycarbonylamino group, a heterocyclyloxycarbonylamino group, an alkylsulfinyl group, an alkenylsulfinyl group, an alkynylsulfinyl group, an arylsulfinyl group, an alkylthio group, an alkenylthio group, an alkynylthio group, an arylthio group, a hydroxyl group, a cyano group, a sulfo group, a carboxyl group, an alkyloxyamino group, an alkenyloxyamino group, an alkynyloxyamino group, an aryloxyamino group, a carbamoylamino group, a sulfamoylamino group, a halogen atom, a sulfamoylcarbamoyl group, a carbamoylsulfamoyl group, a dialkyloxyphosphinyl group, a dialkenyloxyphosphinyl group, a dialkynyloxyphosphinyl group, and a diaryloxyphosphinyl group.

In Formula (Y1) and below-described Formula (K1), examples of the halogen atom include a fluorine atom, a chlorine atom, and a bromine atom.

In Formula (Y1) and Formula (K1), the scope of the aliphatic group includes an alkyl group, a substituted alkyl group, an alkenyl group, a substituted alkenyl group, an alkynyl group, a substituted alkynyl group, an aralkyl group and a substituted aralkyl group. The aliphatic group may have a branch and may contain a ring. The number of the carbon atom(s) of the aliphatic group is preferably from 1 to 20, and more preferably from 1 to 16. The aryl moiety in the aralkyl group and the substituted aralkyl group is preferably a phenyl group or a naphthyl group, and more preferably a phenyl group. Examples of the aliphatic group include a methyl group, an ethyl group, a butyl group, an isopropyl group, t-butyl group, a hydroxyethyl group, a methoxyethyl group, a cyanoethyl group, a trifluoromethyl group, 3-sulfopropyl group, 4-sulfobutyl group, a cyclohexyl group, a benzyl group, 2-phenethyl group, a vinyl group, and an allyl group.

In Formula (Y1) and Formula (K1), the scope of the aromatic group includes an aryl group and a substituted aryl group. The aryl group is preferably a phenyl group or a naphthyl group, and more preferably a phenyl group. The number of the carbon atoms of the aromatic group is preferably from 6 to 20, and more preferably from 6 to 16. Examples of the aromatic group include a phenyl group, a p-tolyl group, a p-methoxy phenyl group, an o-chlorophenyl group, and m-(3-sulfopropylamino)phenyl group.

In Formula (Y1) and Formula (K1), the scope of the heterocyclic group includes a heterocyclic group having a substituent and an unsubstituted heterocyclic group. The heterocyclic group may be condensed with an aliphatic ring, an aromatic ring or another heterocyclic ring. The heterocyclic group is preferably a 5-membered or 6-membered heterocyclic group. Examples of the substituent on the heterocyclic group include an aliphatic group, a halogen atom, an alkyl group, an arylsulfonyl group, an acyl group, an acylamino group, a sulfamoyl group, a carbamoyl group, and an ionic hydrophilic group. Examples of the heterocyclic ring include a 2-pyridyl group, a 2-thienyl group, a 2-thiazolyl group, a 2-benzothiazolyl group, a 2-benzoxazolyl group, and a 2-furyl group.

In Formula (Y1) and Formula (K1), the scope of the carbamoyl group includes a carbamoyl group having a substituent and an unsubstituted carbamoyl group. Examples of the substituent on the carbamoyl group include an alkyl group. Examples of the carbamoyl group include a methylcarbamoyl group and a dimethylcarbamoyl group.

In Formula (Y1) and Formula (K1), the scope of the alkoxycarbonyl group includes an alkoxycarbonyl group having a substituent and an unsubstituted alkoxycarbonyl group. The alkoxycarbonyl group is preferably an alkoxycarbonyl group having 2 to 12 carbon atoms. Examples of the substituent on the alkoxycarbonyl group include an ionic hydrophilic group. Examples of the alkoxycarbonyl group include a methoxycarbonyl group and an ethoxycarbonyl group.

In Formula (Y1) and Formula (K1), the scope of the aryloxycarbonyl group includes an aryloxycarbonyl group having a substituent and an unsubstituted aryloxycarbonyl group. The aryloxycarbonyl group is preferably an aryloxycarbonyl group having 7 to 12 carbon atoms. Examples of the substituent on the aryloxycarbonyl group include an ionic hydrophilic group. Examples of the aryloxycarbonyl group include a phenoxycarbonyl group.

In Formula (Y1) and Formula (K1), the scope of the acyl group includes an acyl group having a substituent and an unsubstituted acyl group. The acyl group is preferably an acyl group having 1 to 12 carbon atoms. Examples of the substituent on the acyl group include an ionic hydrophilic group. Examples of the acyl group include an acetyl group and a benzoyl group.

In Formula (Y1) and Formula (K1), the scope of the alkoxy group includes an alkoxy group having a substituent and an unsubstituted alkoxy group. The alkoxy group is preferably an alkoxy group having 1 to 12 carbon atoms. Examples of the substituent on the alkoxy group include an alkoxy group, a hydroxyl group and an ionic hydrophilic group. Examples of the alkoxy group include a methoxy group, an ethoxy group, an isopropoxy group, a methoxyethoxy group, a hydroxyethoxy group and a 3-carboxypropoxy group.

In Formula (Y1) and Formula (K1), the scope of the aryloxy group includes an aryloxy group having a substituent and an unsubstituted aryloxy group. The aryloxy group is preferably an aryloxy group having 6 to 12 carbon atoms. Examples of the substituent on the aryloxy group include an alkoxy group and an ionic hydrophilic group. Examples of the aryloxy group include a phenoxy group, a p-methoxyphenoxy group, and an o-methoxyphenoxy group.

In Formula (Y1) and Formula (K1), the scope of the acyloxy group includes an acyloxy group having a substituent and an unsubstituted acyloxy group. The acyloxy group is preferably an acyloxy group having 1 to 12 carbon atoms. Examples of the substituent on the acyloxy group include an ionic hydrophilic group. Examples of the acyloxy group include an acetoxy group and a benzoyloxy group.

In Formula (Y1) and Formula (K1), the scope of the carbamoyloxy group includes a carbamoyloxy group having a substituent and an unsubstituted carbamoyloxy group. Examples of the substituent on the carbamoyloxy group include an alkyl group. Examples of the carbamoyloxy group include an N-methylcarbamoyloxy group.

In Formula (Y1) and Formula (K1), the heterocyclyloxy group may be unsubstituted or may have a substituent. Examples of the heterocyclic ring include a furan ring, a thiophene ring, a pyrrole ring, an oxazole ring, an imidazole ring, a pyrazole ring, a furazan ring, a pyridine ring, a pyrimidine ring, a pyrazine ring, an indole ring, a quinoline ring, and a xanthene ring. Example of the substituent of the heterocyclyloxy group include an aliphatic group, an aromatic group, an acyl group, an alkoxy group, a carbamoyl group, a sulfamoyl group, an alkylsulfonylamino group, an alkoxycarbonylamino group, a sulfonic acid group, and a carboxylic acid group. Preferable examples of the heterocyclyloxy group include a pyrrolyloxy group, a pyrazolyloxy group, an imidazolyloxy group, a pyrazinyloxy group, a pyrimidyloxy group, and a pyrimidinyloxy group.

In Formula (Y1) and the following Formula (K1), the scope of the alkoxy carbonyloxy group includes an alkoxycarbonyloxy group having a substituent and an unsubstituted alkoxycarbonyloxy group. The alkoxy moiety has preferably 2 to 16 carbon atoms. Examples of the substituent on the alkoxycarbonyloxy group include an aliphatic group, an aromatic group, an acyl group, an alkoxy group, a carbamoyl group, a sulfamoyl group, an alkylsulfonylamino group, an alkoxycarbonylamino group, a sulfonic acid group, and a carboxylic acid group. Examples of the alkoxycarbonyloxy group include a methoxycarbonyloxy group, an ethoxycarbonyloxy group, an n-propyloxycarbonyloxy group, a cyclohexyloxycarbonyloxy group, an isobutyloxycarbonyloxy group, and a 2-ethylhexyloxycarbonyloxy group.

In Formula (Y1) and Formula (K1), the scope of the aryloxycarbonyloxy group includes an aryloxycarbonyloxy group having a substituent and an unsubstituted aryloxycarbonyloxy group. The aryl moiety has preferably 6 to 24 carbon atoms. Examples of the substituent on the aryloxycarbonyloxy group include an aliphatic group, an aromatic group, an acyl group, an alkoxy group, a carbamoyl group, a sulfamoyl group, an alkylsulfonylamino group, an alkoxycarbonylamino group, a sulfonic acid group, and a carboxylic acid group. Example of the aryloxycarbonyloxy group include a phenoxycarbonyloxy group, a 4-nitrophenoxycarbonyloxy group, a 2-methoxyphenoxycarbonyloxy group, and a 2,4-dichlorophenoxycarbonyloxy group.

In Formula (Y1) and Formula (K1), the substituent in the "substituted amino group substituted with an alkyl group, an aryl group or a heterocyclic group" may further have a substituent. Unsubstituted amino groups are not included. The alkylamino group is preferably an alkylamino group having 1 to 6 carbon atoms. Examples of the substituent when the alkylamino group has a substituent include an ionic hydrophilic group. Examples of the alkyl amino group include a methylamino group and a diethylamino group. The scope of the arylamino group includes an arylamino group having a substituent and an unsubstituted arylamino group. As the arylamino group, an arylamino group having 6 to 12 carbon atoms is preferable. Furthermore, examples of the substituent when the arylamino group has a substituent include a halogen atom and an ionic hydrophilic group. Examples of the aryl amino group include an anilino group and a 2-chloroanilino group.

In Formula (Y1) and Formula (K1), the scope of the acyl amino group includes an acyl amino group having a substituent. The acyl amino group is preferably an acyl amino group having 2 to 12 carbon atoms. Examples of the substituent on the acyl amino group include an ionic hydrophilic group. Examples of the acyl amino group include an acetylamino group, a propionylamino group, a benzoylamino group, an N-phenyl acetylamino group, and a 3,5-disulfobenzoylamino group.

In Formula (Y1) and Formula (K1), the scope of the ureido group includes a ureido group having a substituent and an unsubstituted ureido group. As the ureido group, a ureido group having 1 to 12 carbon atoms is preferable. Examples of the substituent on the ureido group include an alkyl group and an aryl group. Examples of the ureido group include a 3-methylureido group, a 3,3-dimethylureido group, and a 3-phenylureido group.

In Formula (Y1) and Formula (K1), the scope of the sulfamoylamino group includes a sulfamoylamino group having a substituent and an unsubstituted sulfamoylamino group. Examples of the substituent on the sulfamoylamino group include an alkyl group. Examples of the sulfamoylamino group include an N,N-dipropyl sulfamoylamino group.

In Formula (Y1) and Formula (K1), the scope of the alkoxycarbonylamino group includes an alkoxycarbonylamino group having a substituent and an unsubstituted alkoxycarbonylamino group. The alkoxycarbonylamino group is preferably an alkoxycarbonylamino group having 2 to 12 carbon atoms. Examples of the substituent on the alkoxycarbonylamino group include an ionic hydrophilic group. Examples of the alkoxycarbonylamino group include an ethoxycarbonylamino group.

In Formula (Y1) and Formula (K1), the scope of the aryloxycarbonylamino group includes an aryloxycarbonylamino group having a substituent and an unsubstituted aryloxycarbonyl amino group. The aryloxy carbonyl amino group is preferably an aryloxycarbonyl amino group having 7 to 12 carbon atoms. Examples of the substituent on the aryloxycarbonyl amino group include an ionic hydrophilic group. Examples of the aryloxycarbonylamino group include a phenoxycarbonylamino group.

In Formula (Y1) and Formula (K1), the scope of the alkylsulfonylamino group includes an alkylsulfonylamino group having a substituent and an unsubstituted alkylsulfonylamino group, and the scope of the arylsulfonylamino group includes an arylsulfonylamino group having a substituent and an unsubstituted arylsulfonylamino group. The sulfonylamino group is preferably a sulfonylamino group having 1 to 12 carbon atoms. Examples of the substituents on the alkylsulfonylamino group and arylsulfonylamino group include an ionic hydrophilic group. Examples of the sulfonylamino group include a methanesulfonylamino group, an N-phenyl methanesulfonylamino group, a benzenesulfonylamino group, and a 3-carboxybenzenesulfonylamino group.

In Formula (Y1) and Formula (K1), the scope of the alkylthio group, the arylthio group, and the heterocyclylthio group include an alkylthio group having a substituent, an arylthio group having a substituent, and a heterocyclylthio group having a substituent; and an unsubstituted alkylthio group, an unsubstituted arylthio group, and an unsubstituted heterocyclylthio group. Each of the alkylthio group, the arylthio group and the heterocyclylthio group has preferably 1 to 12 carbon atoms. Examples of the substituents on the alkylthio group, the arylthio group, and the heterocyclylthio group include an ionic hydrophilic group. Examples of the alkylthio group, the arylthio group, and the heterocyclylthio group include a methylthio group, a phenylthio group, and a 2-pyridylthio group.

Further, examples of the alkylsulfonyl group and the arylsulfonyl group include a methanesulfonyl group and a phenylsulfonyl group, respectively.

In Formula (Y1) and the following Formula (K1), examples of the alkylsulfinyl group and the arylsulfinyl group include a methanesulfinyl group and a phenylsulfinyl group, respectively.

In Formula (Y1) and the following Formula (K1), the sulfamoyl group includes a sulfamoyl group having a substituent and an unsubstituted sulfamoyl group. Examples of the substituent on the sulfamoyl group include an alkyl group. Examples of the sulfamoyl group include a dimethylsulfamoyl group and a di(2-hydroxyethyl)sulfamoyl group.

In Formula (Y1), $R^{a1}$ represents an aliphatic group, an aryl group, a heterocyclic group, an acyl group, an aliphatic oxycarbonyl group, an aryloxycarbonyl group, a carbamoyl group, an aliphatic sulfonyl group, an arylsulfonyl group or a sulfamoyl group.

The aliphatic group represented by $R^{a1}$ may be unsubstituted or substituted, and may be unsaturated or saturated. The aliphatic group is preferably an aliphatic group having 1 to 15 carbon atoms in total. Examples of the aliphatic group include a methyl group, an ethyl group, a vinyl group, an allyl group, an ethynyl group, an isopropenyl group, a 2-ethylhexyl group, and a cyclohexyl group.

The aryl group represented by $R^{a1}$ may be unsubstituted or substituted, and is preferably an aryl group having 6 to 16 carbon atoms in total. Examples of the aryl group include a phenyl group, a 4-nitrophenyl group, a 2-nitrophenyl group, a 2-chlorophenyl group, a 2,4-dichlorophenyl group, a 2,4-dimethylphenyl group, a 2-methylphenyl group, a 4-methoxyphenyl group, a 2-methoxyphenyl group, and a 2-methoxycarbonyl-4-nitrophenyl group.

The heterocyclic group represented by $R^{a1}$ may be a saturated ring group or an unsaturated ring group. The heterocyclic group is preferably a heterocyclic group having 3 to 15 carbon atoms in total. Examples of the heterocyclic group include a 3-pyridyl group, a 2-pyridyl group, a 2-pyrimidinyl group, and a 2-pyrazinyl group.

The acyl group represented by $R^{a1}$ may be either an arylcarbonyl group or an aliphatic carbonyl group. The acyl group is preferably an acyl group having 2 to 15 carbon atoms in total. Examples of the acyl group include an acetyl group, a pivaloyl group, and a benzoyl group.

The aliphatic oxycarbonyl group represented by $R^{a1}$ may be unsubstituted or substituted, and may be unsaturated or saturated. The aliphatic oxycarbonyl group is preferably an aliphatic oxycarbonyl group having 1 to 16 carbon atoms in total. Examples of the aliphatic oxycarbonyl group include a methoxycarbonyl group and a butoxycarbonyl group.

The aryloxycarbonyl group represented by $R^{a1}$ may be unsubstituted or substituted. The aryloxycarbonyl group is preferably an aryloxy carbonyl group having 7 to 17 carbon atoms in total. Examples of the aryloxycarbonyl group include a phenoxycarbonyl group.

The carbamoyl group represented by $R^{a1}$ may be unsubstituted or substituted. The carbamoyl group is preferably a carbamoyl group having 1 to 12 carbon atoms in total. Examples of the carbamoyl group include a carbamoyl group and a dimethylcarbamoyl group.

The aliphatic sulfonyl group represented by $R^{a1}$ may be unsubstituted or substituted, and may be unsaturated or saturated. The aliphatic moiety of the aliphatic sulfonyl group preferably has 1 to 15 carbon atoms in total. Examples of the aliphatic sulfonyl group include a methanesulfonyl group, a butanesulfonyl group, and a methoxyethanesulfonyl group.

The arylsulfonyl group represented by $R^{a1}$ may be unsubstituted or substituted. The arylsulfonyl group is preferably an arylsulfonyl group having 6 to 16 carbon atoms in total. Examples of the arylsulfonyl group include a phenylsulfonyl group, a 4-t-butylphenylsulfonyl group, a 4-toluenesulfonyl group, and a 2-toluenesulfonyl group.

The sulfamoyl group represented by $R^{a1}$ may be unsubstituted or substituted. The sulfamoyl group is preferably a sulfamoyl group having 0 to 12 carbon atoms in total. Examples of the sulfamoyl group include a sulfamoyl group and a dimethylsulfamoyl group.

In particular, from the viewpoint of providing the effect of the invention more effectively, $R^{a1}$ represents preferably an aliphatic group, an aryl group or a heterocyclic group, more preferably an aryl group or a heterocyclic group, and still more preferably an aryl group.

In Formula (Y1), $R^{a2}$ represents a hydrogen atom or a substituent. $X^{a1}$ represents —$CR^{a3}$= or a nitrogen atom, and $R^{a3}$ represents a hydrogen atom or a substituent.

The substituent represented by $R^{a2}$ or $R^{a3}$ may be any substitutable group described in the above section for "substituent". Among them, from the viewpoint of providing the effect of the invention more effectively, it is preferable that $R^{a2}$ and $R^{a3}$ each represent one of the following groups, respectively.

That is, it is preferable that $R^{a2}$ represents a hydrogen atom, an aliphatic group, an aryl group, an acyloxy group, an acylamino group, an aliphatic oxy group, an aliphatic sulfonyloxy group, an arylsulfonyloxy group, an aliphatic sulfonamide group, an arylsulfonamide group, an amino group, an aliphatic amino group, an arylamino group, an aliphatic oxycarbonylamino group, an aryloxycarbonylamino group, a heterocyclyloxycarbonyl amino group, a hydroxyl group, a cyano group, a sulfo group, a carbamoylamino group, or a sulfamoylamino group, more preferably a hydrogen atom, an aliphatic group, an aryl group, an acyloxy group, an aliphatic oxy group or an aliphatic sulfonyl oxy group, and still more preferably a hydrogen atom or an aliphatic group.

It is preferable that $R^{a3}$ represents an aliphatic group, an aryl group, an acyl group, an acylamino group, an aliphatic oxycarbonyl group, an aryloxycarbonyl group, a carbamoyl group, an aliphatic sulfonyl group, an arylsulfonyl group, a heterocyclylsulfonyl group, an aliphatic sulfonyloxy group, an arylsulfonyloxy group, an aliphatic sulfonamide group, an arylsulfonamide group, a cyano group or a carboxyl group. $X^{a1}$ represents preferably a nitrogen atom or —$CR^{a3}$= wherein $R^{a3}$ represents any of the above groups. It is more preferable that $R^{a3}$ represents an acyl group, an aliphatic oxycarbonyl group, a carbamoyl group, an aliphatic sulfonyl group, an arylsulfonyl group, a cyano group, or a carboxyl group. It is still more preferable that $X^{a1}$ represents a nitrogen atom or —$CR^{a3}$= wherein $R^{a3}$ represents any of the above groups. It is even more preferable that $R^{a3}$ represents an aliphatic oxycarbonyl group, a carbamoyl group, an aliphatic sulfonyl group, or a cyano group, and it is most preferable that $X^{a1}$ represents a nitrogen atom or —$CR^{a3}$= wherein $R^{a3}$ represents any of the above groups.

In Formula (Y1), B represents a coupler residue.

The coupler residue represented by B is not specifically limited as long as B represents a group capable of coupling with a diazonium salt. Examples of the coupler residue represented by B include a hydrocarbon ring group, a heterocyclic group, and a substituted methylene group. B represents a coupler residue and the dye represented by Formula (Y1) may be either a non-dissociable dye or a dissociable dye (a dye containing a group that dissociates in an alkali to assume an intended color hue). More specific examples of the coupler residue represented by B include the following groups (B-1) to (B-13):

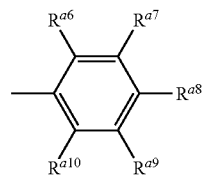 (B-1)

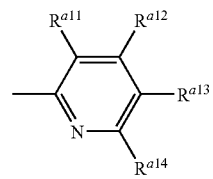 (B-2)

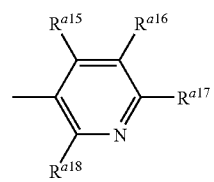 (B-3)

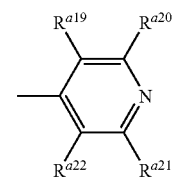 (B-4)

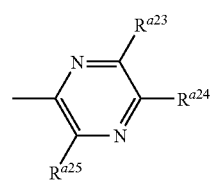 (B-5)

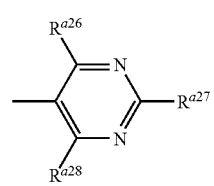 (B-6)

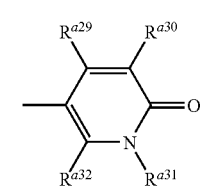 (B-7)

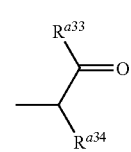 (B-8)

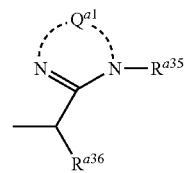 (B-9)

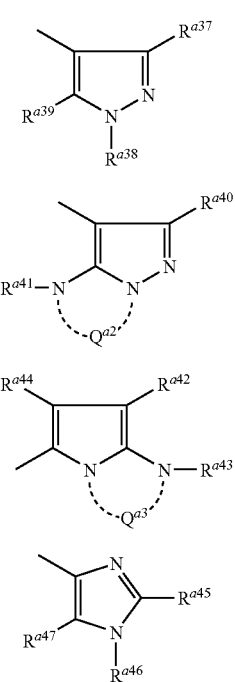

(B-10)

(B-11)

(B-12)

(B-13)

In (B-1) to (B-13), $R^{a6}$ to $R^{a47}$ each independently represent a hydrogen atom or a substituent. Here, the substituent may be any substitutable group described in the above section for "substituent". Preferable examples of the substituent include an aliphatic group, an aryl group, a heterocyclic group, an acyl group, an imide group, an acylamino group, an aliphatic oxy group, an aliphatic oxycarbonyl group, a carbamoyl group, a sulfamoyl group, an aliphatic sulfonamide group, an arylsulfonamide group, an amino group, an aliphatic amino group, an arylamino group, a hydroxyl group, a cyano group, a sulfo group, and a carboxyl group.

Any two adjacent groups in $R^{a6}$ to $R^{a14}$, $R^{a15}$ to $R^{a17}$ and $R^{a45}$ to $R^{a47}$ may be linked to each other, if possible, to form a 5-membered to 7-membered hydrocarbon ring or a 5-membered to 7-membered heterocyclic ring. Similarly, $R^{a19}$ and $R^{a20}$ may be linked to each other, if possible, to form a 5-membered to 7-membered hydrocarbon ring or a 5-membered to 7-membered heterocyclic ring; $R^{a21}$ and $R^{a22}$ may be linked to each other, if possible, to form a 5-membered to 7-membered hydrocarbon ring or a 5-membered to 7-membered heterocyclic ring; $R^{a23}$ and $R^{a24}$ may be linked to each other, if possible, to form a 5-membered to 7-membered hydrocarbon ring or a 5-membered to 7-membered heterocyclic ring; $R^{a29}$ and $R^{a30}$ may be linked to each other, if possible, to form a 5-membered to 7-membered hydrocarbon ring or a 5-membered to 7-membered heterocyclic ring; $R^{a31}$ and $R^{a32}$ may be linked to each other, if possible, to form a 5-membered to 7-membered hydrocarbon ring or a 5-membered to 7-membered heterocyclic ring; $R^{a33}$ and $R^{a34}$ may be linked to each other, if possible, to form a 5-membered to 7-membered hydrocarbon ring or a 5-membered to 7-membered heterocyclic ring; and $R^{a35}$ and $R^{a36}$ may be linked to each other, if possible, to form a 5-membered to 7-membered hydrocarbon ring or a 5-membered to 7-membered heterocyclic ring.

$Q^{a1}$ in (B-9), $Q^{a2}$ in (B-11) and $Q^{a3}$ in (B-12) each independently represent a non-metal atomic group required for forming, together with the nitrogen atoms, a 5-membered to 7-membered ring.

In view of providing the effect of the invention more effectively, in the following combinations:

a combination of $R^{a6}$ and $R^{a8}$;
a combination of $R^{a11}$ and $R^{a13}$;
a combination of $R^{a15}$, $R^{a17}$ and $R^{a18}$;
a combination of $R^{a19}$ and $R^{a22}$;
a combination of $R^{a24}$ and $R^{a25}$; and
a combination of $R^{a26}$, $R^{a27}$ and $R^{a28}$, at least one member in each combination preferably represents a hydroxyl group, a substituted amino group or an arylamino group, and more preferably represents a substituted amino group. In view of providing the effect of the invention more effectively, it is preferable that $R^{a31}$ represents an aliphatic group or an aryl group, and more preferably represents an aliphatic group. In view of providing the effect of the invention more effectively, it is preferable that $R^{a32}$ represents a hydroxyl group, and it is preferable that $R^{a39}$ represents a hydroxyl group or an amino group which may be substituted or unsubstituted; it is more preferable that $R^{a39}$ represents an amino group which may be substituted or unsubstituted.

In view of providing the effect of the invention more effectively, it is preferable that B represents (B-1), (B-3), (B-6) or (B-7).

Further, among the dyes represented by Formula (Y1), a dye represented by the following Formula (Y1-1) is preferable in consideration of the effect of the invention.

Formula (Y1-1)

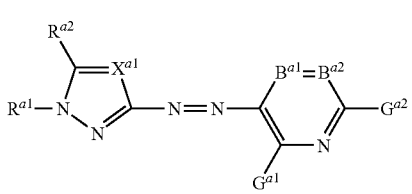

In Formula (Y1-1), $R^{a1}$, $R^{a2}$, $X^{a1}$ and $R^{a3}$ have the same definitions as $R^{a1}$, $R^{a2}$, $X^{a1}$ and $R^{a3}$ in Formula (Y1), respectively, and have the same preferable examples as $R^{a1}$, $R^{a2}$, $X^{a1}$ and $R^{a3}$ in Formula (Y1), respectively.

In Formula (Y1-1), $B^{a1}$ represents —$CR^{a4}$= or a nitrogen atom, $B^{a2}$ represents —$CR^{a5}$= or a nitrogen atom, and $B^{a1}$ and $B^{a2}$ do not represent nitrogen atoms simultaneously. $R^{a4}$ and $R^{a5}$ represent a hydrogen atom or a substituent. In Formula (Y1-1), $R^{a1}$ and $R^{a2}$ may be linked to each other to form a 5-membered to 7-membered ring; $R^{a2}$ and $R^{a3}$ may be linked to each other to form a 5-membered to 7-membered ring; $R^{a4}$ and $R^{a5}$ may be linked to each other to form a 5-membered to 7-membered ring; and $R^{a5}$ and $G^{a2}$ may be linked to each other to form a 5-membered to 7-membered ring.

The substituent represented by $R^{a4}$ or $R^{a5}$ may be any substitutable group described in the above section for "substituent". From the viewpoint of providing the effect of the invention more effectively, it is preferable that $R^{a4}$ and $R^{a5}$ each independently represent a hydrogen atom, an aliphatic group, an aryl group, a heterocyclic group, an acyl group, an imide group, an acylamino group, an aliphatic oxy group, an aliphatic oxycarbonyl group, a carbamoyl group, a sulfamoyl group, an aliphatic sulfonamide group, an arylsulfonamide group, an amino group, an aliphatic amino group, an arylamino group, a hydroxyl group, a cyano group, a sulfo group, or a carboxyl group It is more preferable that $R^{a4}$ represents a hydrogen atom, an aliphatic group, an aliphatic amino group, or an arylamino group. It is more preferable that $R^{a5}$ represents a hydrogen atom, a cyano group, or a carbamoyl group.

In Formula (Y1-1), it is preferable that $B^{a1}$ represents —C $R^{a4}$= while $B^{a2}$ represents —$CR^{a5}$= or a nitrogen atom. When $B^{a1}$ represents —$CR^{a4}$= and $B^{a4}$ represents —$CR^{a5}$=, it is more preferable that $R^{a4}$ represents an aliphatic group and $R^{a5}$ represents a hydrogen atom or a cyano group.

In Formula (Y1-1), $G^{a1}$ and $G^{a2}$ each independently represent a hydrogen atom or a substituent. The substituents represented by $G^{a1}$ or $G^{a2}$ may be any substitutable group described in the above section for "substituent". From the viewpoint of providing the effect of the invention more effectively, it is preferable that $G^{a1}$ and $G^{a2}$ each independently represent a hydrogen atom, an aliphatic group, an aryl group, a heterocyclic group, an acyloxy group, an acylamino group, an aliphatic oxy group, an aryloxy group, a heterocyclyloxy group, an aliphatic sulfonamide group, an arylsulfonamide group, a heterocyclylsulfonamide group, an amino group, an aliphatic amino group, an arylamino group, a heterocyclylamino group, an aliphatic oxycarbonylamino group, an aryloxycarbonylamino group, a heterocyclyloxycarbonylamino group, an aliphatic thio group, an arylthio group, a heterocyclylthio group, a hydroxyl group, a carbamoylamino group, a sulfamoylamino group, or a halogen atom. It is more preferable that $G^{a1}$ and $G^{a2}$ each independently represent a heterocyclic group, an acylamino group, an aliphatic oxy group, an aryloxy group, an aliphatic sulfonamide group, an arylsulfonamide group, an aliphatic amino group, an arylamino group, a heterocyclylamino group, an aliphatic thio group, an arylthio group, or a halogen atom. It is still more preferable that $G^{a1}$ and $G^{a2}$ each independently represent an aliphatic oxy group, an aliphatic amino group, an arylamino group, a heterocyclylamino group or an aliphatic thio group. It is yet more preferable that at least one of $G^{a1}$ and $G^{a2}$ represents an aliphatic amino group, an arylamino group or a heterocyclylamino group.

In a combination of $R^{a1}$ and $R^{a2}$, a combination of $R^{a2}$ and $R^{a3}$, a combination of $R^{a4}$ and $R^{a5}$, and a combination of $R^{a5}$ and $G^{a2}$, the two members of any of the combinations may be linked to each other to form a 5-membered to 7-membered ring, which may be an aromatic ring or a non-aromatic ring and may be a carbon ring or a heterocyclic ring; examples thereof include a benzene ring and a pyridine ring.

Furthermore, among the dyes represented by Formula (Y1), the compounds represented by the following Formula (Y1-2) or the following Formula (Y1-3) are more preferable.

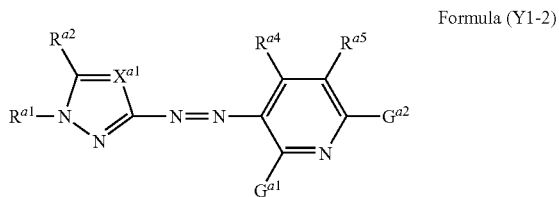

Formula (Y1-2)

In Formula (Y1-2) and Formula (Y1-3), $R^{a1}$, $R^{a2}$, $R^{a3}$, $R^{a4}$, $R^{a5}$, $X^{a1}$, $G^{a1}$ and $G^{a2}$ have the same definitions as $R^{a1}$, $R^{a2}$, $R^{a3}$, $R^{a4}$, $R^{a5}$, $X^{a1}$, $G^{a1}$ and $G^{a2}$ respectively, in the above-described Formula (Y1) or Formula (Y1-1), and have the same preferable embodiments as $R^{a1}$, $R^{a2}$, $R^{a3}$, $R^{a4}$, $R^{a5}$, $X^{a1}$, $G^{a1}$ and $G^{a2}$, respectively, in Formula (Y1) or Formula (Y1-1).

In Formula (Y1-2), from the viewpoint of providing the effect of the invention more effectively, an embodiment is preferable in which:

$R^{a1}$ represents an aliphatic group, an aryl group or a heterocyclic group;

$R^{a2}$ represents a hydrogen atom, an aliphatic group, an aryl group, an aliphatic oxy group, or a hydroxyl group;

$X^{a1}$ represents —$CR^{a3}$=, wherein $R^{a3}$ represents an acyl group, a carbamoyl group, an aliphatic oxycarbonyl group, an aliphatic sulfonyl group, an arylsulfonyl group, or a cyano group;

$R^{a4}$ represents a hydrogen atom or an aliphatic group, $R^{a5}$ represents a hydrogen atom, a cyano group, or a carbamoyl group; and $G^{a1}$ and $G^{a2}$ each independently represent a heterocyclic group, an acylamino group, an aliphatic oxy group, an aryloxy group, an aliphatic sulfonamide group, an arylsulfonamide group, an aliphatic amino group, an arylamino group, a heterocyclylamino group, an aliphatic thio group, an arylthio group, a hydroxyl group, or a halogen atom.

In a more preferable embodiment, $R^{a1}$ represents an aryl group; $R^{a2}$ represents a hydrogen atom or an aliphatic group; $X^{a1}$ represents —$CR^{a3}$=, wherein $R^{a3}$ represents a cyano group; $R^{a4}$ represents an aliphatic group; $R^{a5}$ represents a hydrogen atom or a cyano group; and $G^{a1}$ and $G^{a2}$ each independently represent an aliphatic amino group, an arylamino group, or a heterocyclylamino group.

In Formula (Y1-3), from the viewpoint of providing the effect of the invention more effectively, an embodiment is preferable in which:

$R^{a1}$ represents an aliphatic group, an aryl group, or a heterocyclic group;

$R^{a2}$ represents a hydrogen atom, an aliphatic group, an aryl group, an aliphatic oxy group, or a hydroxyl group, $X^{a1}$ represents —$CR^{a3}$=, wherein $R^{a3}$ represents an acyl group, a carbamoyl group, an aliphatic oxycarbonyl group, an aliphatic sulfonyl group, an arylsulfonyl group, or a cyano group;

$R^{a4}$ represents a hydrogen atom, an aliphatic group, an aliphatic amino group, an acylamino group, an aliphatic sulfonamide group, an arylsulfonamide group, an aliphatic oxy group, an arylamino group, an aliphatic thio group, an arylthio group, or a halogen atom;

$G^{a1}$ and $G^{a2}$ each independently represents a hydrogen atom, an aliphatic group, a heterocyclic group, an acylamino group, an aliphatic oxy group, an aryloxy group, an aliphatic sulfonamide group, an arylsulfonamide group, an aliphatic amino group, an arylamino group, a heterocyclylamino group, an aliphatic thio group, an arylthio group, a hydroxyl group, or a halogen atom; and at least one of $R^{a4}$, $G^{a1}$ and $G^{a2}$ represents an aliphatic amino group, an arylamino group, or a heterocyclylamino group.

In a more preferable embodiment, $R^{a1}$ represents an aryl group; $R^{a2}$ represents a hydrogen atom or an aliphatic group; $X^{a1}$ represents —$CR^{a3}$=, wherein $R^{a3}$ represents a cyano group; $R^{a4}$ represents a hydrogen atom, an aliphatic group, an aliphatic amino group, an aliphatic sulfonamide group, an acylamino group, or a halogen atom; and $G^{a1}$ and $G^{a2}$ each independently represent an aliphatic amino group, an arylamino group, or a heterocyclylamino group.

When the compound represented by Formula (Y1), Formula (Y1-1), Formula (Y1-2) or Formula (Y1-3) is a water-soluble dye, it is preferable that an ionic hydrophilic group is contained as a substituent at the position of any of B, $R^{a1}$, $R^{a2}$, $G^{a1}$ and $G^{a2}$. Examples of the ionic hydrophilic group as a substituent include a sulfo group, a carboxyl group, and a quaternary ammonium group. The ionic hydrophilic group is preferably a carboxyl group or a sulfo group, and more preferably a sulfo group. The carboxyl group or the sulfo group may be in the form of a salt, and examples of a counter ion for forming the salt include an alkali metal ion (for example, a sodium ion or a potassium ion) and an organic cation (for example, a tetramethylguanidium ion).

Specific examples of compounds (dyes according to the invention) represented by Formula (Y1), (Y1-1), (Y1-2) or (Y1-3) are shown below (Exemplary Compounds Y-1 to Y-78). However, the invention is not limited to these compounds.

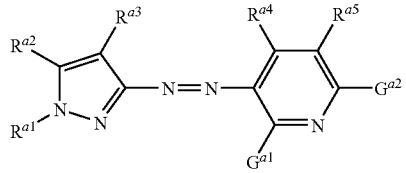

| No. | $R^{a1}$ | $R^{a2}$ | $R^{a3}$ | $R^{a4}$ | $R^{a5}$ | $G^{a1}$ | $G^{a2}$ |
|---|---|---|---|---|---|---|---|
| Y-1 | ![p-NO2-phenyl] | —H | —CN | —CH$_3$ | —CN | —NH(CH$_2$)$_3$OCH$_2$CHC$_4$H$_9$ \| C$_2$H$_5$ | —NH(CH$_2$)$_3$OCH$_2$CHC$_4$H$_9$ \| C$_2$H$_5$ |
| Y-2 | ![o-NO2-phenyl] | —H | —CN | —CH$_3$ | —CN | —NH(CH$_2$)$_3$OCH$_2$CHC$_4$H$_9$ \| C$_2$H$_5$ | —NH(CH$_2$)$_3$OCH$_2$CHC$_4$H$_9$ \| C$_2$H$_5$ |
| Y-3 | ![o-NO2-phenyl] | —C$_4$H$_9$ | —CN | —CH$_3$ | —CN | —NHCH$_2$CHCH$_3$ \| OH | —NHCH$_2$CHCH$_3$ \| OH |
| Y-4 | ![o-NO2-phenyl] | —H | —CN | —CH$_3$ | —CN | —NH(CH$_2$)$_3$OCH$_3$ | —NH(CH$_2$)$_3$OCH$_3$ |
| Y-5 | ![o-NO2-phenyl] | —CH$_3$ | —CN | —CH$_3$ | —CN | —NHCHCH$_2$OCH$_3$ \| CH$_3$ | —NHCHCH$_2$OCH$_3$ \| CH$_3$ |
| Y-6 | ![o-NO2-phenyl] | —H | —SO$_2$CH$_3$ | —CH$_3$ | —H | —NH—C$_6$H$_4$—CH$_3$ | —NH—C$_6$H$_4$—CH$_3$ |
| Y-7 | ![o-NO2-phenyl] | —C$_2$H$_5$ | —CN | —CH$_3$ | —CN | —NH(CH$_2$)$_2$OC$_2$H$_5$ | —NH(CH$_2$)$_2$OC$_2$H$_5$ |
| Y-8 | ![o-NO2-phenyl] | —C$_2$H$_5$ | —CN | —CH$_3$ | —CN | —NH(CH$_2$)$_3$OCH$_3$ | —NH(CH$_2$)$_3$OCH$_3$ |
| Y-9 | ![p-NO2-phenyl] | —CH$_3$ | —CNH$_2$ ‖ O | —H | —CN | —NHCHCH$_2$OCH$_3$ \| CH$_3$ | —OC$_2$H$_5$ |

-continued

| | | | | | | |
|---|---|---|---|---|---|---|
| Y-10 | 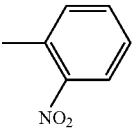 (2-nitrophenyl methyl) | —C$_2$H$_5$ | —CN | —CH$_3$ | —CN | —NH(CH$_2$)$_2$OCH$_3$ | —NH(CH$_2$)$_2$OCH$_3$ |
| Y-11 | 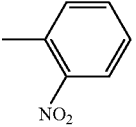 (2-nitrophenyl methyl) | —C$_2$H$_5$ | —CN | —CH$_3$ | —CN | —NHCH(CH$_3$)CH$_2$OCH$_3$ | —NHCH(CH$_3$)CH$_2$OCH$_3$ |
| Y-12 | —C$_2$H$_4$OC$_2$H$_5$ | —OCH$_3$ | —COCH$_3$ (C=O) | —CH$_3$ | —CNH$_2$ (C=O) | —NH(CH$_2$)$_3$OCH$_3$ | —SC$_4$H$_9$(t) |
| Y-13 | 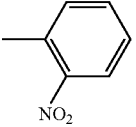 (2-nitrophenyl methyl) | —C$_4$H$_9$ | —CN | —CH$_3$ | —CN | —NH(CH$_2$)$_3$OCH$_3$ | —NH(CH$_2$)$_3$OCH$_3$ |
| Y-14 | 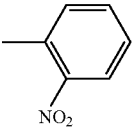 (2-nitrophenyl methyl) | —C$_2$H$_5$ | —CN | —CH$_3$ | —CN | —NHCH(CH$_3$)CH$_2$OCH$_3$ | —NHCH$_3$ |
| Y-15 | 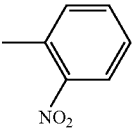 (2-nitrophenyl methyl) | —C$_2$H$_5$ | —CN | —CH$_3$ | —CN | —NHCH(C$_2$H$_5$)CH$_2$OH | —NHCH$_3$ |
| Y-16 | 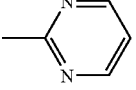 (2-pyrimidinyl methyl) | —C$_2$H$_5$ | —CCH$_3$ (C=O) | —CH$_3$ | —CN | —NHCH(C$_2$H$_5$)CH$_2$OCH$_3$ | —NHCH(CH$_3$)CH$_2$OCH$_3$ |
| Y-17 | 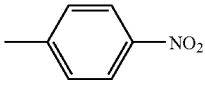 (4-nitrophenyl methyl) | —CH$_3$ | —SO$_2$Ph | —CH$_3$ | —CN | —NHCH$_2$CH(OH)CH$_3$ | —NHCH$_2$CH(OH)CH$_3$ |
| Y-18 | 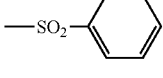 (2-(NHCOCH$_2$OCH$_3$)phenyl methyl) | —H | —CN | —CH$_3$ | —CN | —NH(CH$_2$)$_3$OCH$_3$ | —NH(CH$_2$)$_3$OCH$_3$ |
| Y-19 | 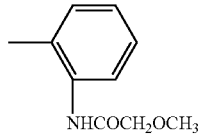 (4-(NHCOCH$_3$)phenyl methyl) | —H | —CN | —CH$_3$ | —CN | —NH(CH$_2$)$_3$OCH$_3$ | —NH(CH$_2$)$_3$OCH$_3$ |
| Y-20 | 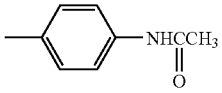 (phenyl methyl) | —H | —CN | —CH$_3$ | —CN | —NHCH(CH$_3$)CH$_2$OCH$_3$ | —NHCH(CH$_3$)CH$_2$OCH$_3$ |
| Y-21 | 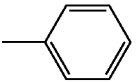 (2-nitrophenyl methyl) | —CH$_3$ | —CN | —CH$_3$ | —CN | —NHCCH$_2$OCH$_3$ (C=O) | —NH(CH$_2$)$_3$OCH$_3$ |

-continued

| No. | (structure) | | | | | |
|---|---|---|---|---|---|---|
| Y-22 | 2-nitro-tolyl | —C$_2$H$_5$ | —C(O)NH$_2$ | —CH$_3$ | —CN | —NHCH(CH$_3$)CH$_2$OCH$_3$ | —NHSO$_2$CH$_3$ |
| Y-23 | 4-nitro-tolyl | —CH$_3$ | —CN | —CH$_3$ | —CN | —OH | —NH(CH$_2$)$_3$OCH$_3$ |
| Y-24 | 2-nitro-tolyl | —CH$_3$ | —CN | —CH$_3$ | —CN | —NH(CH$_2$)$_3$OCH$_3$ | —N(CH$_3$)(CH$_2$)$_2$OCH$_3$ |
| Y-25 | 4-(NHC(O)CH$_3$)-tolyl | —H | —CN | —CH$_3$ | —CN | —NH(CH$_2$)$_3$OCH$_3$ | morpholino |
| Y-26 | 4-(NHSO$_2$CH$_3$)-tolyl | —CH$_3$ | —C(O)COCH$_3$ | —CH$_3$ | —CN | —NH-(2-thiazolyl) | —NH(CH$_2$)$_3$OCH$_3$ |
| Y-27 | 4-SO$_3^-$, 3-NO$_2$-tolyl · CH$_3$NH—C(=N$^+$H$_2$)—NHCH$_3$ | —CH$_3$ | —CN | —CH$_3$ | —CN | —NH(CH$_2$)$_3$OCH$_3$ | —NH(CH$_2$)$_3$OCH$_3$ |
| Y-28 | 4-CO$_2^-$, 3-NO$_2$-tolyl · N$^+$H(C$_2$H$_9$)$_3$ | —H | —CN | —CH$_3$ | —CN | —NH(CH$_2$)$_3$-piperidino | —NH(CH$_2$)$_3$-piperidino |

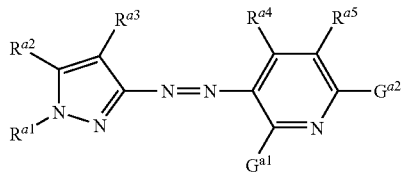

| No. | R$^{a1}$ | R$^{a2}$ | R$^{a3}$ | R$^{a4}$ | G$^{a1}$ | G$^{a2}$ |
|---|---|---|---|---|---|---|
| Y-31 | 2-nitro-tolyl | —H | —CN | —NHCH$_2$CH(OH)CH$_3$ | —NHCH$_2$CH(OH)CH$_3$ | —NHCH$_2$CH(OH)CH$_3$ |
| Y-32 | 4-nitro-tolyl | —H | —CN | —NH(CH$_2$)$_3$OCH$_3$ | —NH(CH$_2$)$_3$OCH$_3$ | —NH(CH$_2$)$_3$OCH$_3$ |
| Y-33 | 4-nitro-tolyl | —H | —CN | —NH(CH$_2$)$_3$OCH$_3$ | —NHCH(CH$_3$)CH$_2$OCH$_3$ | —NHCH(CH$_3$)CH$_2$OCH$_3$ |
| Y-34 | 4-nitro-tolyl | —H | —CN | —NH(CH$_2$)$_3$OCH$_3$ | —NHC$_2$H$_5$ | —NHC$_2$H$_5$ |

-continued

| | Ar | R1 | R2 | R3 | R4 | R5 |
|---|---|---|---|---|---|---|
| Y-35 | 2-NO₂-C₆H₄- | —C₂H₅ | —CN | —NHCH(CH₃)CH₂OCH₃ | —NHCH₃ | —NHCH₃ |
| Y-36 | 2-Cl-4-NO₂-C₆H₃- | —CH₃ | —C(O)NH₂ | —NH(CH₂)₃OCH₃ | —N(CH₃)(CH₂)₂OCH₃ | —NH(CH₂)₃OCH₃ |
| Y-37 | 4-NO₂-C₆H₄- | —H | —CN | —NHCH(CH₃)CH₂OCH₃ | —NHCH(CH₃)C₂H₅ | —NHCH(CH₃)C₂H₅ |
| Y-38 | 4-NO₂-C₆H₄- | —H | —CN | —NH(CH₂)₃OCH₃ | —NHCH(CH₃)CH₂OCH₃ | —NH(CH₂)₃OCH₃ |
| Y-39 | 3-Cl-4-NO₂-C₆H₃- | —H | —COCH₃ | —SC₆H₁₃ | —NH(CH₂)₃OCH₃ | —NH(CH₂)₃OCH₃ |
| Y-40 | 4-NO₂-C₆H₄- | —C₂H₅ | —CN | —NH(CH₂)₃OCH₃ | —NH(CH₂)₃OCH₃ | —N(CH₃)(CH₂)₂OCH₃ |
| Y-41 | 2-CONH₂-5-NO₂-C₆H₃- | —H | —CN | —NH(CH₂)₃OCH₃ | —NH(CH₂)₃OCH₃ | —NHCH(CH₃)CH₂OCH₃ |
| Y-42 | 4-NO₂-C₆H₄- | —H | —CN | —H | —NHCH(CH₃)CH₂OCH₃ | —NHCH(CH₃)CH₂OCH₃ |
| Y-43 | 4-NO₂-C₆H₄- | —H | —CN | —NHCH(CH₃)CH₂OCH₃ | —NHCH(CH₃)CH₂OCH₃ | —NHCH(CH₃)CH₂OCH₃ |
| Y-44 | 4-NO₂-C₆H₄- | —C₂H₅ | —CN | —NHCH(CH₃)CH₂OCH₃ | —NH(CH₂)₂OCH₃ | —NH(CH₂)₂OCH₃ |
| Y-45 | 4-NO₂-C₆H₄- | —H | —CN | —NHC(O)C₂H₅ | —NHCH(CH₃)CH₂OCH₃ | —NHCH(CH₃)CH₂OCH₃ |
| Y-46 | 4-NO₂-C₆H₄- | —H | —CN | —OC₂H₅ | —NH(CH₂)₃OCH₃ | —NHCH(CH₃)CH₂OCH₃ |
| Y-47 | 4-NO₂-C₆H₄- | —H | —CN | —CH₃ | —NH(CH₂)₃OCH₃ | —NH(CH₂)₃OCH₃ |
| Y-48 | 2-NHCOCH₂OCH₃-C₆H₄- | —H | —CN | —NHCH(CH₃)CH₂OCH₃ | —NH(2-CH₃-C₆H₄) | —NH(2-CH₃-C₆H₄) |

-continued

| | | | | | | |
|---|---|---|---|---|---|---|
| Y-49 | —C₂H₄OC₂H₅ | —H | —CN | —NH—(2-methylphenyl) | —NH—(2-methylphenyl with NH) | —NH—(2-methylphenyl) |
| Y-50 | 2-pyrimidinyl | —H | —CN | —NHSO₂C₂H₅ | —NH(CH₂)₃OCH₃ | —NH(CH₂)₃OCH₃ |
| Y-51 | phenyl | —H | —CN | —NHC(O)C₄H₉(t) | —NHCH₃ | —NHCH₃ |
| Y-52 | 4-nitrophenyl | —C₂H₅ | —SO₂CH₃ | —NH(CH₂)₃OCH₃ | piperidin-1-yl | —NH(CH₂)₃OCH₃ |
| Y-53 | 2-methyl-3,5-dichlorophenyl | —OC₂H₅ | —C(O)CH₃ | —Cl | —NH(CH₂)₃OCH₃ | —NH(CH₂)₃OCH₃ |
| Y-54 | 4-(NHC(O)CH₃)phenyl | —C₄H₉ | —CN | —NHCH(CH₃)CH₂OCH₃ | —NHCH(CH₃)CH₂OCH₃ | —NH-thiazol-2-yl |
| Y-55 | 4-nitrophenyl | —C₂H₅ | —CN | —S-(4-methylphenyl) | —NHCH(CH₃)CH₂OCH₃ | —NHCH(CH₃)CH₂OCH₃ |
| Y-56 | 4-nitrophenyl | —H | —CN | —HNSO₂-phenyl | —NH(CH₂)₃OCH₃ | —NH(CH₂)₃OCH₃ |
| Y-57 | 4,6-dimethoxy-1,3,5-triazin-2-yl | —H | —CN | —O-phenyl | —NH(CH₂)₃OCH₃ | —O-phenyl |
| Y-58 | 4-nitrophenyl | —H | —CN | —NH(CH₂)₃SCH₃ | —NH(CH₂)₃SCH₃ | —NH(CH₂)₃SCH₃ |
| Y-59 | 4-methyl-3-nitrophenyl-SO₂NH-(2,2,6,6-tetramethyl-1-methylpiperidin-4-yl) | —H | —CN | —NH(CH₂)₃OCH₃ | —NH(CH₂)₃OCH₃ | —NH(CH₂)₃OCH₃ |

-continued

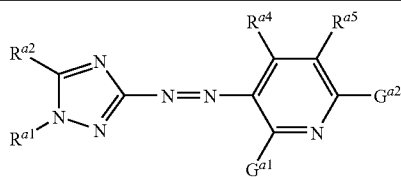

| No. | $R^{a1}$ | $R^{a2}$ | $R^{a4}$ | $R^{a5}$ | $G^{a1}$ | $G^{a2}$ |
|---|---|---|---|---|---|---|
| Y-61 | 4-NO$_2$-phenyl | —C$_2$H$_5$ | —CH$_3$ | —CN | —NHCH(CH$_3$)CH$_2$OCH$_3$ | —N(CH$_3$)(CH$_2$)$_2$OCH$_3$ |
| Y-62 | 2-NO$_2$-phenyl | —H | —CH$_3$ | —CN | —NHCH(CH$_3$)CH$_2$OCH$_3$ | —NHCH(CH$_3$)CH$_2$OCH$_3$ |
| Y-63 | 4-NO$_2$-phenyl | —H | —CH$_3$ | —H | —NH(CH$_2$)$_3$OCH$_3$ | —N(CH$_2$CH$_2$OCH$_3$)$_2$ |

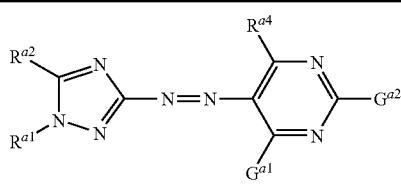

| No. | $R^{a1}$ | $R^{a2}$ | $R^{a4}$ | $G^{a1}$ | $G^{a2}$ |
|---|---|---|---|---|---|
| Y-66 | 4-NO$_2$-phenyl | —H | —NH(CH$_2$)$_3$OCH$_3$ | —NHCH(CH$_3$)CH$_2$OCH$_3$ | —NHCH(CH$_3$)CH$_2$OCH$_3$ |
| Y-67 | 2-NO$_2$-phenyl | —C$_2$H$_5$ | —NH(CH$_2$)$_3$OCH$_3$ | —NH(CH$_2$)$_3$OCH$_3$ | —NH(CH$_2$)$_3$OCH$_3$ |
| Y-68 | 4-NO$_2$-phenyl | —H | —N(CH$_3$)(CH$_2$)$_2$OCH$_3$ | —N(CH$_3$)(CH$_2$)$_2$OCH$_3$ | —NH(CH$_2$)$_3$OCH$_3$ |

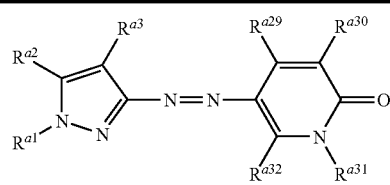

| No. | $R^{a1}$ | $R^{a2}$ | $R^{a3}$ | $R^{a29}$ | $R^{a30}$ | $R^{a31}$ | $R^{a32}$ |
|---|---|---|---|---|---|---|---|
| Y-71 | 4-NO$_2$-phenyl | —H | —CN | —CH$_3$ | —CN | —C$_2$H$_4$OC$_4$H$_9$ | —OH |
| Y-72 | 2-NO$_2$-phenyl | —CH$_3$ | —SO$_2$CH$_3$ | —CH$_3$ | —CN | —C$_8$H$_{17}$ | —OH |

-continued

| | | | | | | | |
|---|---|---|---|---|---|---|---|
| Y-73 | —C$_8$H$_{17}$ | —CH$_3$ | —CN | —CH$_3$ | —CN | —C$_2$H$_4$OCH$_3$ | —OH |

Y-74

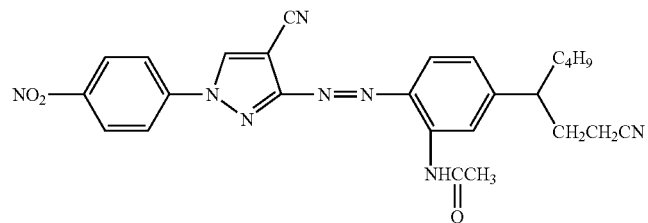

Y-75

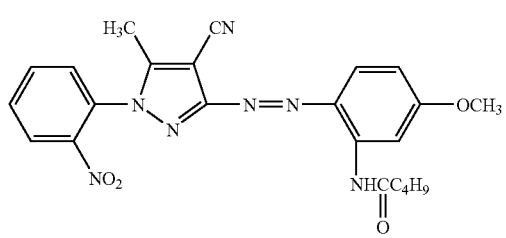

Y-76

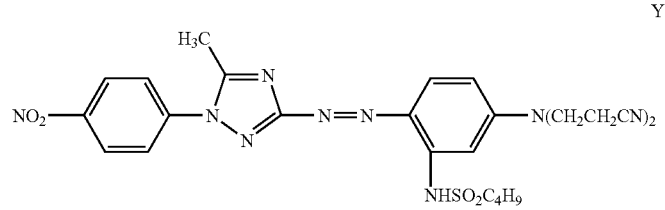

Y-77

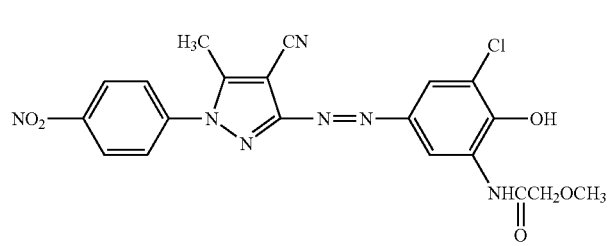

Y-78

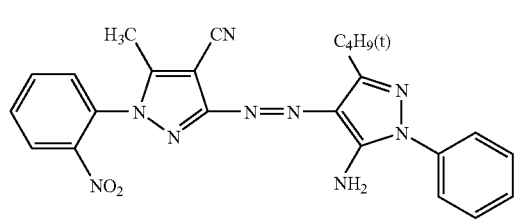

For example, the compound represented by Formula (Y1) can be synthesized in accordance with the method described in paragraphs [0120] to [0126] of JP-A No. 2006-47581, which is incorporated herein by reference.

Compound Represented by Formula (K1)

It is preferable that the colored curable composition of the invention includes at least one kind of compound represented by the following Formula (K1).

Formula (K1)

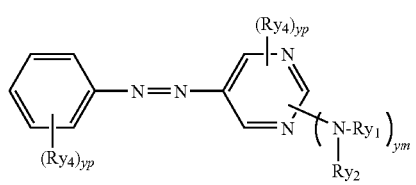

In Formula (K1), $Ry_1$ represents an aliphatic group, an aryl group, a heterocyclic group, a carbamoyl group, an aliphatic oxycarbonyl group, an aryloxycarbonyl group, an acyl group, an aliphatic sulfonyl group, an arylsulfonyl group, or a sulfamoyl group. When two or more of $Ry_1$ are contained in a Formula (K1), each $Ry_1$ may be the same as or mutually different from one another.

The aliphatic group represented by $Ry_1$ may be unsubstituted or substituted, and may be saturated or unsaturated. The aliphatic group represented by $Ry_1$ is preferably an aliphatic group having 1 to 25 carbon atoms in total, and more preferably an aliphatic group having 1 to 12 carbon atoms in total. Examples of the aliphatic group include a methyl group, an ethyl group, a vinyl group, an allyl group, an ethynyl group, an isopropenyl group, a 2-ethylhexyl group, a 3-methoxypropyl group, and a 2-methoxyethyl group.

The aryl group represented by $Ry_1$ may be unsubstituted or substituted. The aryl group is preferably an aryl group having 6 to 16 carbon atoms in total, and is more preferably an aryl group having 6 to 12 carbon atoms in total. Examples of the aryl group include a phenyl group, a 4-nitrophenyl group, and a 4-methylphenyl group.

The heterocyclic group represented by $Ry_1$ may be saturated or unsaturated, and is preferably a 5-membered to 7-membered heterocyclic ring group having 2 to 15 carbon atoms in total (preferably 2 to 12 carbon atoms in total). Examples of the heterocyclic ring group include a 2-pyridyl group, a 3-furyl group, and a 2-piperidyl group. Moreover, the heterocyclic group may be unsubstituted or may have a substituent.

As the carbamoyl group represented by $Ry_1$, a carbamoyl group having 1 to 12 carbon atoms in total is preferable, and a carbamoyl group having 1 to 10 carbon atoms in total is more preferable. Examples of the carbamoyl group include a dimethylcarbamoyl group and an ethoxyethylcarbamoyl group.

The aliphatic oxycarbonyl group represented by $Ry_1$ may be unsubstituted or substituted, and may be saturated or unsaturated. The aliphatic oxycarbonyl group is preferably an aliphatic oxycarbonyl group having 2 to 16 carbon atoms in total, and more preferably an aliphatic oxycarbonyl group having 2 to 12 carbon atoms in total. Examples of the aliphatic oxycarbonyl group include a methoxycarbonyl group and a butoxycarbonyl group.

The aryloxycarbonyl group represented by $Ry_1$ may be unsubstituted or substituted. The aryloxycarbonyl group is preferably an aryloxycarbonyl group having 7 to 17 carbon atoms in total, and more preferably an aryloxycarbonyl group having 7 to 15 carbon atoms in total. Examples of the aryloxycarbonyl group include a phenoxycarbonyl group.

The acyl group represented by $Ry_1$ may be an aliphatic carbonyl group or an arylcarbonyl group. The acyl group is preferably an acyl group having 2 to 15 carbon atoms in total, and more preferably an acyl group having 2 to 10 carbon atoms in total. Examples of the acyl group include an acetyl group, a pivaloyl group, and a benzoyl group.

The aliphatic sulfonyl group represented by $Ry_1$ may be unsubstituted or substituted. The aliphatic sulfonyl group is preferably an aliphatic sulfonyl group having 1 to 15 carbon atoms in total, and more preferably an aliphatic sulfonyl group having 1 to 12 carbon atoms in total. Examples of the aliphatic sulfonyl group include a methanesulfonyl group, a butanesulfonyl group, and a methoxyethanesulfonyl group.

The arylsulfonyl group represented by $Ry_1$ may be unsubstituted or substituted. The arylsulfonyl group is preferably an arylsulfonyl group having 6 to 20 carbon atoms in total, and more preferably an arylsulfonyl group having 6 to 12 carbon atoms in total. Examples of the arylsulfonyl group include a benzenesulfonyl group, a 4-t-butylbenzenesulfonyl group, a 4-toluenesulfonyl group, and a 2-toluenesulfonyl group The sulfamoyl group represented by $Ry_1$ may be unsubstituted or substituted. The sulfamoyl group is preferably a sulfamoyl group having 0 to 18 carbon atoms in total, and more preferably a sulfamoyl group having 0 to 12 carbon atoms in total. Examples of the sulfamoyl group include a sulfamoyl group and a dimethylsulfamoyl group.

In Formula (K1), $Ry_2$ represents a hydrogen atom, an aliphatic group, an aryl group, or a heterocyclic group. The aliphatic group represented by $Ry_2$ has the same definition as that of the aliphatic group represented by $Ry_1$, and preferable embodiments thereof are also the same as those of the aliphatic group represented by $Ry_1$. The aryl group represented by $Ry_2$ has the same definition as that of the aryl group represented by $Ry_1$, and preferable embodiments thereof are also the same as those of the aryl group represented by $Ry_1$. The heterocyclic group represented by $Ry_2$ has the same definition as that of the heterocyclic group represented by $Ry_1$, and preferable embodiments thereof are also the same as those of the heterocyclic group represented by $Ry_1$. In addition, when two or more of $Ry_2$ are contained in Formula (K1), each $Ry_2$ may be the same as or mutually different from one another.

In Formula (K1), $Ry_3$ and $Ry_4$ each independently represent a substituent. When two or more of $Ry_3$ are contained in Formula (K1), each $Ry_3$ may be the same as or may mutually different from one another. When two or more of $Ry_4$ are contained in Formula (K1), each $Ry_4$ may be the same as or mutually different from one another.

The substituent represented by $Ry_3$ may be any substitutable group, and examples thereof include the groups described in the above section for "substituent". $Ry_3$ preferably represents an aliphatic group, an aryl group, a heterocyclic group, an acyl group, an acyloxy group, an aliphatic oxy group, an aryloxy group, a heterocyclyloxy group, an aliphatic thio group, an arylthio group, a hydroxyl group, a sulfo group, or a halogen atom.

The substituent represented by $Ry_4$ may be any substitutable group, and examples thereof include the groups described in the above section for "substituent". $Ry_4$ preferably represents an aliphatic group, an aryl group, a heterocyclic group, an acyl group, an acyloxy group, an acylamino group, an aliphatic oxy group, an aryloxy group, a heterocyclyloxy group, an aliphatic oxycarbonyl group, an aryloxycarbonyl group, a heterocyclyloxycarbonyl group, a carbamoyl group, an aliphatic sulfonyl group, an arylsulfonyl group, a heterocyclylsulfonyl group, a sulfamoyl group, an aliphatic sulfonamide group, an arylsulfonamide group, a heterocyclylsulfonamide group, an aliphatic amino group, an arylamino group, a heterocyclylamino group, an aliphatic oxycarbonylamino group, an aryloxycarbonylamino group, an aliphatic thio group, an arylthio group, a cyano group, a sulfo group, a nitro group, a carboxyl group, a carbamoylamino group, a sulfamoylamino group, a halogen atom, a sulfamoylcarbamoyl group, or a carbamoylsulfamoyl group.

When plural $Ry_4$s are adjacent to each other (for example, when plural $Ry_4$s are bonded to adjacent carbon atoms), the plural $Ry_4$s may be linked to each other to form a 5-membered to 7-membered ring. Examples of the ring include a naphthalene ring and a quinoline ring.

$Ry_1$ and $Ry_2$ may be linked to each other to form a 5-membered to 7-membered ring together with the nitrogen atom (N) to which $Ry_1$ and $Ry_2$ are bonded. Examples of the ring include a piperidine ring, a pyrrolidine ring, a morpholine ring, and an imide ring such as a succinimide.

Among them, from the viewpoint of providing the effect of the invention more effectively, it is preferable that $Ry_1$ represents an aliphatic group, an aryl group, a carbamoyl group, an aliphatic oxycarbonyl group or an acyl group. It is more preferable that $Ry_1$ represents an aliphatic group, an aryl group, an aliphatic oxycarbonyl group, or an acyl group. It is still more preferable that $Ry_1$ represents an aliphatic group. Preferable examples of these groups include the specific groups described above.

From the viewpoint of providing the effect of the invention more effectively, $Ry_2$ preferably represents a hydrogen atom or an aliphatic group, and more preferably a hydrogen atom. From the viewpoint of providing the effect of the invention more effectively, $Ry_3$ preferably represents an aliphatic group, an aryl group, an aliphatic oxy group, an aryloxy group, an aliphatic thio group or an arylthio group, and more preferably an aliphatic group, an aliphatic oxy group or an aliphatic thio group. From the viewpoint of providing the effect of the invention more effectively, it is preferable that $Ry_4$ represents an aliphatic group, an acylamino group, an aliphatic oxy group, an aliphatic oxycarbonyl group, a carbamoyl group, an aliphatic sulfonyl group, an arylsulfonyl group, a sulfamoyl group, an aliphatic sulfonamide group, an arylsulfonamide group, an aliphatic oxycarbonylamino group, an aryloxycarbonylamino group, a cyano group, a sulfo group, a nitro group, a carboxyl group, a carbamoylamino group, a sulfamoylamino group, or a halogen atom. It is more preferable that $Ry_4$ represents an aliphatic group and an aliphatic oxycarbonyl group, a carbamoyl group, an aliphatic sulfonyl group, a sulfamoyl group, a cyano group, nitro group, or a halogen atom; and it is still more preferable that $Ry_4$ represents an aliphatic oxycarbonyl group, a carbamoyl group, an aliphatic sulfonyl group, a sulfamoyl group, a cyano group or a halogen atom. Preferable examples of these groups include the specific groups described above.

In Formula (K1), from the viewpoint of providing the effect of the invention more effectively, ym represents preferably 3 or 2, yn represents preferably 0 or 1, and yp represents preferably an integer of from 0 to 3.

Among the compounds represented by Formula (K1), the compound represented by the following Formula (K1-1) (a dye according to the invention) is preferable, from the viewpoint of providing the effect of the invention more effectively.

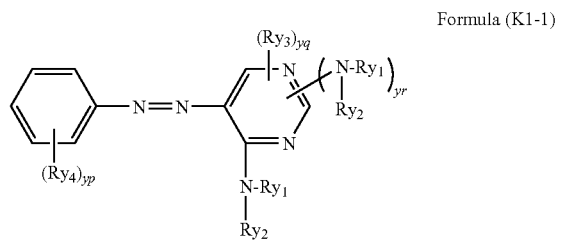

Formula (K1-1)

In Formula (K1-1), yq and yr each independently represent an integer of from 0 to 2, and the sum of yq and yr is 1 or 2. From the viewpoint of providing the effect of the invention more effectively, yq represents preferably 0 or 1, and yr represents preferably 1 or 2.

Further, $Ry_1$, $Ry_2$, $Ry_3$, $Ry_4$ and yp in Formula (K1-1) respectively have the same definitions as in Formula (K1), and preferable embodiments thereof are also the same as in Formula (K1).

Among the compounds represented by Formula (K1-1), the compounds represented by the following Formula (K1-2) are preferable from the viewpoint of providing the effect of the invention more effectively.

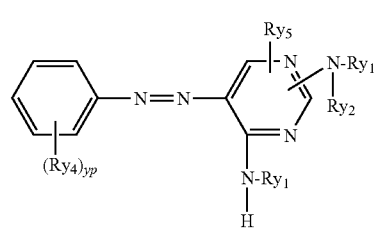

Formula (K1-2)

$Ry_1$, $Ry_2$, $Ry_4$ and yp in Formula (K1-2) have the same definitions as in Formulae (K1) to (K1-1), and preferable embodiments thereof are also the same as in Formulae (K1) to (K1-1). In Formula (K1-2), $Ry_5$ represents a hydrogen atom, $Ry_3$ or $—N(Ry_1)Ry_2$, wherein $Ry_1$ to $Ry_3$ have the same definitions as in Formulae (K1) to (K1-1), and preferable embodiments thereof are also the same as in Formulae (K1) to (K1-1).

When $Ry_5$ represents $—N(Ry_1)Ry_2$, the $—N(Ry_1)Ry_2$ represented by $Ry_5$ may be the same as or different from the other $—N(Ry_1)Ry_2$ contained in Formula (K1-2).

From the viewpoint of providing the effect of the invention more effectively, it is preferable that $Ry_5$ represents a hydrogen atom, an aliphatic group, an aliphatic oxy group, an aliphatic thio group, or $—N(Ry_1)Ry_2$, and it is more preferable that $Ry_5$ represents a hydrogen atom, an aliphatic group, or $—N(Ry_1)Ry_2$. Preferable examples of these groups include the specific groups described above.

From the viewpoint of providing the effect of the invention more effectively, in Formula (K1-2), it is preferable that $Ry_1$ represents an aliphatic group, an aryl group, an aliphatic oxycarbonyl group or an acyl group, $Ry_2$ represents a hydrogen atom or an aliphatic group, $Ry_5$ represents a hydrogen atom, an aliphatic group, an aliphatic oxy group, an aliphatic thio group or $—N(Ry_1)Ry_2$, and $Ry_4$ represents an aliphatic group, an aliphatic oxycarbonyl group, a carbamoyl group, an aliphatic sulfonyl group, a sulfamoyl group, a cyano group, a nitro group, or a halogen atom. It is more preferable that $Ry_1$ represents an aliphatic group, $Ry_2$ represents a hydrogen atom, $Ry_5$ represents a hydrogen atom, an aliphatic group or $—N(Ry_1)Ry_2$, and $Ry_4$ represents an aliphatic group, an aliphatic oxycarbonyl group, a carbamoyl group, an aliphatic sulfonyl group, a sulfamoyl group, a cyano group, a nitro group, or a halogen atom.

Specific examples of the compounds (dyes) (Exemplary Compounds K-1 to K-48) represented by Formulae (K1) to (K1-2) are shown below. However, the invention is not limited thereto.

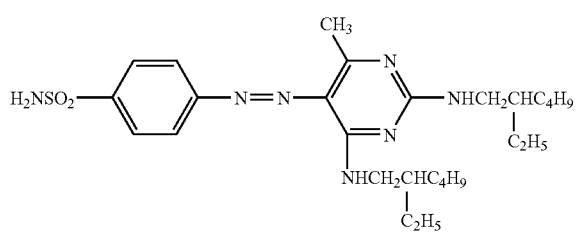

K-1

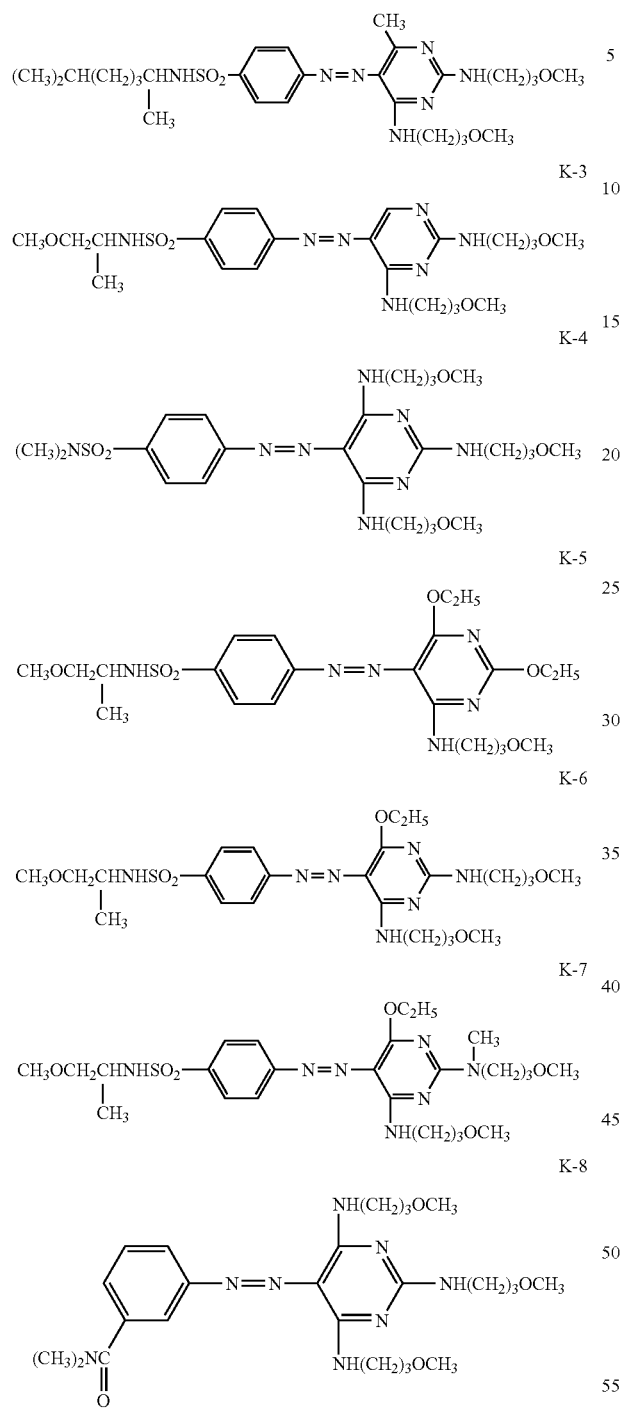
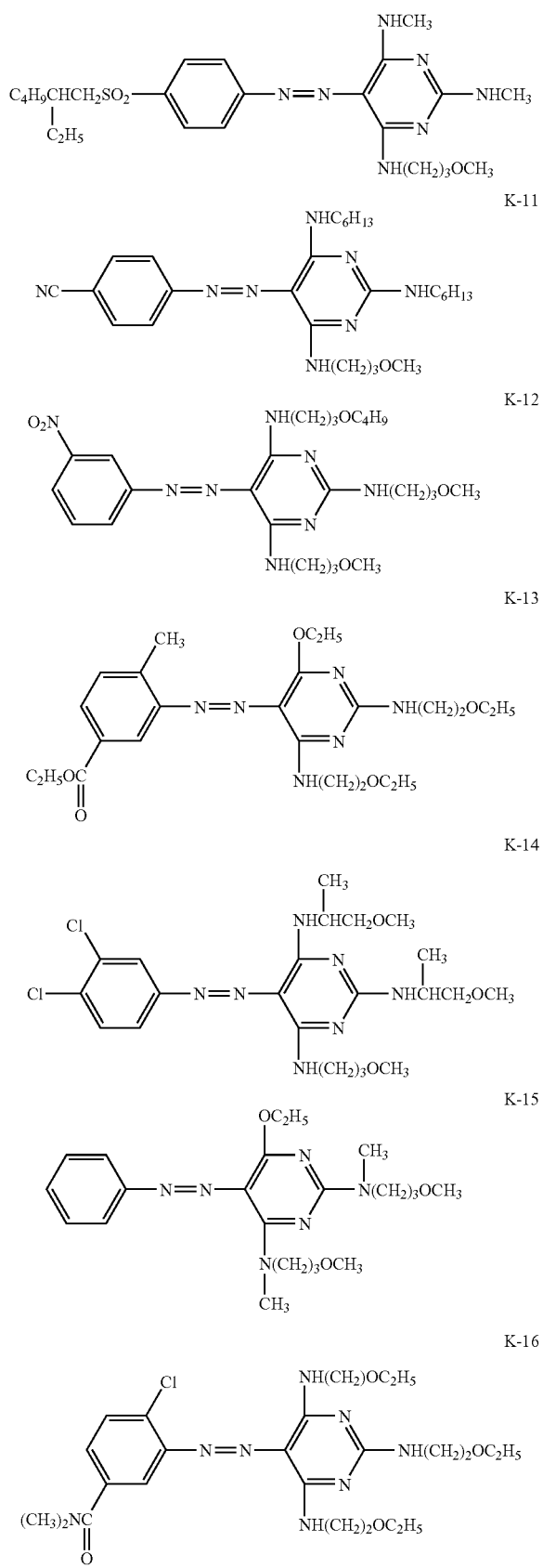

K-17
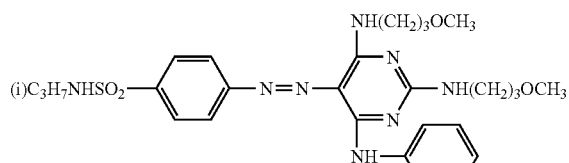
K-18
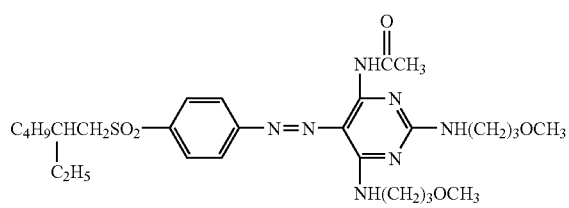
K-19
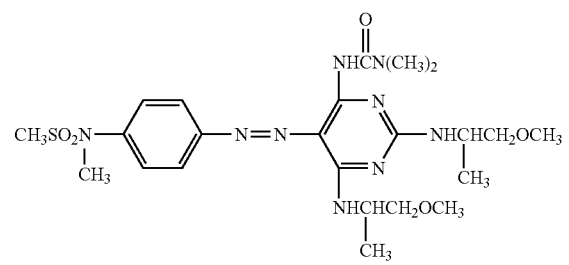
K-20
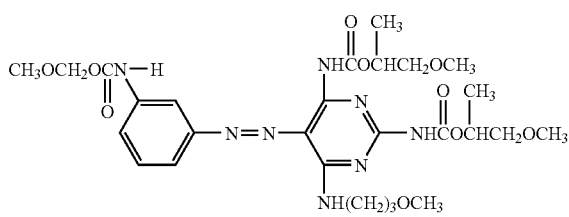
K-21
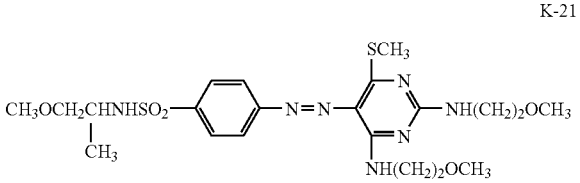
K-22
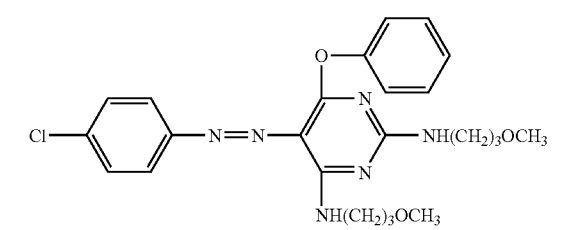
K-23
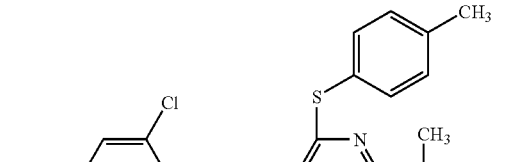
K-24
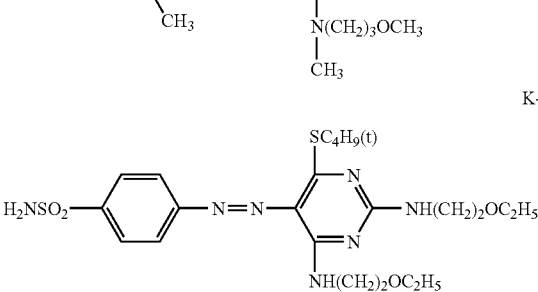
K-25
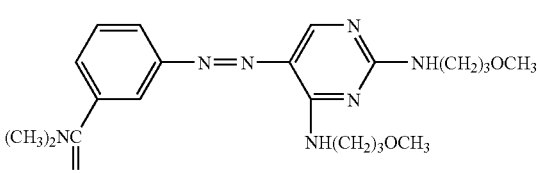
K-26
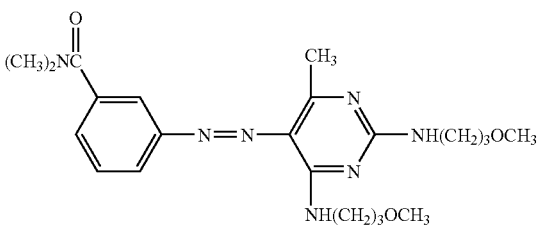
K-27
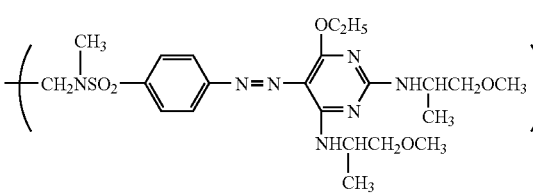
K-28
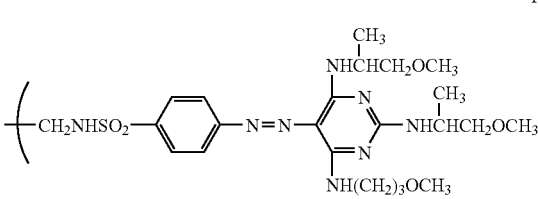
K-29
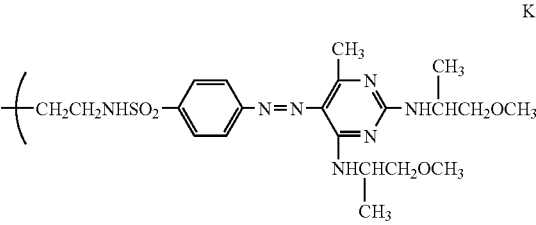

K-30
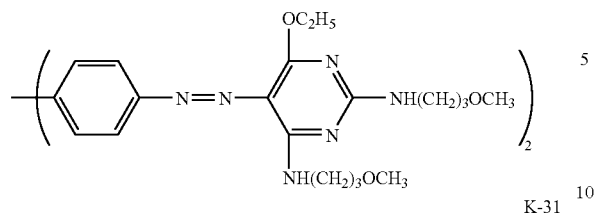
K-31
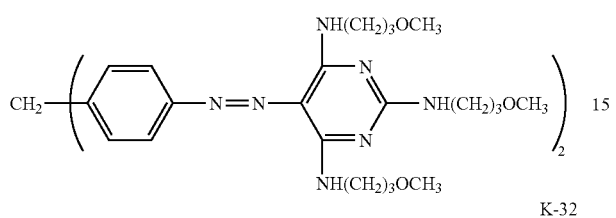
K-32
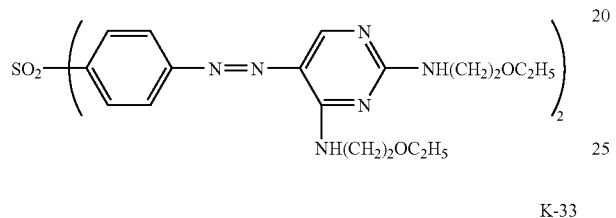
K-33
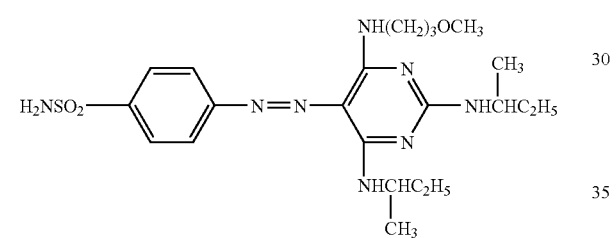
K-34
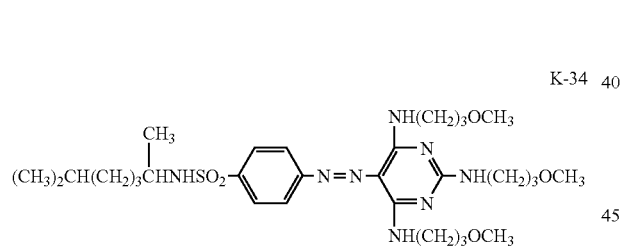
K-35
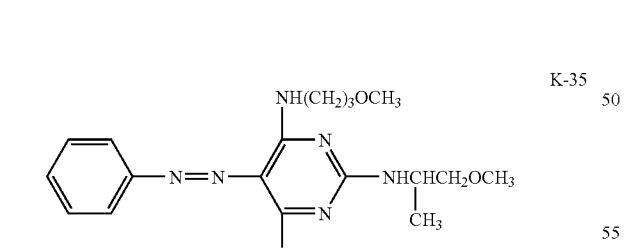
K-36
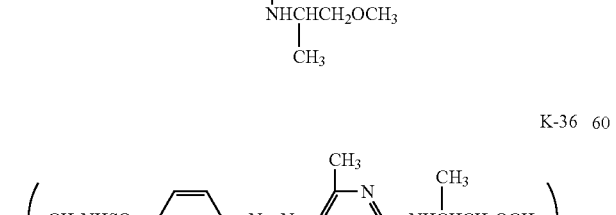
K-37
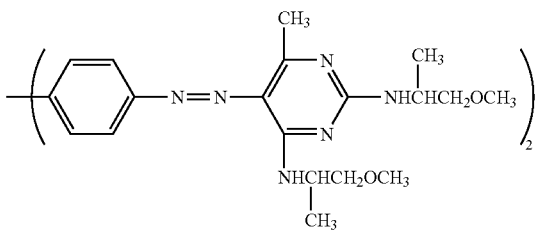
K-38
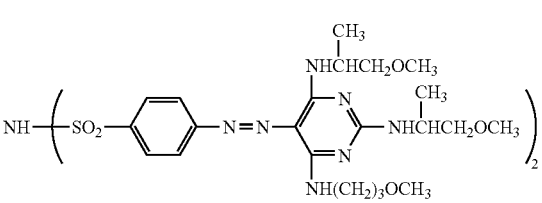
K-39
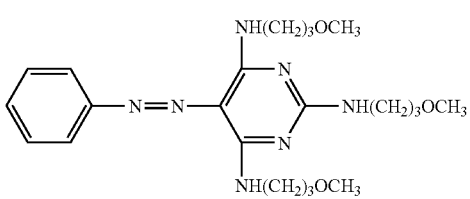
K-40
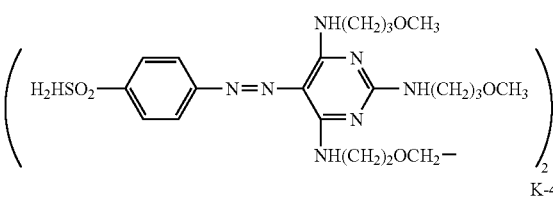
K-41
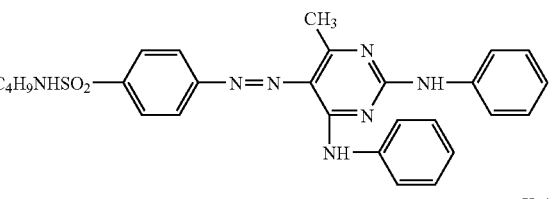
K-42
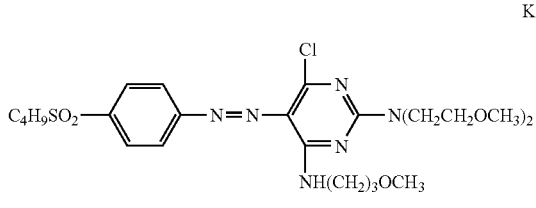
K-43
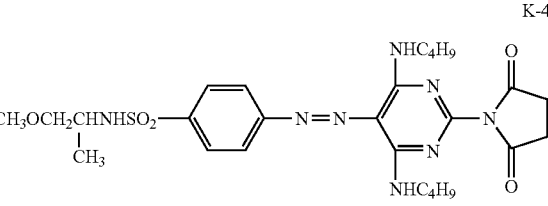
K-44
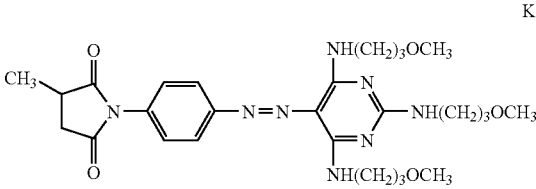

-continued

K-45
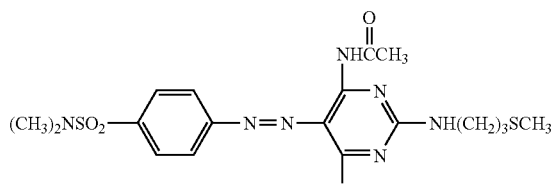

K-46
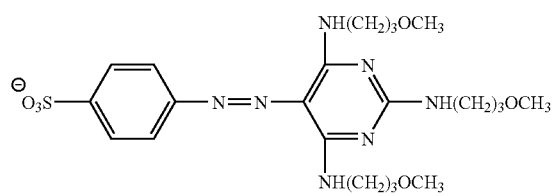

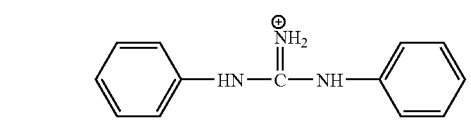

K-47
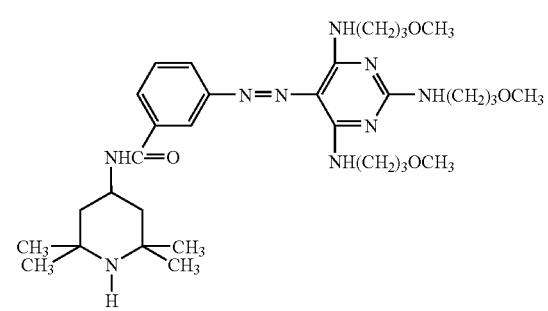

K-48
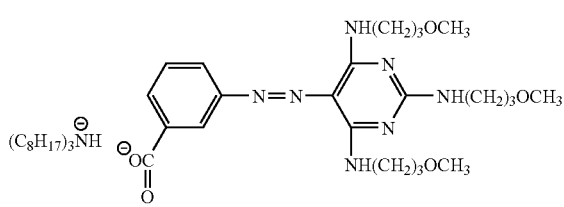

The compounds represented by Formula (K1) can be synthesized, for example, with reference to the method described in paragraphs [0163] to [0167] of JP-A No. 2006-47581, which is incorporated herein by reference.

Azomethine Dye Represented by Formula (I)

It is preferable that the colored curable composition of the invention includes as a dye at least one kind of azomethine dye represented by the following Formula (I). The dye represented by Formula (I) exhibits a good magenta hue with excellent light transmittance properties. When the dye is contained in a liquid preparation or a coated layer, the dye does not separate out over time and has superior stability, and in particular, has excellent resistance to heat or light.

Formula (I)
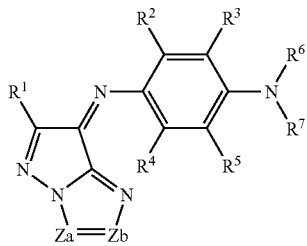

In Formula (I), $R^1$ represents a hydrogen atom or a substituent.

Examples of the substituent represented by $R^1$ include a halogen atom (such as a fluorine atom, a chlorine atom, or a bromine atom); an alkyl group (preferably a linear, branched or cyclic alkyl group having 1 to 48 carbon atoms, and more preferably 1 to 18 carbon atoms, such as methyl, ethyl, propyl, isopropyl, butyl, t-butyl, pentyl, hexyl, heptyl, octyl, 2-ethylhexyl, dodecyl, hexadecyl, cyclopropyl, cyclopentyl, cyclohexyl, 1-norbonyl, or 1-adamantyl); an alkenyl group (preferably an alkenyl group having 2 to 48 carbon atoms, and more preferably 2 to 18 carbon atoms, such as vinyl, allyl, or 3-butene-1-yl); an aryl group (preferably an aryl group having 6 to 48 carbon atoms, and more preferably 6 to 12 carbon atoms, such as phenyl or naphthyl); a heterocyclic group (preferably a heterocyclic group having 1 to 32 carbon atoms, and more preferably 1 to 12 carbon atoms, such as 2-thienyl, 4-pyridyl, 2-furyl, 2-pirimidinyl, 1-pyridyl, 2-benzothiazolyl, 1-imidazolyl, 1-pyrazolyl, or benzotriazole-1-yl); a silyl group (preferably a silyl group having 3 to 38 carbon atoms, and more preferably 3 to 12 carbon atoms, such as trimethylsilyl, triethylsilyl, tributylsilyl, t-butyldimethylsilyl, or t-hexyldimethylsilyl); a hydroxyl group; a cyano group; a nitro group;

an alkoxy group (preferably an alkoxy group having 1 to 48 carbon atoms, and more preferably 1 to 12 carbon atoms, such as methoxy, ethoxy, 1-butoxy, 2-butoxy, isopropoxy, t-butoxy, dodecyloxy, or cycloalkyloxy (such as cyclopentyloxy or cyclohexyloxy)); an aryloxy group (preferably an aryloxy group having 6 to 48 carbon atoms, and more preferably 6 to 12 carbon atoms, such as phenoxy or 1-naphthoxy); a heterocyclyloxy group (preferably a heterocyclic oxy group having 1 to 32 carbon atoms, and more preferably 1 to 12 carbon atoms, such as 1-phenyltetrazole-5-oxy or 2-tetrahydropyranyloxy); a silyloxy group (preferably a silyloxy group having 1 to 32 carbon atoms, and more preferably 1 to 12 carbon atoms, such as trimethylsilyloxy, t-butyldimethylsilyloxy, or diphenylmethylsilyloxy); an acyloxy group (preferably an acyloxy group having 2 to 48 carbon atoms, and more preferably 2 to 12 carbon atoms, such as acetoxy, pivaloyloxy, benzoyloxy, or dodecanoyloxy); an alkoxycarbonyloxy group (preferably an alkoxycarbonyloxy group having 2 to 48 carbon atoms, and more preferably 2 to 12 carbon atoms, such as ethoxycarbonyloxy, t-butoxycarbonyloxy, or cycloalkyloxycarbonyloxy (such as cyclohexyloxycarbonyloxy));

an aryloxycarbonyloxy group (preferably an aryloxycarbonyloxy group having 7 to 32 carbon atoms, and more preferably 7 to 18 carbon atoms, such as phenoxycarbonyloxy); a carbamoyloxy group (preferably carbamoyloxy group having 1 to 48 carbon atoms, and more preferably 1 to 12 carbon atoms, such as N,N-dimethylcarbamoyloxy, N-butylcarbamoyloxy, N-phenylcarbamoyloxy, or N-ethyl-N-phenylcarbamoyloxy); a sulfamoyloxy group (preferably a sulfamoyloxy group having 1 to 32 carbon atoms, and more preferably 1 to 12 carbon atoms, such as N,N-diethylsulfamoyloxy or N-propylsulfamoyloxy); an alkylsulfonyloxy group (preferably an alkylsulfonyloxy group having 1 to 38 carbon atoms, and more preferably 1 to 12 carbon atoms, such as methylsulfonyloxy, hexadecylsulfonyloxy, or cyclohexylsulfonyloxy), an arylsulfonyloxy group (preferably an arylsulfonyloxy group having 6 to 32 carbon atoms, and more preferably 6 to 12 carbon atoms, such as phenylsulfonyloxy);

an acyl group (preferably an acyl group having 1 to 48 carbon atoms, and more preferably 1 to 12 carbon atoms, such as formyl, acetyl, pivaloyl, benzoyl, tetradecanoyl, or cyclohexanoyl); an alkoxycarbonyl group (preferably an alkoxycarbonyl group having 2 to 48 carbon atoms, and more preferably 2 to 12 carbon atoms, such as methoxycarbonyl, ethoxycarbonyl, octadecyloxycarbonyl, or cyclohexyloxycarbonyl); an aryloxycarbonyl group (preferably an aryloxycarbonyl group having 7 to 32 carbon atoms, and more preferably 7 to 12 carbon atoms, such as phenoxycarbonyl); a carbamoyl group (preferably a carbamoyl group having 1 to 48 carbon atoms, and more preferably 1 to 12 carbon atoms, such as carbamoyl, N,N-diethylcarbamoyl, N-ethyl-N-octylcarbamoyl, N,N-dibutylcarbamoyl, N-propylcarbamoyl, N-phenylcarbamoyl, N-methyl-N-phenylcarbamoyl, or N,N-dicyclohexylcarbamoyl);

an amino group (preferably an amino group having 32 or less carbon atoms, more preferably 12 or less carbon atoms, such as amino, methylamino, N,N-dibutylamino, tetradecylamino, 2-ethylhexylamino, or cyclohexylamino); an anilino group (preferably an anilino group having 6 to 32 carbon atoms, and more preferably 6 to 12 carbon atoms, such as anilino or N-methylanilino); a heterocyclylamino group (preferably a heterocyclylamino group having 1 to 32 carbon atoms, and more preferably 1 to 12 carbon atoms, such as 4-pyridylamino); a carbonamide group (preferably a carbonamide group having 2 to 48 carbon atoms, and more preferably 2 to 12 carbon atoms, such as acetamide, benzamide, tetradecaneamide, pivaloylamide, or cyclohexaneamide); a ureido group (preferably a ureido group having 1 to 32 carbon atoms, and more preferably 1 to 12 carbon atoms, such as ureido, N,N-dimethylureido or N-phenylureido); an imide group (an imide group having 20 or less carbon atoms, and more preferably 12 or less carbon atoms, such as N-succinimide or N-phthalimide); an alkoxycarbonylamino group (preferably an alkoxycarbonylamino group having 2 to 48, and more preferably 2 to 12 carbon atoms, such as methoxycarbonylamino, ethoxycarbonylamino, t-butoxycarbonylamino, octadecyloxycarbonylamino, or cyclohexyloxycarbonylamino);

an aryloxy carbonylamino group (preferably an aryloxycarbonylamino group having 7 to 32 carbon atoms and more preferably 7 to 12 carbon atoms, such as phenoxycarbonylamino); a sulfonamide group (preferably a sulfonamide group having 1 to 48 carbon atoms, and more preferably 1 to 12 carbon atoms, such as methanesulfonamide, butanesulfonamide, benzenesulfonamide, hexadecanesulfonamide, or cyclohexanesulfonamide); a sulfamoylamino group (preferably a sulfamoylamino group having 1 to 48 carbon atoms, and more preferably 1 to 12 carbon atoms, such as N,N-dipropylsulfamoylamino or N-ethyl-N-dodecylsulfamoylamino); an azo group (preferably an azo group having 1 to 48 carbon atoms, and more preferably 1 to 24 carbon atoms, such as phenylazo or 3-pyrazolylazo); an alkylthio group (preferably an alkylthio group having 1 to 48 carbon atoms, and more preferably 1 to 12 carbon atoms, such as methylthio, ethylthio, octylthio, or cyclohexylthio); an arylthio group (preferably an arylthio group having 6 to 48 carbon atoms, and more preferably 6 to 12 carbon atoms, such as phenylthio); a heterocyclylthio group (preferably a heterocyclylthio group having 1 to 32 carbon atoms, and more preferably 1 to 12 carbon atoms, such as 2-benzothiazolylthio, 2-pyridylthio, or 1-phenyltetrazolylthio); an alkylsulfinyl group (preferably an alkylsulfinyl group having 1 to 32 carbon atoms, and more preferably 1 to 12 carbon atoms, such as dodecanesulfinyl); an arylsulfinyl group (preferably an arylsulfinyl group having 6 to 32 carbon atoms, and more preferably 6 to 12 carbon atoms, such as phenylsulfinyl); an alkylsulfonyl group (preferably an alkylsulfonyl group having 1 to 48 carbon atoms, and more preferably 1 to 12 carbon atoms, such as methylsulfonyl, ethylsulfonyl, propylsulfonyl, butylsulfonyl, isopropylsulfonyl, 2-ethylhexylsulfonyl, hexadecylsulfonyl, octylsulfonyl, or cyclohexylsulfonyl);

an arylsulfonyl group (preferably an arylsulfonyl group having 6 to 48 carbon atoms, and more preferably 6 to 12 carbon atoms, such as phenylsulfonyl or 1-naphthylsulfonyl); a sulfamoyl group (preferably a sulfamoyl group having 32 or less carbon atoms, and more preferably 16 or less carbon atoms, such as sulfamoyl, N,N-dipropylsulfamoyl, N-ethyl-N-do decylsulfamoyl, N-ethyl-N-phenylsulfamoyl, or N-cyclohexylsulfamoyl); a sulfo group; a phosphonyl group (preferably a phosphonyl group having 1 to 32 carbon atoms, and more preferably 1 to 12 carbon atoms, such as phenoxyphosphonyl, octyloxyphosphonyl, or phenylphosphonyl); and a phosphinoylamino group (preferably a phosphinoylamino group 1 to 32 carbon atoms, and more preferably 1 to 12 carbon atoms, such as diethoxyphosphinoylamino or dioctyloxyphosphinoylamino).

When the substituent represented by $R^1$ is a group that can be substituted, the substituent represented by $R^1$ may be further substituted with a substituent (i.e., the substituent represented by $R^1$ may itself has a substituent), wherein the further substituent on $R^1$ may be selected from the range of substituents that $R^1$ can represent; when the substituent represented by $R^1$ has two or more substituents, the two or more substituents may be the same as or mutually different from one another.

In Formula (I), $R^2$, $R^3$, $R^4$ and $R^5$ each independently represent a hydrogen atom or a substituent. The substituents represented by $R^2$ to $R^5$ have the same definition as that of the substituent represented by $R^1$, and preferable embodiments thereof are also the same as those of $R^1$. When any of the substituents represented by $R^2$ to $R^5$ is a group that can be substituted, the group may be further substituted with a substituent (i.e., the group may itself have a substituent), wherein the further substituent on the group may be selected from the range of substituents that $R^1$ can represent; when the group has two or more substituents, the two or more substituents may be the same as or mutually different from one another.

In Formula (I), $R^6$ and $R^7$ each independently represent an alkyl group, an alkenyl group, an aryl group, or a heterocyclic group. The alkyl group represented by $R^6$ or $R^7$ has the same definition as that of the alkyl group as a substituent represented by $R^1$ described above, and preferable embodiments thereof are also the same as those of the alkyl group as a substituent represented by $R^1$ described above. The alkenyl group represented by $R^6$ or $R^7$ has the same definition as that of the alkenyl group as a substituent represented by $R^1$ described above, and preferable embodiments thereof are also the same as those of the alkenyl group as a substituent represented by $R^1$ described above. The aryl group represented by $R^6$ or $R^7$ has the same definition as that of the aryl group as a substituent represented by $R^1$ described above, and preferable embodiments thereof are also the same as those of the aryl group as a substituent represented by $R^1$ described above. The heterocyclic group represented by $R^6$ or $R^7$ has the same definition as that of the heterocyclic group as a substituent represented by $R^1$ described above, and preferable embodiments thereof are also the same as those of the heterocyclic group as a substituent represented by $R^1$ described above.

Further, when any of the substituents represented by $R^6$ and $R^7$ is a group that can be substituted, the group may be further substituted with a substituent (i.e., the group may itself have a substituent), wherein the further substituent on the group may be selected from the range of substituents that $R^1$ can represent; when the group has two or more substituents, the two or more substituents may be the same as or mutually different from one another.

In a combination of $R^2$ and $R^3$, a combination of $R^3$ and $R^6$, a combination of $R^4$ and $R^5$, a combination of $R^5$ and $R^7$, and a combination of $R^6$ and $R^7$, the two members of each combination may be linked to each other to form a 5-membered, 6-membered, or 7-membered ring independently from the other combinations. Preferable examples of the 5-membered, 6-membered or 7-membered ring include cyclopentene, cyclohexene, cycloheptene, dihydropyrrole, and tetrahydropyridine. The ring may be substituted with a substituent selected from the range of substituents that $R^1$ can represent. Further, when the ring is substituted with two or more substituents, the two or more substituents may be the same as or mutually different from one another.

In Formula (I), Za and Zb each independently represent —N= or —C($R^8$)=, and $R^8$ represents a hydrogen atom, an alkyl group, an aryl group, or a heterocyclic group.

The alkyl group represented by $R^8$ has the same definition as that of the alkyl group as a substituent represented by $R^1$ described above, and preferable embodiments thereof are also the same as those of the alkyl group as a substituent represented by $R^1$ described above. The aryl group represented by $R^8$ has the same definition as that of the aryl group as a substituent represented by $R^1$ described above, and preferable embodiments thereof are also the same as those of the aryl group as a substituent represented by $R^1$ described above. The heterocyclic group represented by $R^8$ has the same definition as that of the heterocyclic group as a substituent represented by $R^1$ described above, and preferable embodiments thereof are also the same as those of the heterocyclic group as a substituent represented by $R^1$ described above.

Further, when the group represented by each $R^8$ is a group that can be substituted, the group represented by each $R^8$ may be further substituted with a substituent (i.e., the group may itself have a substituent) wherein the further substituent may be selected from the range of substituents that $R^1$ can represent; and when the group has two or more substituents, the two or more substituents may be the same as or mutually different from one another.

Among the azomethine dyes represented by Formula (I), an azomethine dye (dyestuff) represented by the following Formula (II) is preferable.

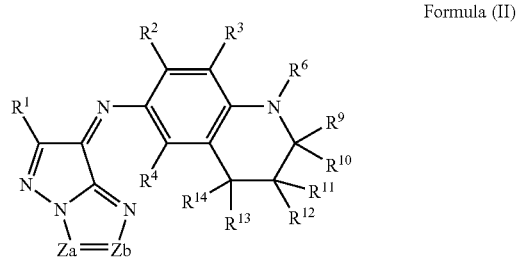

Formula (II)

In Formula (II), $R^9$ to $R^{14}$ each independently represent a hydrogen atom or a substituent. In formula (II), $R^1$, $R^2$, $R^3$, $R^4$ and $R^6$ have the same definitions as $R^1$, $R^2$, $R^3$, $R^4$ and $R^6$ in Formula (I), respectively, and have the same preferable embodiments as $R^1$, $R^2$, $R^3$, $R^4$ and $R^6$ in Formula (I), respectively. Za and Zb in Formula (II) have the same definitions as Za and Zb in Formula (I), respectively, and have the same preferable embodiments as Za and Zb in Formula (I), respectively.

The substituents represented by $R^9$ to $R^{14}$ have the same definition as that of the substituent represented by $R^1$ of Formula (I), and preferable embodiments thereof are also the same as those of the substituent represented by $R^1$ of Formula (I). When any of the substituents represented by $R^9$ to $R^{14}$ is a group that can be substituted, the group may be further substituted with a substituent (i.e., the group may itself have a substituent) wherein the further substituent may be selected from the group of substituents that $R^1$ can represent; when the group has two or more substituents, the two or more substituents may be the same as or mutually different from one another.

In a combination of $R^2$ and $R^3$, a combination of $R^3$ and $R^6$, a combination of $R^6$ and $R^9$, and a combination of $R^4$ and $R^{14}$, the two member of each combination may be linked to each other to form a 5-membered, 6-membered or 7-membered ring independently from the other combinations. Preferable examples of the 5-membered, 6-membered or 7-membered ring include cyclopentene, cyclohexene, cycloheptene, dihydropyrrole, and tetrahydropyridine.

In Formula (II), when any of the substituents represented by $R^1$, $R^2$, $R^3$ or $R^4$ is a group that can be substituted, the group may be further substituted with a substituent (i.e., the group may itself has a substituent) wherein the further substituent may be selected from the range of substituents that $R^1$ in Formula (1) can represent; when the group has two or more substituents, the two or more substituents may be the same as or mutually different from one another.

Among the azomethine dye represented by Formula (II), an azomethine dye represented by the following Formula (III) is preferable.

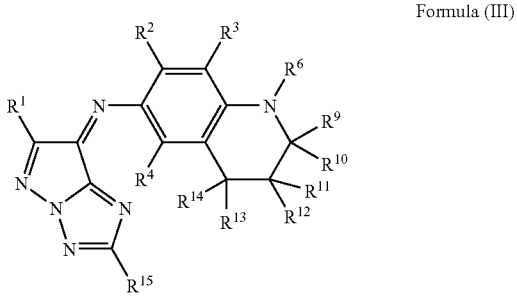

Formula (III)

In Formula (III), R¹⁵ represents a hydrogen atom, an alkyl group, an aryl group, or a heterocyclic group. In Formula (III), R¹ to R⁴, R⁶, and R⁹ to R¹⁴ have the same definitions as R¹ to R⁴, R⁶, and R⁹ to R¹⁴, respectively, in Formula (I) or Formula (II), and have the same preferable embodiments as R¹ to R⁴, R⁶, and R⁹ to R¹⁴, respectively, in Formula (I) or Formula (II).

The alkyl group represented by R¹⁵ has the same definition as that of the alkyl group described as a substituent represented by R¹ in Formula (I), and preferable embodiments thereof are also the same as those of the alkyl group described as a substituent represented by R¹ in Formula (I). The aryl group represented by R¹⁵ has the same definition as that of the aryl group described as a substituent represented by R¹ in Formula (I), and preferable embodiments thereof are also the same as those of the aryl group described as a substituent represented by R¹ in Formula (I). The heterocyclic group represented by R¹⁵ has the same definition as that of the heterocyclic group described as a substituent represented by R¹ in Formula (I), and preferable embodiments thereof are also the same as those of the heterocyclic group described as a substituent represented by R¹ in Formula (I).

The group represented by each R¹⁵ may be substituted with a substituent selected from the range of substituents that R¹ in Formula (1) can represent; when the group represented by R¹⁵ is substituted with two or more substituents, the two or more substituents may be the same as or mutually different from one another.

Preferable examples of the azomethine dye represented by Formula (III) are as follows:

In the azomethine dye represented by Formula (III), R¹ more preferably represents an alkyl group, an alkenyl group, an aryl group, a heterocyclic group, a hydroxyl group, a cyano group, an alkoxy group, an aryloxy group, a heterocyclyloxy group, a carbamoyloxy group, an acyl group, an alkoxycarbonyl group, an aryloxycarbonyl group, a carbamoyl group, an imide group, an azo group, an alkylthio group, an arylthio group, a heterocyclylthio group, an alkylsulfinyl group, an arylsulfinyl group, an alkylsulfonyl group, an arylsulfonyl group, a sulfamoyl group, a sulfo group, a phosphonyl group, or a phosphinoylamino group; R², R³ and R⁴ each independently represent more preferably a hydrogen atom, a halogen atom, an alkyl group, an alkenyl group, an aryl group, a heterocyclic group, an alkoxy group, an aryloxy group, an alkoxycarbonyl group, a carbamoyl group, an amino group, an anilino group, a carbonamide group, a ureido group, an alkoxycarbonylamino group, a sulfonamide group, a sulfamoylamino group, an azo group, an alkylthio group, an arylthio group, a heterocyclylthio group, an alkylsulfinyl group, an arylsulfinyl group, an alkylsulfonyl group, an arylsulfonyl group, a sulfamoyl group, a sulfo group, a phosphonyl group, or a phosphinoylamino group; R⁶ represents more preferably an alkyl group, an alkenyl group, an aryl group, or a heterocyclic group; R⁸ represents more preferably a hydrogen atom, an alkyl group, an aryl group, or a heterocyclic group; and R⁹ to R¹⁴ each independently represent more preferably a hydrogen atom, a halogen atom, an alkyl group, or an alkoxy group.

In the azomethine dye represented by Formula (III), R¹ more preferably represents an alkyl group, an alkenyl group, an aryl group, a heterocyclic group, an alkoxycarbonyl group, a carbamoyl group, an imide group, an alkylthio group, an arylthio group, a heterocyclylthio group, an alkylsulfonyl group, or an arylsulfonyl group; R², R³ and R⁴ each independently represent more preferably a hydrogen atom, a halogen atom, an alkyl group, an alkoxy group, an aryloxy group, an alkoxycarbonyl group, a carbamoyl group, a carbonamide group, a ureido group, an alkoxycarbonylamino group, a sulfonamide group, an alkylthio group or an arylthio group; R⁶ more preferably represents an alkyl group, an alkenyl group, an aryl group or a heterocyclic group; R³ more preferably represents a hydrogen atom, an alkyl group, an aryl group, or a heterocyclic group; and R⁹ to R¹⁴ each independently represent more preferably a hydrogen atom or an alkyl group.

In the azomethine dye represented by Formula (III), R¹ still more preferably represents an alkyl group, an aryl group, a heterocyclic group, an alkoxycarbonyl group, a carbamoyl group, an alkylthio group, an arylthio group, an alkylsulfonyl group, or an arylsulfonyl group; R², R³ and R⁴ each independently represent still more preferably a hydrogen atom, a halogen atom, an alkyl group, an alkoxy group, an aryloxy group, an alkoxycarbonyl group, a carbamoyl group, a carbonamide group, a ureido group, an alkoxycarbonylamino group, a sulfonamide group, an alkylthio group, or an arylthio group; R⁶ still more preferably represents an alkyl group or an aryl group; R⁸ still more preferably represents a hydrogen atom, an alkyl group, an aryl group, or a heterocyclic group; and R⁹ to R¹⁴ each independently represent still more preferably a hydrogen atom or an alkyl group.

Furthermore, in the azomethine dye represented by Formula (III), R¹ further preferably represents an alkyl group; R², R³ and R⁴ each independently represent further preferably a hydrogen atom, a halogen atom, an alkyl group, or an alkoxy group; R⁶ further preferably represents an alkyl group; R⁸ further preferably represents an alkyl group, an aryl group, or a heterocyclic group; and R⁹ to R¹⁴ each independently represent further preferably a hydrogen atom or an alkyl group.

In the azomethine dye represented by Formula (III), it is particularly preferable that R¹ represents a tertiary alkyl group (preferably an alkyl group having 4 to 16 carbon atoms, and more preferably a tertiary alkyl group having 4 to 8 carbon atoms, such as t-butyl, t-amyl, t-octyl, or 1-adamantyl), R², R³ and R⁴ each independently represents a hydrogen atom, a halogen atom (such as a fluorine atom, a chlorine atom, a bromine atom or an iodine atom, and preferably a fluorine atom or a chlorine atom), an alkyl group (preferably an alkyl group having 1 to 12 carbon atoms, and more preferably an alkyl group having 1 to 8 carbon atoms, such as methyl, ethyl, propyl, isopropyl, t-butyl, cyclohexyl, or 2-ethylhexyl) or an alkoxy group (preferably an alkoxy group having 1 to 12 carbon atoms, and more preferably an alkoxy group having 1 to 8 carbon atoms, such as methoxy, ethoxy, isopropyloxy, octyloxy or 2-ethylhexyloxy), R⁶ represents an alkyl group (preferably an alkyl group having 1 to 18 carbon atoms, and more preferably an alkyl group having 1 to 12 carbon atoms, such as methyl, ethyl, propyl, isopropyl, octyl, 2-ethylhexyl, 2-hydroxyethyl, or 3-hydroxypropyl), R⁸ represents an alkyl group (preferably an alkyl group having 1 to 24 carbon atoms, and more preferably an alkyl group having 1 to 18 carbon atoms, such as methyl, ethyl, isopropyl, t-butyl, 2-ethylhexyl, dodecyl, or hexadecyl), an aryl group (preferably an aryl group having 6 to 24 carbon atoms, and more preferably an aryl group having 6 to 12 carbon atoms, such as phenyl or naphthyl), or a heterocyclic group (preferably a heterocyclic group having 1 to 12 carbon atoms, and more preferably a heterocyclic group having 2 to 12 carbon atoms, such as 2-thienyl, 4-pyridyl, 2-pyridyl, 2-imidazolyl, or 3-pyrazolyl), $R^9$ and $R^{10}$ each independently represent an alkyl group (preferably an alkyl group having 1 to 8 carbon atoms, and more preferably an alkyl group having 1 to 4 carbon atoms, such as methyl, ethyl or propyl (more preferably methyl)), $R^{11}$ to $R^{13}$ each independently represent a hydrogen atom, and $R^{14}$ represents an alkyl group (preferably an alkyl group having 1 to 8 carbon atoms, and more preferably an alkyl group having 1 to 4 carbon atoms, such as methyl, ethyl or propyl (more preferably methyl).

Specific examples of the azomethine dye represented by Formula (I) (Exemplary Compounds M-1 to M-84) are shown below. However, the invention is not limited thereto.

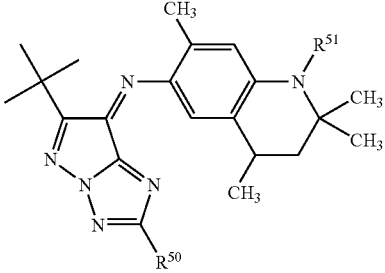

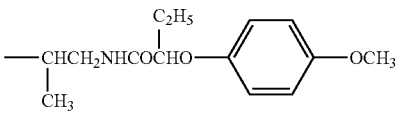
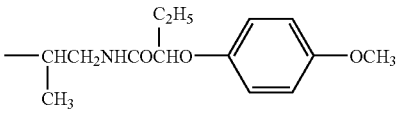
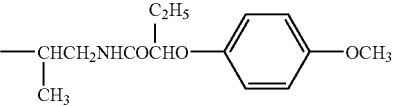
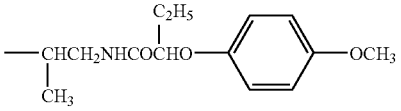
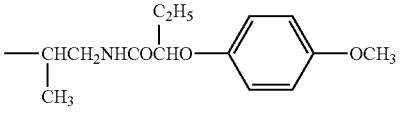
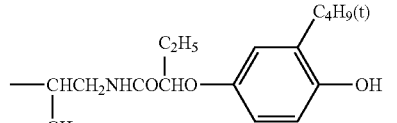
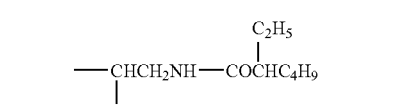
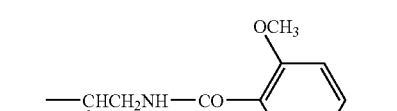

-continued
M-9 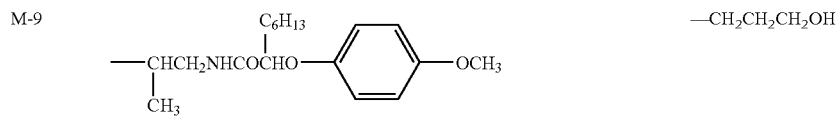 —CH₂CH₂CH₂OH
M-10 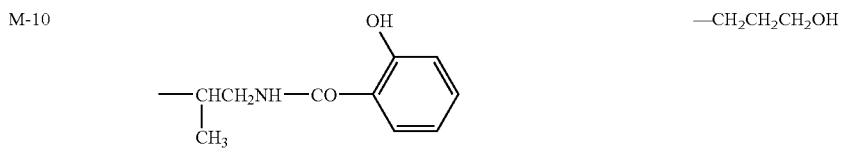 —CH₂CH₂CH₂OH
M-11 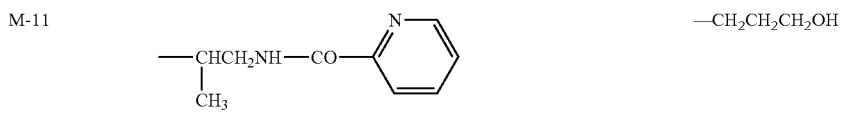 —CH₂CH₂CH₂OH
M-12  —CH₂CH₂CH₂OH
M-13 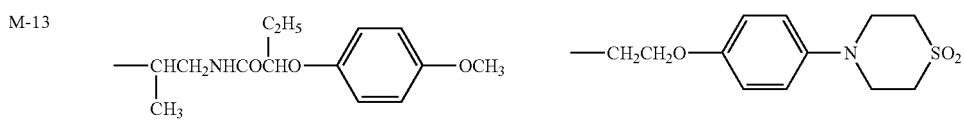
M-14 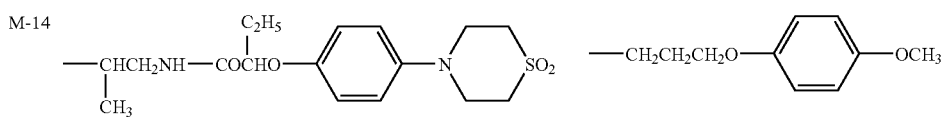
M-15 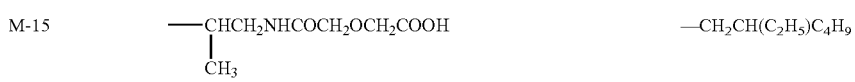 —CH₂CH(C₂H₅)C₄H₉
M-16 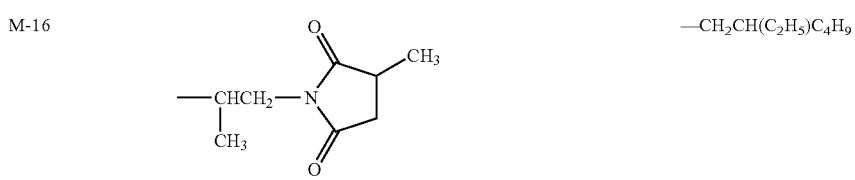 —CH₂CH(C₂H₅)C₄H₉
M-17 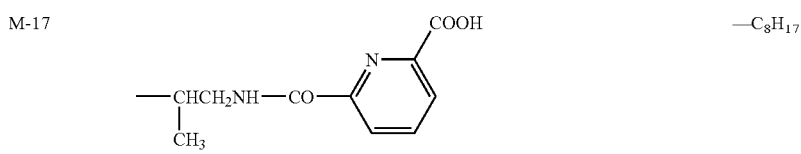 —C₈H₁₇
M-18 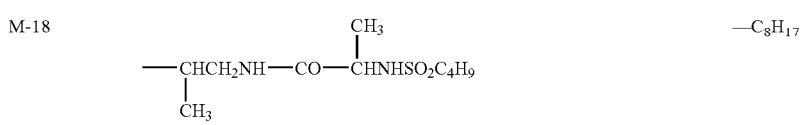 —C₈H₁₇
M-19 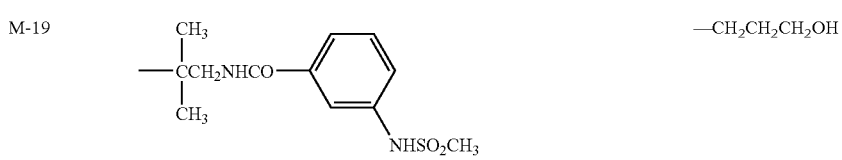 —CH₂CH₂CH₂OH
M-20 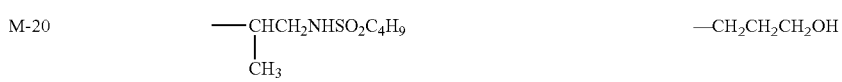 —CH₂CH₂CH₂OH -continued

| | | |
|---|---|---|
| M-21 | —CHCH$_2$NHSO$_2$C$_8$H$_{17}$<br>   \|<br>  CH$_3$ | —CH$_2$CH$_2$CH$_2$OH |
| M-22 | —CHCH$_2$NHSO$_2$C$_{16}$H$_{33}$<br>   \|<br>  CH$_3$ | —C$_2$H$_5$ |
| M-23 | —CHCH$_2$NHSO$_2$CH$_3$<br>   \|<br>  CH$_3$ | —CH$_2$CH$_2$CH$_2$O—C$_6$H$_4$—OCH$_3$ |
| M-24 | —CHCH$_2$NHSO$_2$—C$_6$H$_5$<br>   \|<br>  CH$_3$ | —CH$_2$CH$_2$CH$_2$O—C$_6$H$_4$—OCH$_3$ |
| M-25 | —CHCH$_2$NHSO$_2$—C$_6$H$_4$—CH$_3$<br>   \|<br>  CH$_3$ | —CH$_2$CH$_2$CH$_2$OH |
| M-26 | —CHCH$_2$NHSO$_2$—C$_6$H$_4$—C$_4$H$_9$(iso)<br>   \|<br>  CH$_3$ | —CH$_2$CH$_2$CH$_2$OH |
| M-27 | —CHCH$_2$NHSO$_2$—C$_6$H$_3$(COOH)—<br>   \|<br>  CH$_3$ | —C$_8$H$_{17}$ |
| M-28 | —C$_6$H$_4$—NHSO$_2$CH$_3$ (m-) | —CH$_2$CH(C$_2$H$_5$)C$_4$H$_9$ |
| M-29 | —C$_6$H$_4$—NHSO$_2$CH$_3$ (p-) | —CH$_2$CH(C$_2$H$_5$)C$_4$H$_9$ |
| M-30 | —C$_6$H$_3$(NHSO$_2$CH$_3$)(CH$_3$) | —C$_{12}$H$_{25}$ |
| M-31 | —C$_6$H$_3$Cl$_2$ | —C$_{12}$H$_{25}$ |
| M-32 | —C$_6$H$_4$—NHSO$_2$—C$_6$H$_5$ | —CH$_2$CH$_2$OH |

-continued
| | | |
|---|---|---|
| M-33 | 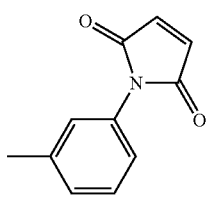 | —CH$_2$CH$_2$OH |
| M-34 | 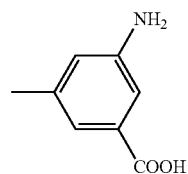 | —CH$_2$CH(C$_2$H$_5$)C$_4$H$_9$ |
| M-35 | 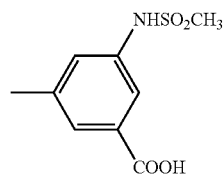 | 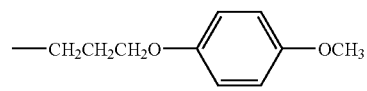 —CH$_2$CH$_2$CH$_2$O—⟨C$_6$H$_4$⟩—OCH$_3$ |
| M-36 | 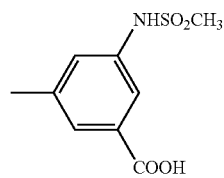 | 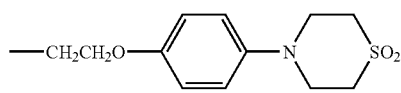 |
| M-37 | 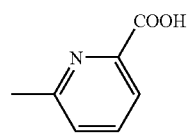 | 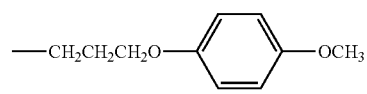 —CH$_2$CH$_2$CH$_2$O—⟨C$_6$H$_4$⟩—OCH$_3$ |
| M-38 | —CF$_3$ | 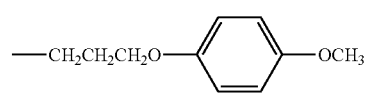 —CH$_2$CH$_2$CH$_2$O—⟨C$_6$H$_4$⟩—OCH$_3$ |
| M-39 | —C$_7$F$_{15}$ | 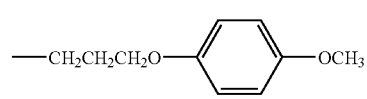 —CH$_2$CH$_2$CH$_2$O—⟨C$_6$H$_4$⟩—OCH$_3$ |
| M-40 | 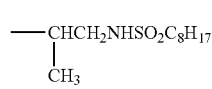 | —CH$_2$CH$_2$SO$_2$CH$_3$ |
| M-41 | 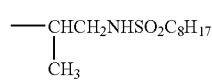 | —CH$_2$CH$_2$SC$_4$H$_9$ |
| M-42 | 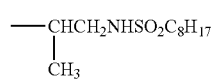 | —CH$_2$CH$_2$OCH$_2$CH$_2$OCH$_3$ |

-continued
M-43
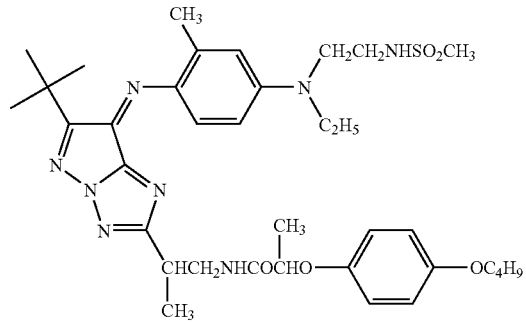
M-44
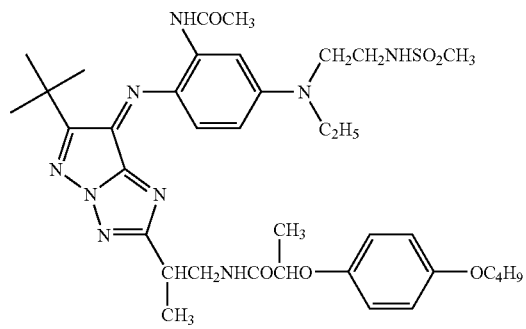
M-45
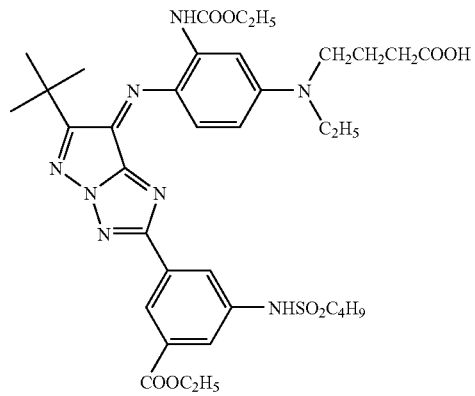
M-46
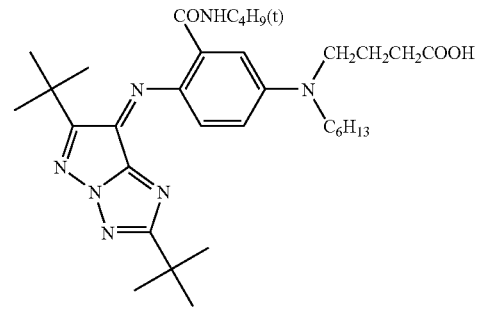

-continued
M-47
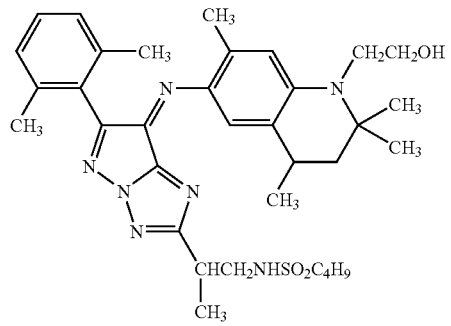
M-48
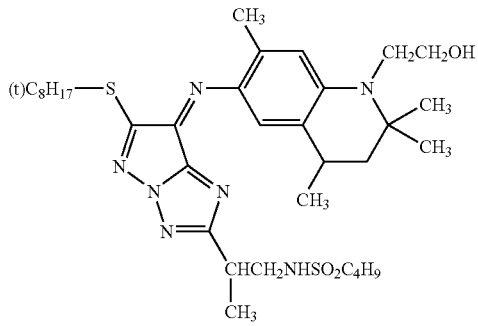
M-49
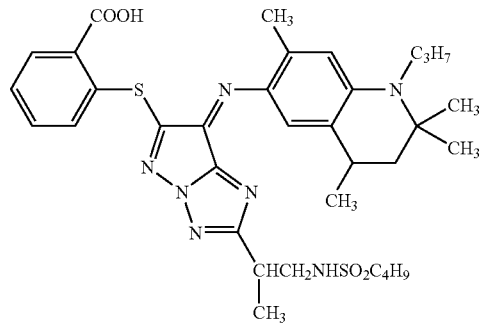
M-50
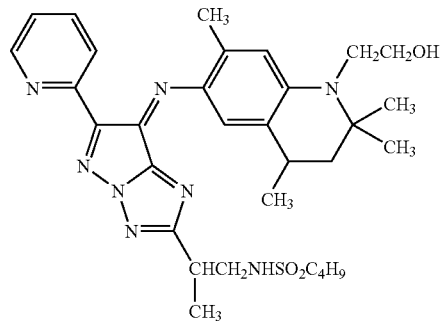

-continued
M-51
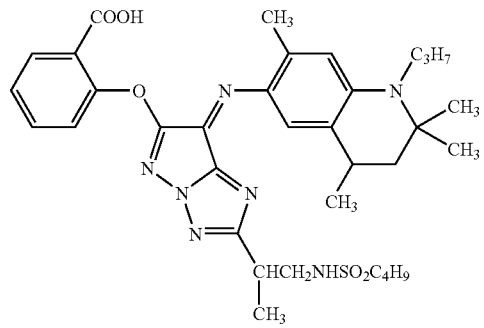
M-52
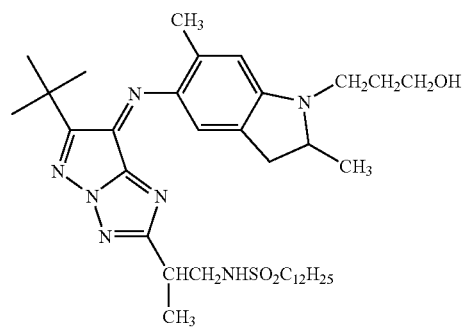
M-53
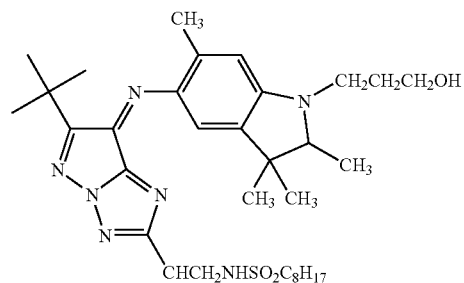
M-54
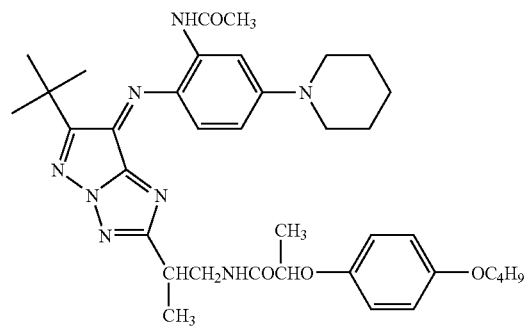

-continued
M-55
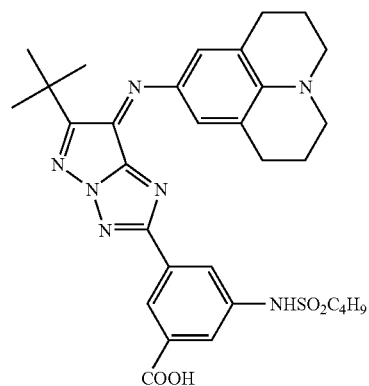
M-56
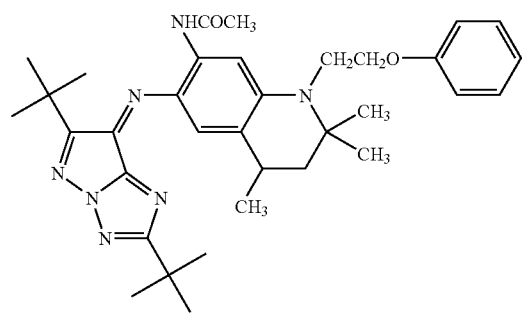
M-57
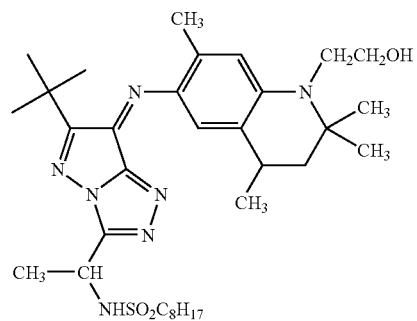
M-58
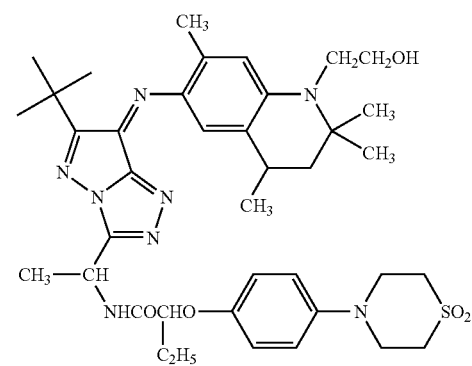

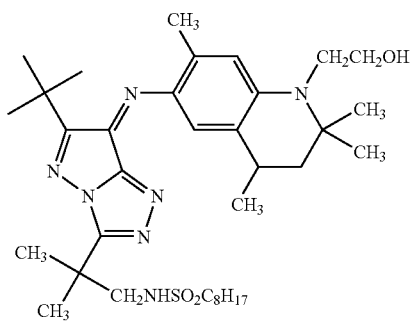
M-59
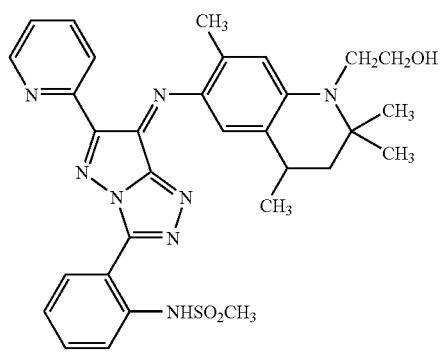
M-60
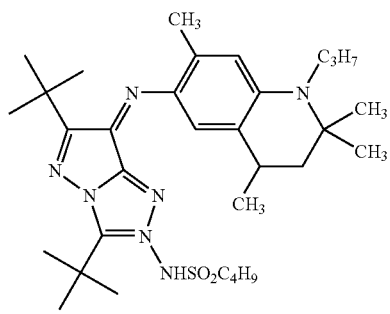
M-61
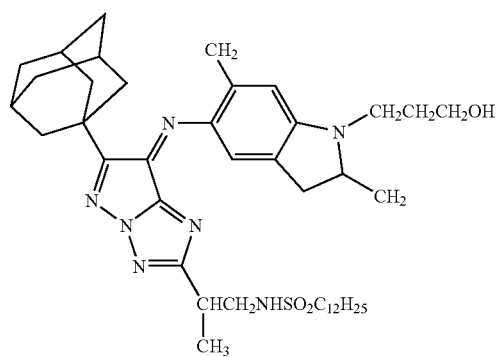
M-62

-continued
M-63
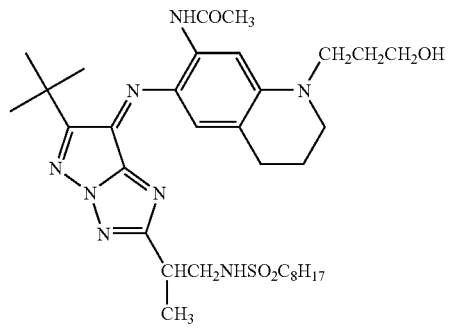
M-64
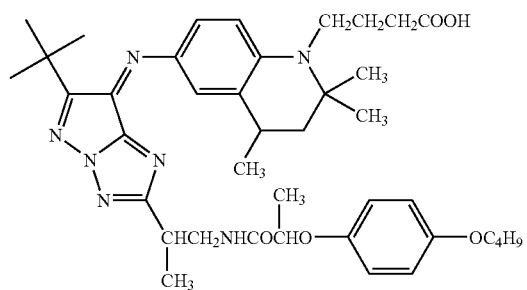
M-65
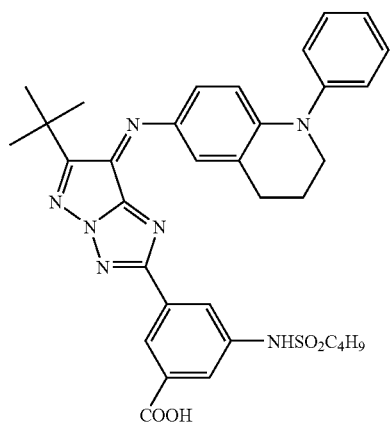
M-66
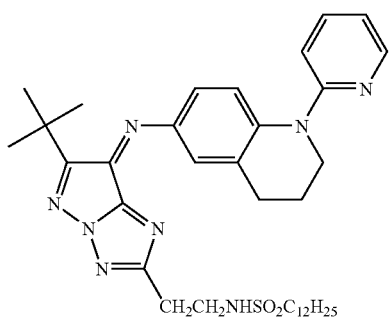

-continued
M-67
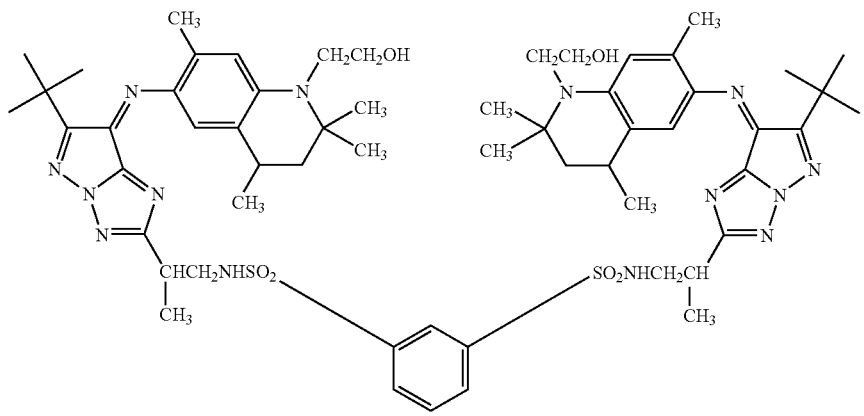
M-68
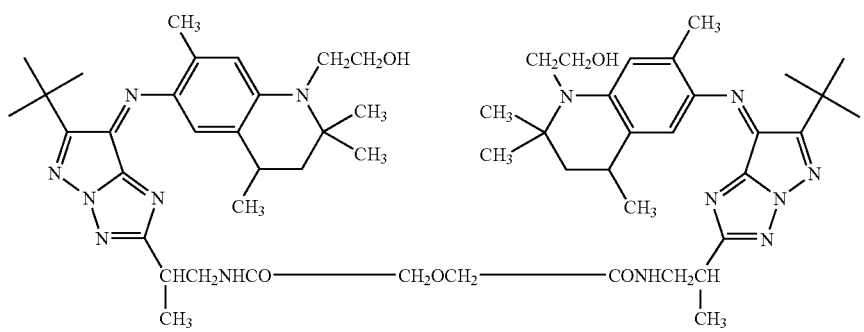
M-69
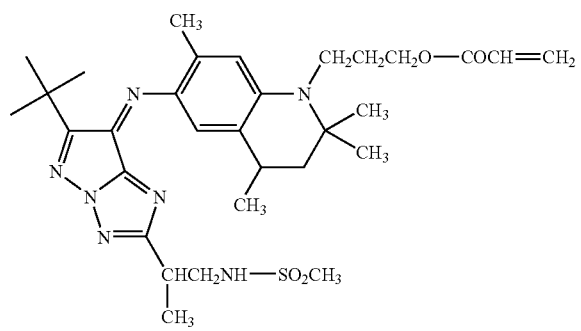
M-70
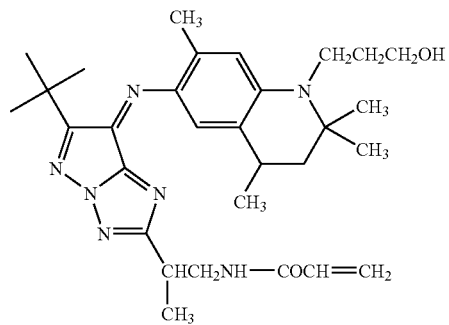

M-71
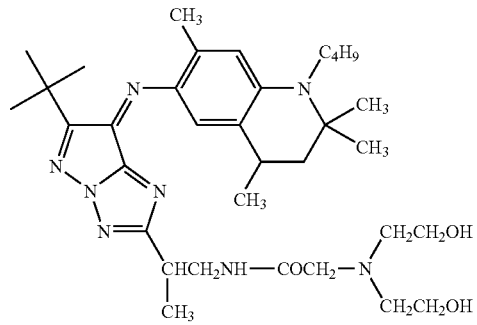
M-72
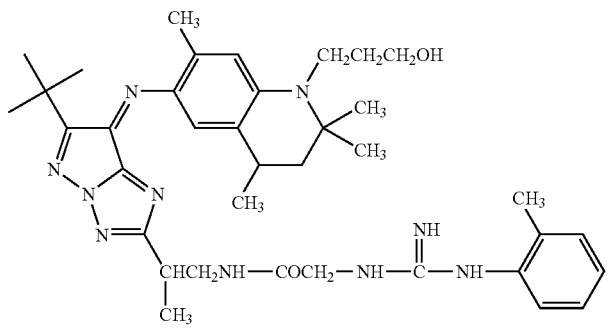
M-73
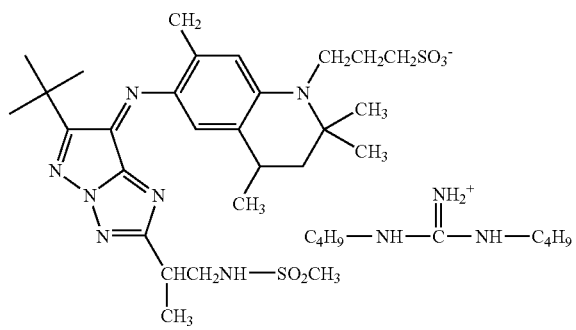
M-74
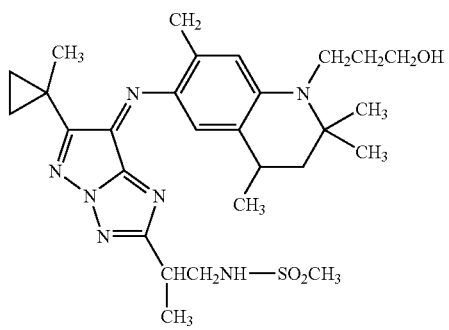

-continued
M-75
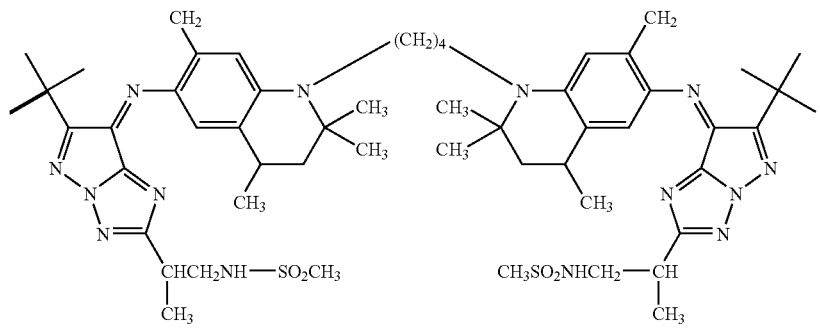
M-76
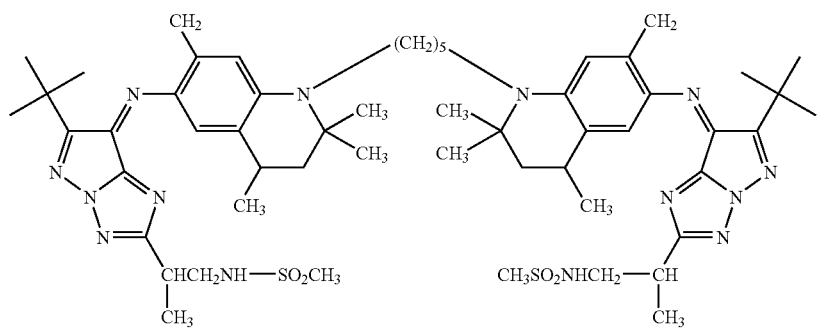
M-77
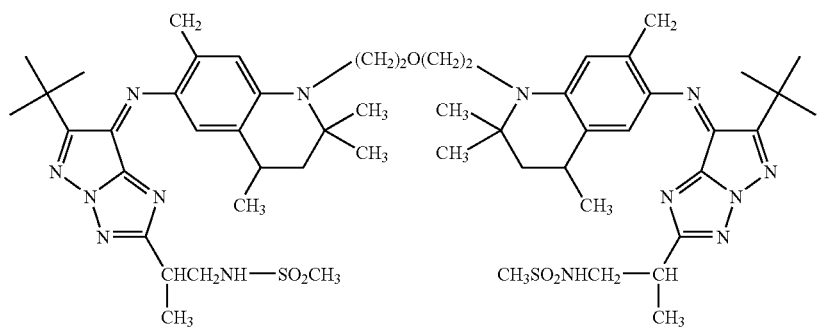
M-78
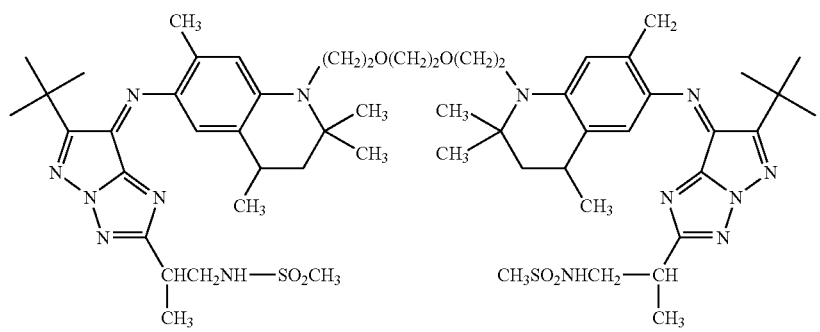

M-79
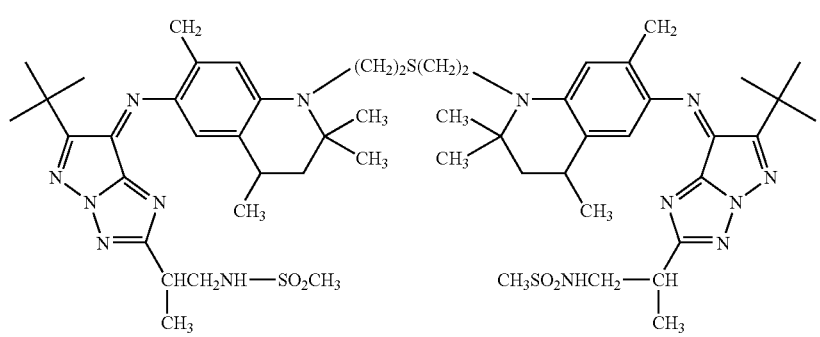
M-80
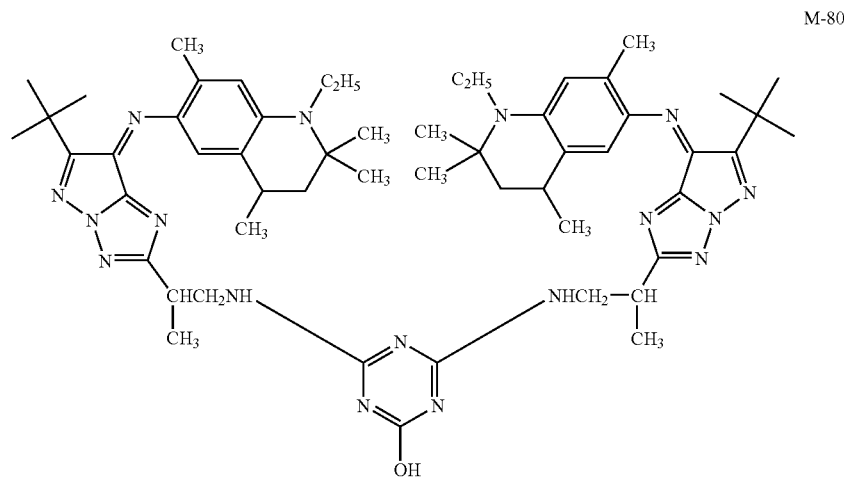
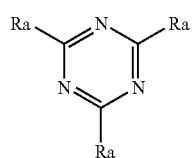
M-81
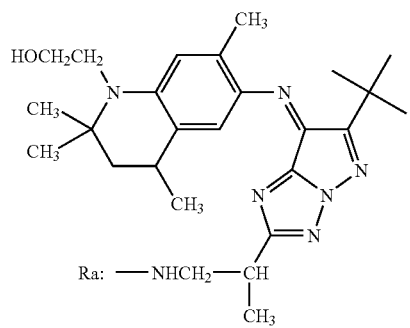

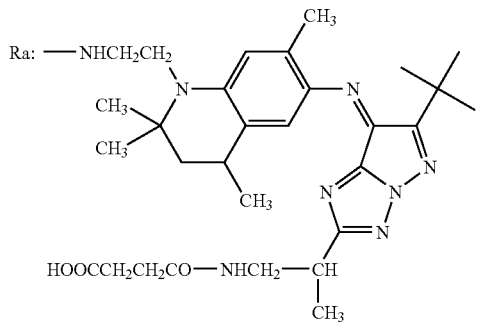

M-82

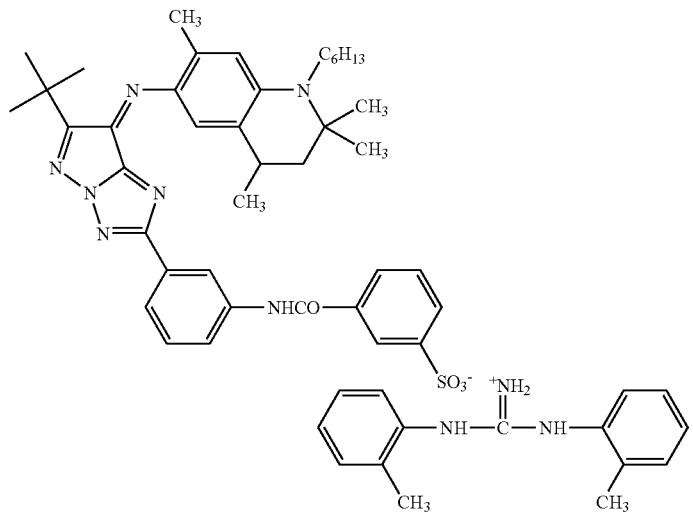

M-83

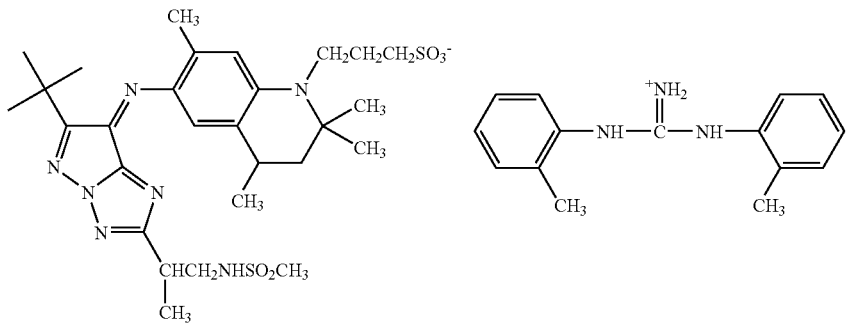

M-84

The azomethine dye represented by Formula (I) can be synthesized, for example, with reference to the method described in paragraphs [0034] to [0071] of JP-A No. 2006-58700, which is incorporated herein by reference.

Tetraazaporphyrin Dye Represented by Formula (A)

The colored curable composition of the invention may include at least one kind of tetraazaporphyrin dye represented by the following Formula (A). The dye represented by Formula (A) exhibits a good cyan hue with high light transmittance. When the dye is contained in a liquid preparation or a coated layer, the dye does not separate out over time and has superior stability, and in particular, has excellent resistance to heat or light.

101

Formula (A)

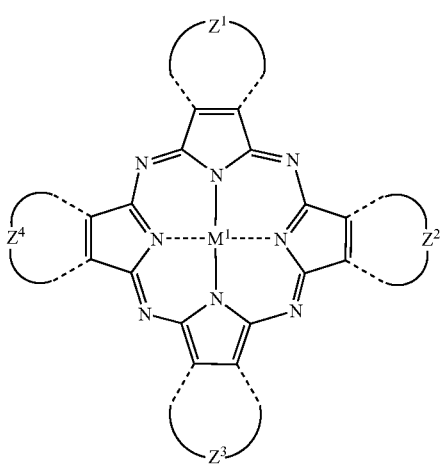

In Formula (A), $M^1$ represents a metal, and $Z^1$, $Z^2$, $Z^3$ and $Z^4$ each independently represent an atomic group for forming a 6-membered ring that is composed of atoms each selected from the group consisting of a carbon atom and a nitrogen atom.

In Formula (A), $M^1$ represents a metal, and examples thereof include metals such as Zn, Mg, Si, Sn, Rh, Pt, Pd, Mo, Mn, Pb, Cu, Ni, Co, or Fe; metal chlorides such as AlCl, InCl, FeCl, TiCl$_2$, SnCl$_2$, SiCl$_2$, or GeCl$_2$; metal oxides such as TiO or VO; and metal hydroxides such as Si(OH)$_2$.

In Formula (A), $Z^1$, $Z^2$, $Z^3$ and $Z^4$ each independently represent an atomic group that is required for forming a 6-membered ring and that is composed of atoms each of which is selected from a carbon atom or a nitrogen atom. Examples of the 6-membered ring include a benzene ring and a cyclohexane ring. The 6-membered ring may be a saturated ring or an unsaturated ring, may be unsubstituted or substituted, and may be further condensed with another 5-membered or 6-membered ring. Examples of the 6-membered ring include a benzene ring and a cyclohexane ring.

Among the tetraazaporphyrin dye represented by Formula (A), a phthalocyanine dye represented by the following Formula (B) is preferable.

Formula (B)

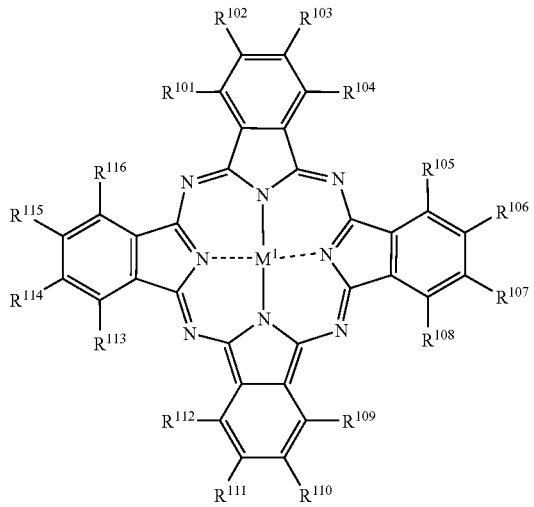

102

In Formula (B), $M^1$ has the same definition as that of $M^1$ in Formula (A), and preferable embodiments thereof are also the same as those of $M^1$ in Formula (A).

In Formula (B), $R^{101}$ to $R^{116}$ each independently represent a hydrogen atom or a substituent, and the substituents represented by $R^{101}$ to $R^{116}$ have the same definitions as that of the substituent represented by $R^1$ in Formula (I), and preferable embodiments thereof are the same as those of the substituent represented by $R^1$ in Formula (I). Moreover, when any of the substituents represented by $R^{101}$ to $R^{116}$ is a group that can be substituted, the group may be further substituted with a substituent (i.e., the group may itself have a substituent) wherein the substituent may be selected from the range of substituents that $R^1$ in Formula (I) can represent; and when the group has two or more substituents, the two or more substituents may be the same as or mutually different from one another.

Hereinafter, examples of substituents represented by $R^{101}$ to $R^{116}$ (T-1 to T-139) are shown below. However, the invention is not limited thereto.

—F    T-1

—Cl   T-2

—Br   T-3

—CH$_3$   T-4

—C$_4$H$_9$(t)   T-5

—CF$_3$   T-6

—CN   T-7

—NO$_2$   T-8

—COONa   T-9

—CONH$_2$   T-10

   T-11

   T-12

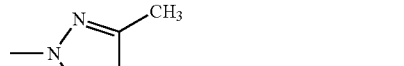   T-13

   T-14

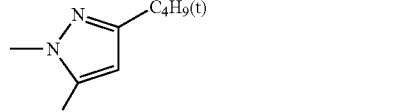   T-15

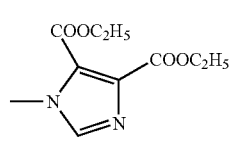

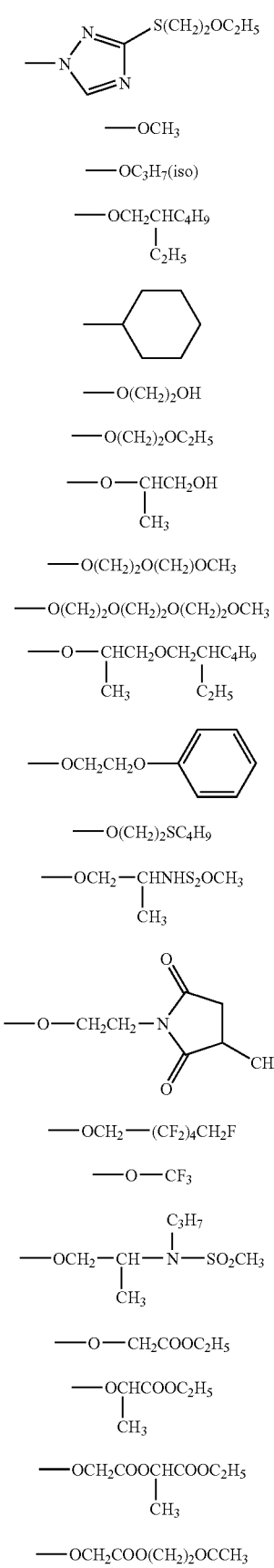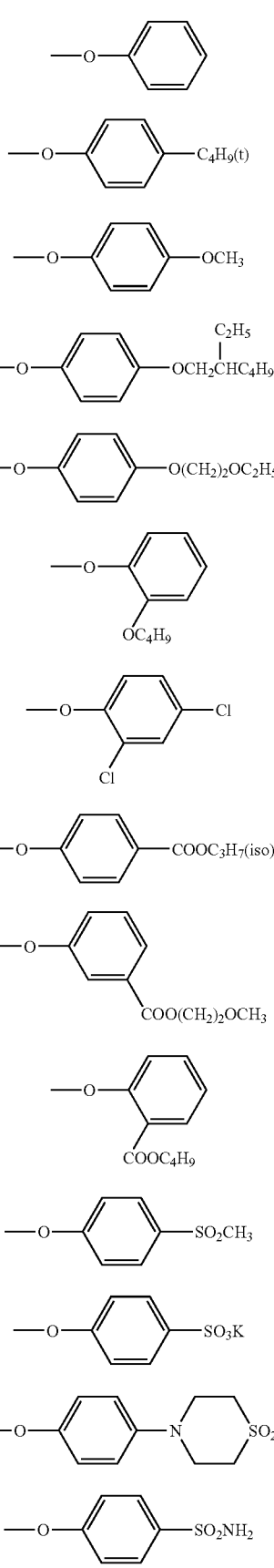

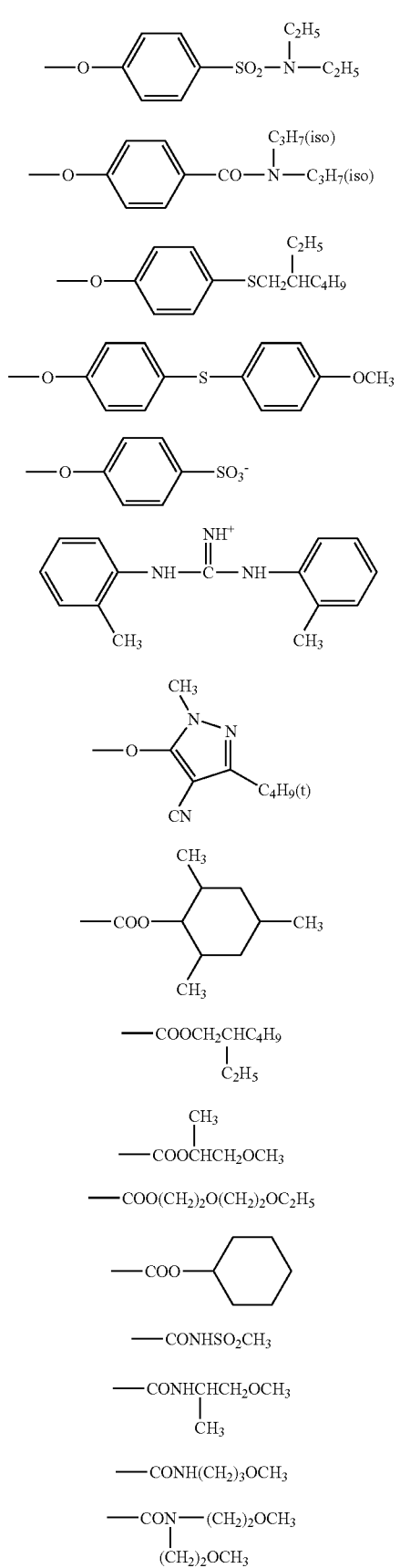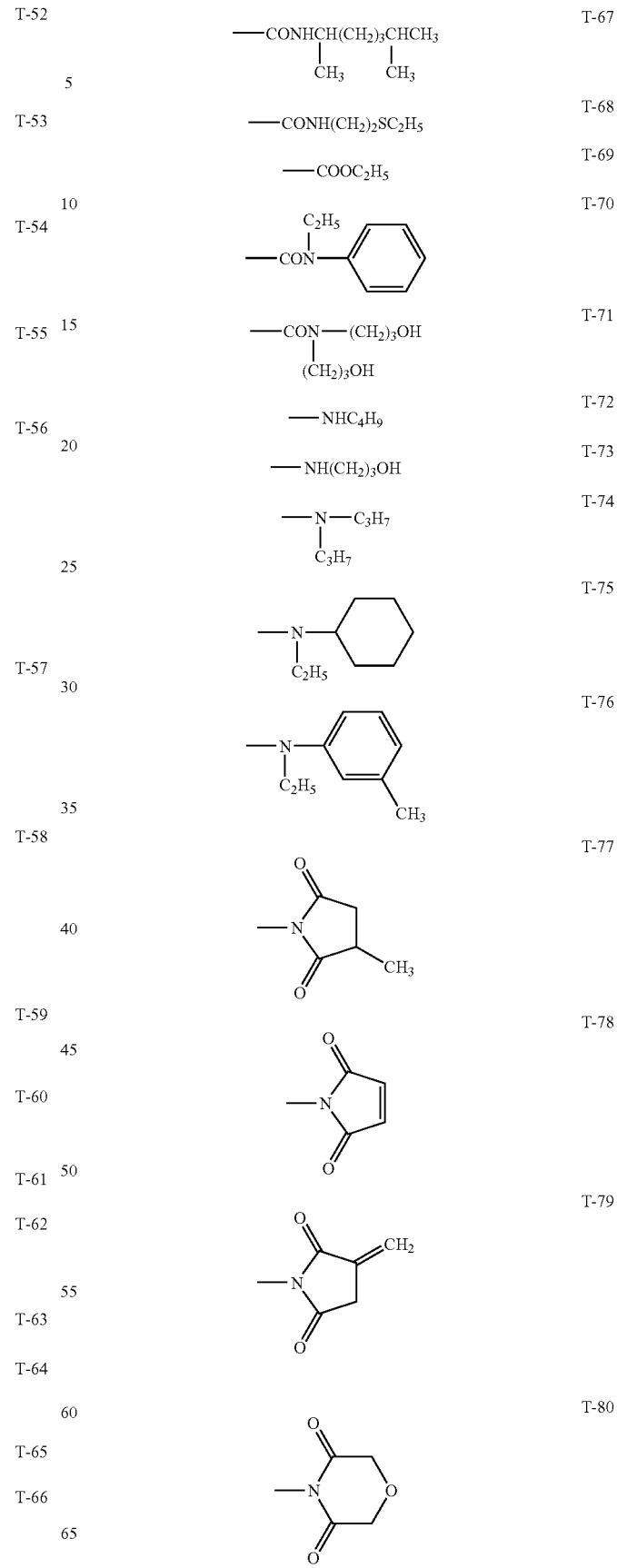

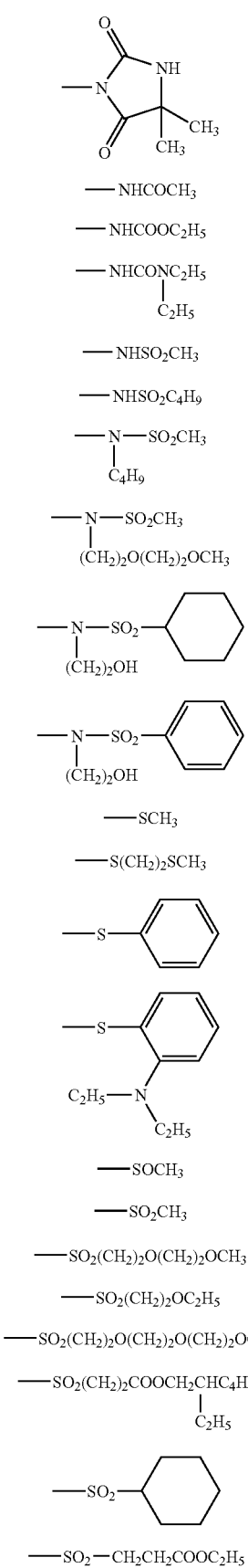

| | |
|---|---|
| | T-81 |
| | T-82 |
| —NHCOCH₃ | T-83 |
| —NHCOOC₂H₅ | T-84 |
| —NHCONC₂H₅ (C₂H₅) | T-85 |
| —NHSO₂CH₃ | T-86 |
| —NHSO₂C₄H₉ | T-87 |
| —N—SO₂CH₃ (C₄H₉) | T-88 |
| —N—SO₂CH₃ ((CH₂)₂O(CH₂)₂OCH₃) | T-89 |
| —N—SO₂—cyclohexyl ((CH₂)₂OH) | T-90 |
| —N—SO₂—phenyl ((CH₂)₂OH) | T-91 |
| —SCH₃ | T-92 |
| —S(CH₂)₂SCH₃ | T-93 |
| —S—phenyl | T-94 |
| —S—(2-N(C₂H₅)₂-phenyl) | T-95 |
| —SOCH₃ | T-96 |
| —SO₂CH₃ | T-97 |
| —SO₂(CH₂)₂O(CH₂)₂OCH₃ | T-98 |
| —SO₂(CH₂)₂OC₂H₅ | T-99 |
| —SO₂(CH₂)₂O(CH₂)₂O(CH₂)₂OCH₃ | T-100 |
| —SO₂(CH₂)₂COOCH₂CH(C₂H₅)C₄H₉ | T-101 |
| —SO₂—cyclohexyl | T-102 |
| —SO₂—CH₂CH₂COOC₂H₅ | |

| | |
|---|---|
| —SO₂CHCOOC₄H₉ (CH₃) | T-103 |
| —SO₂CHCOOCHCH₃ (C₄H₉)(CH₃) | T-104 |
| —SO₂CHCONC₂H₅ (C₄H₉)(C₂H₅) | T-105 |
| —SO₂CH₂CHCH₂OH (OH) | T-106 |
| 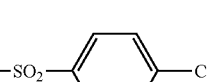 | T-107 |
|  | T-108 |
| 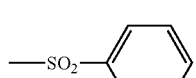 | T-109 |
| 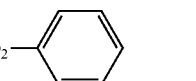 | T-110 |
| 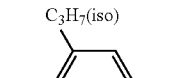 | T-111 |
| 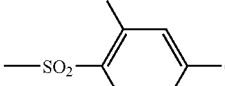 | T-112 |
| 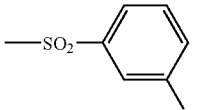 | T-113 |
| 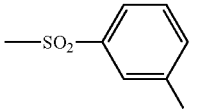 | T-114 |
| 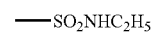 | T-115 |
| —SO₂NHC₂H₅ | T-116 |

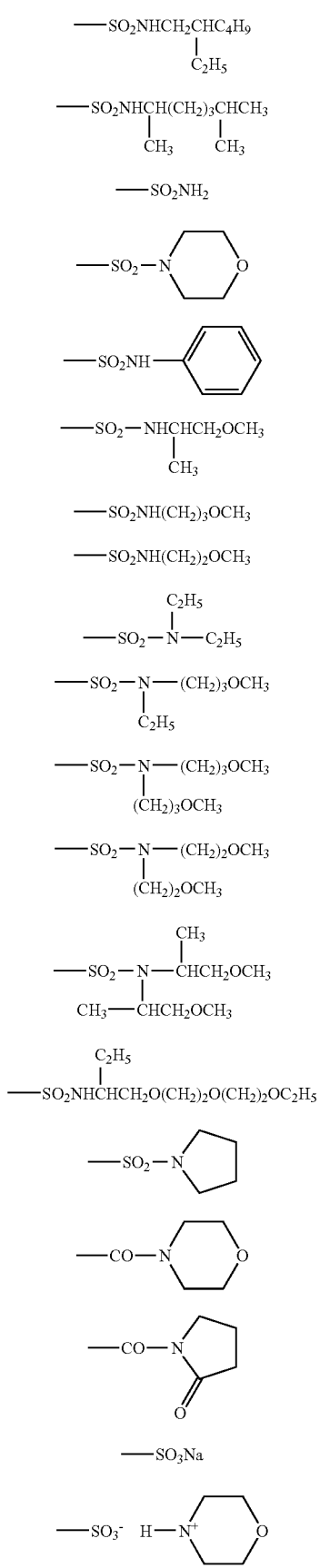

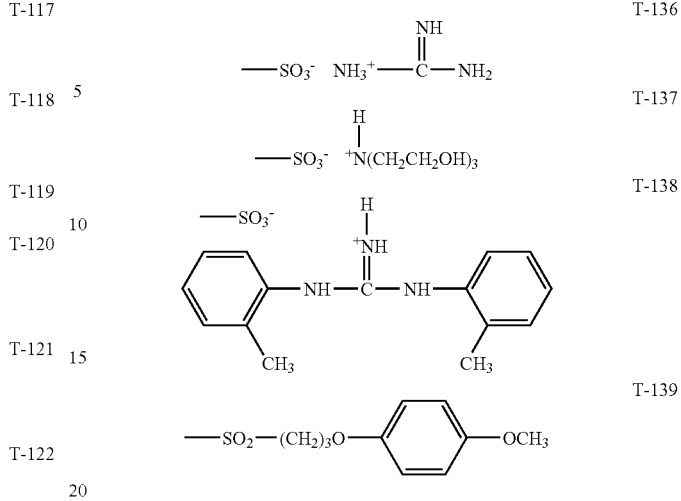

Preferable examples of the phthalocyanine dye represented by Formula (B) are described below.

It is preferable that Formula (B) represents (i) a compound substituted at an α-position (α-substituted compound), in which at least one combination selected from ($R^{101}$ and $R^{104}$), ($R^{105}$ and $R^{108}$), ($R^{109}$ and $R^{112}$) or ($R^{113}$ and $R^{116}$) includes a substituent but none of $R^{102}$, $R^{103}$, $R^{106}$, $R^{107}$, $R^{110}$, $R^{111}$, $R^{114}$, or $R^{115}$ is a substituent, (ii) a compound substituted at a β-position (β-substituted compound), in which at least one combination selected from ($R^{102}$ and $R^{103}$), ($R^{106}$ and $R^{107}$), ($R^{110}$ and $R^{111}$) or ($R^{114}$ and $R^{115}$) includes a substituent but none of $R^{101}$, $R^{104}$, $R^{105}$ $R^{108}$, $R^{109}$, $R^{112}$, $R^{113}$, or $R^{116}$ is a substituent, or (iii) a compound substituted at an α-position and a β-position (αβ-substituted compound), in which at least one combination selected from ($R^{101}$ and $R^{104}$), ($R^{105}$ and $R^{10}$), ($R^{109}$ and $R^{112}$) or ($R^{113}$ and $R^{116}$) includes a substituent and at least one combination selected from ($R^{102}$ and $R^{103}$), ($R^{106}$ and $R^{107}$), ($R^{110}$ and $R^{111}$) or ($R^{114}$ and $R^{115}$) also includes a substituent.

Examples of the substituents represented by $R^{101}$ to $R^{116}$ include a halogen atom, an alkyl group, an alkenyl group, an aryl group, a heterocyclic group, a silyl group, a hydroxyl group, a cyano group, a nitro group, an alkoxy group, an aryloxy group, a heterocyclyloxy group, a silyloxy group, an acyloxy group, an alkoxycarbonyloxy group, an aryloxycarbonyloxy group, a carbamoyloxy group, a sulfamoyloxy group, an alkylsulfonyloxy group, an arylsulfonyloxy group, an acyl group, an alkoxycarbonyl group, an aryloxycarbonyl group, a carbamoyl group, an amino group, an anilino group, a carbonamide group, a ureido group, an imide group, an alkoxycarbonylamino group, an aryloxycarbonylamino group, a sulfonamide group, a sulfamoylamino group, an azo group, an alkylthio group, an arylthio group, a heterocyclylthio group, an alkylsulfinyl group, an arylsulfinyl group, an alkylsulfonyl group, an arylsulfonyl group, a sulfamoyl group, a sulfo group, a phosphonyl group, and a phosphinoylamino group.

Examples of $M^1$ include Zn, Mg, Si, Sn, Rh, Pt, Pd, Mo, Mn, Pb, Cu, Ni, Co, Fe, TiO, and VO.

It is more preferable that Formula (B) represents an α-substituted (mono-substituted) compound in which a substituent or substituents are present only as at least one of ($R^{101}$ or $R^{104}$), ($R^{105}$ or $R^{108}$), ($R^{109}$ or $R^{112}$) or ($R^{113}$ or $R^{116}$), or a β-substituted (mono-substituted) compound in which a substituent or substituents are present only as at least one of ($R^{102}$ or $R^{103}$), ($R^{106}$ or $R^{107}$), ($R^{110}$ or $R^{111}$) or ($R^{114}$ or $R^{115}$).

In this case, preferable examples of the substituents include a halogen atom, an alkyl group, an alkenyl group, an aryl group, a heterocyclic group, a silyl group, a hydroxyl group, a cyano group, a nitro group, an alkoxy group, an aryloxy group, a heterocyclyloxy group, an acyloxy group, a carbamoyloxy group, an acyl group, an alkoxycarbonyl group, an aryloxycarbonyl group, a carbamoyl group, an amino group, an anilino group, a carbonamide group, a ureido group, an imide group, an alkoxycarbonylamino group, an aryloxycarbonylamino group, a sulfonamide group, a sulfamoylamino group, an azo group, an alkylthio group, an arylthio group, a heterocyclylthio group, an alkylsulfinyl group, an arylsulfinyl group, an alkylsulfonyl group, an arylsulfonyl group, a sulfamoyl group, a sulfo group, and a phosphinoylamino group; and preferable examples of $M^1$ include Zn, Pd, Cu, Ni, Co, TiO, and VO.

It is still more preferable that Formula (B) represents an α-substituted compound in which substituents are present only as at least three of ($R^{101}$ or $R^{104}$), ($R^{105}$ or $R^{108}$), ($R^{109}$ or $R^{112}$) or ($R^{113}$ or $R^{116}$), or a β-substituted compound in which substituents are present only as at least three of ($R^{102}$ or $R^{103}$), ($R^{106}$ or $R^{107}$), ($R^{110}$ or $R^{111}$) or ($R^{114}$ or $R^{115}$).

Here, preferable examples of the substituents include a halogen atom, an alkyl group, an alkenyl group, an aryl group, a heterocyclic group, a hydroxyl group, a cyano group, a nitro group, an alkoxy group, an aryloxy group, a heterocyclyloxy group, an acyl group, an alkoxycarbonyl group, a carbamoyl group, an amino group, an anilino group, a carbonamide group, a ureido group, an imide group, an alkoxycarbonylamino group, an aryloxycarbonylamino group, a sulfonamide group, a sulfamoylamino group, an azo group, an alkylsulfinyl group, an arylsulfinyl group, an alkylsulfonyl group, an arylsulfonyl group, a sulfamoyl group, and a sulfo group, and preferable examples of $M^1$ include Zn, Pd, Cu, Ni, Co, and VO.

It is still further preferable that Formula (B) represents an α-substituted compound in which substituents are present only as at least three of ($R^{101}$ or $R^{104}$), ($R^{105}$ or $R^{108}$), ($R^{109}$ or $R^{112}$) or ($R^{113}$ or $R^{116}$) and are the same as one another, or an β-substituted compound in which substituents are present only as at least three of ($R^{102}$ or $R^{103}$), ($R^{106}$ or $R^{107}$), ($R^{110}$ or $R^{111}$) or ($R^{114}$ or $R^{115}$) and are the same as one another.

Preferable examples of the substituents include a halogen atom, an alkyl group, an alkenyl group, an aryl group, a heterocyclic group, a cyano group, an alkoxy group, an aryloxy group, a heterocyclyloxy group, an acyl group, an alkoxycarbonyl group, a carbamoyl group, a carbonamide group, a ureido group, an imide group, a sulfonamide group, an alkylsulfinyl group, an arylsulfinyl group, an alkylsulfonyl group, an arylsulfonyl group, a sulfamoyl group, and a sulfo group, and preferable examples of $M^1$ include Zn, Pd, Cu, Ni, Co, and VO.

It is still further preferable that Formula (B) represents an α-substituted compound in which substituents are present only as at least three of ($R^{101}$ or $R^{104}$), ($R^{105}$ or $R^{108}$), ($R^{109}$ or $R^{112}$) or ($R^{113}$ or $R^{116}$), or an β-substituted compound in which substituents are present only as at least three of ($R^{102}$ or $R^{103}$), ($R^{106}$ or $R^{107}$), ($R^{110}$ or $R^{111}$) or ($R^{114}$ or $R^{115}$), wherein, in each of the α-substituted compound and the β-substituted compound, all the substituents are the same as one another and selected from a halogen atom, an alkyl group, a heterocyclic group, a cyano group, an alkoxy group, an aryloxy group, a heterocyclyloxy group, an alkoxycarbonyl group, a carbamoyl group, an alkylsulfonyl group, an arylsulfonyl group, a sulfamoyl group, or a sulfo group, and examples of $M^1$ include Zn, Pd, Cu, Ni, Co, and VO.

It is most preferable that Formula (B) represents an α-substituted compound in which substituents are present only as at least three of ($R^{101}$ or $R^{104}$), ($R^{105}$ or $R^{108}$), ($R^{109}$ or $R^{112}$) or ($R^{113}$ or $R^{116}$), or an β-substituted compound in which substituents are present only as at least three of ($R^{102}$ or $R^{103}$), ($R^{106}$ or $R^{107}$), ($R^{110}$ or $R^{111}$) or ($R^{114}$ or $R^{115}$), wherein, in each of the α-substituted compound and the β-substituted compound, all the substituents are the same as one another and selected from a halogen atom, an alkyl group, a heterocyclic group, a cyano group, an alkoxy group, an aryloxy group, a heterocyclyloxy group, an alkoxycarbonyl group, a carbamoyl group, an alkylsulfonyl group, an arylsulfonyl group, a sulfamoyl group, or a sulfo group, and examples of $M^1$ include Zn, Cu, Co, and VO.

Hereinafter, specific examples (Exemplary Compounds C-1 to C-88, Cb-1 to Cb-50 and Cc-1 to Cc-4) of the tetraazaporphyrin dye represented by Formula (A) (including the phthalocyanine dye represented by Formula (B)) are shown. However, the invention is not limited thereto.

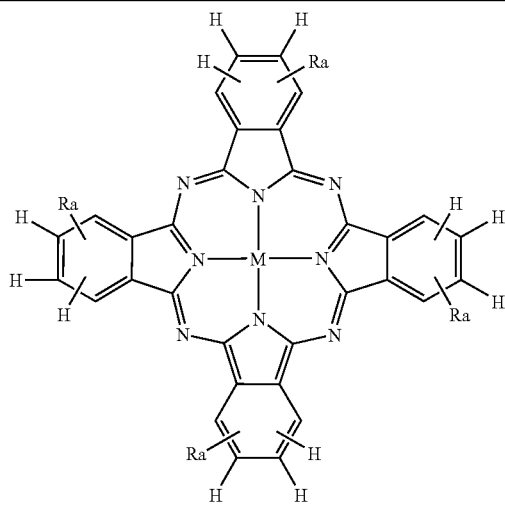

| Compound | Ra | M | Compound | Ra | M |
|---|---|---|---|---|---|
| C-1 | T-97 | Cu | C-2 | T-98 | Cu |
| C-3 | T-99 | Cu | C-4 | T-100 | Cu |
| C-5 | T-104 | Cu | C-6 | T-105 | Cu |

-continued
| | | | | | |
|---|---|---|---|---|---|
| C-7 | T-106 | Cu | C-8 | T-110 | Cu |
| C-9 | T-113 | Cu | C-10 | T-118 | Cu |
| C-11 | T-120 | Cu | C-12 | T-122 | Cu |
| C-13 | T-123 | Cu | C-14 | T-126 | Cu |
| C-15 | T-127 | Cu | C-16 | T-129 | Cu |
| C-17 | T-130 | Cu | C-18 | T-24 | Cu |
| C-19 | T-25 | Cu | C-20 | T-31 | Cu |
| C-21 | T-36 | Cu | C-22 | T-41 | Cu |
| C-23 | T-42 | Cu | C-24 | T-50 | Cu |
| C-25 | T-53 | Cu | C-26 | T-61 | Cu |
| C-27 | T-66 | Cu | C-28 | T-81 | Cu |
| C-29 | T-88 | Cu | C-30 | T-139 | Cu |
| C-31 | T-97 | Zn | C-32 | T-99 | Zn |
| C-33 | T-24 | Zn | C-34 | T-127 | Zn |
| C-35 | T-130 | Zn | C-36 | T-61 | Zn |
| C-37 | T-97 | Co | C-38 | T-99 | Co |
| C-39 | T-24 | Co | C-40 | T-127 | Co |
| C-41 | T-130 | Co | C-42 | T-61 | Co |
| C-43 | T-99 | VO | C-44 | T-24 | VO |
| C-45 | T-127 | VO | C-46 | T-130 | VO |
| C-47 | T-46 | VO | C-48 | T-52 | VO |
| C-49 | T-99 | Pd | C-50 | T-130 | Pd |
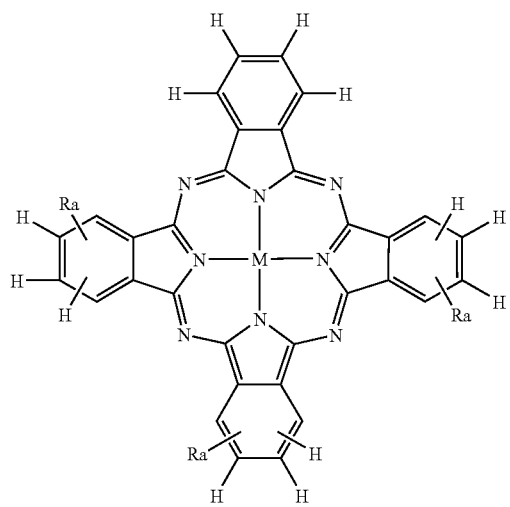
| Compound | Ra | M | Compound | Ra | M |
|---|---|---|---|---|---|
| C-51 | T-97 | Cu | C-52 | T-99 | Cu |
| C-53 | T-100 | Cu | C-54 | T-88 | Cu |
| C-55 | T-61 | Cu | C-56 | T-66 | Cu |
| C-57 | T-53 | Cu | C-58 | T-50 | Cu |
| C-59 | T-25 | Cu | C-60 | T-130 | Cu |
| C-61 | T-100 | Zn | C-62 | T-130 | Zn |
| C-63 | T-99 | Zn | C-64 | T-130 | Co |
| C-65 | T-99 | Co | C-66 | T-130 | VO |
| C-67 | T-99 | VO | C-68 | T-42 | VO |

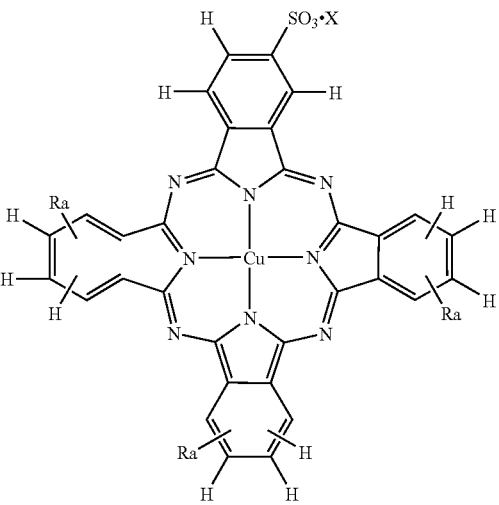

| Compound | Ra | X | Compound | Ra | X |
|---|---|---|---|---|---|
| C-69 | T-26 | Na | C-70 | T-31 | Na |
| C-71 | T-42 | Na | C-72 | T-60 | Na |
| C-73 | T-65 | Na | C-74 | T-88 | Na |
| C-75 | T-92 | Na | C-76 | T-98 | Na |
| C-77 | T-130 | Na | C-78 | T-98 | K |
| C-79 | T-100 | K | C-80 | T-130 | K |
| C-81 | T-123 | morpholinium | C-82 | T-124 | morpholinium |
| C-83 | T 123 | N-methylpyrrolidinium | C-84 | T-123 | N-methylpyrrolidinium |
| C-85 | T-123 | $H-\overset{+}{N}(CH_2CH_2OH)_3$ | C-86 | T-123 | $H-\overset{+}{N}(CH_2CH_2OH)_3$ |
| C-87 | T-123 | $H-\overset{+}{C}(CH_2CH_2OCH_3)$ | C-88 | T-123 | $H-\overset{+}{C}(CH_2CH_2OCH_3)_3$ |

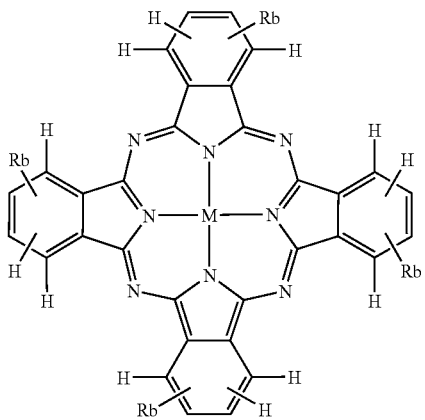

| Compound | Ra | M | Compound | Ra | M |
|---|---|---|---|---|---|
| Cb-1 | T-97 | Cu | Cb-2 | T-98 | Cu |
| Cb-3 | T-99 | Cu | Cb-4 | T-100 | Cu |
| Cb-5 | T-104 | Cu | Cb-6 | T-105 | Cu |
| Cb-7 | T-106 | Cu | Cb-8 | T-110 | Cu |
| Cb-9 | T-113 | Cu | Cb-10 | T-118 | Cu |
| Cb-11 | T-120 | Cu | Cb-12 | T-122 | Cu |
| Cb-13 | T-123 | Cu | Cb-14 | T-126 | Cu |

| | | | | | |
|---|---|---|---|---|---|
| Cb-15 | T-127 | Cu | Cb-16 | T-129 | Cu |
| Cb-17 | T-130 | Cu | Cb-18 | T-24 | Cu |
| Cb-19 | T-25 | Cu | Cb-20 | T-31 | Cu |
| Cb-21 | T-36 | Cu | Cb-22 | T-41 | Cu |
| Cb-23 | T-42 | Cu | Cb-24 | T-50 | Cu |
| Cb-25 | T-53 | Cu | Cb-25 | T-61 | Cu |
| Cb-27 | T-66 | Cu | Cb-28 | T-81 | Cu |
| Cb-29 | T-88 | Cu | Cb-30 | T-139 | Cu |
| Cb-31 | T-97 | Zn | Cb-32 | T-99 | Zn |
| Cb-33 | T-24 | Zn | Cb-34 | T-127 | Zn |
| Cb-35 | T-130 | Zn | Cb-36 | T-61 | Zn |
| Cb-37 | T-97 | Co | Cb-38 | T-99 | Co |
| Cb-39 | T-24 | Co | Cb-40 | T-127 | Co |
| Cb-41 | T-130 | Co | Cb-42 | T-61 | Co |
| Cb-43 | T-99 | VO | Cb-44 | T-24 | VO |
| Cb-45 | T-127 | VO | Cb-46 | T-130 | VO |
| Cb-47 | T-46 | VO | Cb-48 | T-52 | VO |
| Cb-49 | T-99 | Pd | Cb-50 | T-130 | Pd |
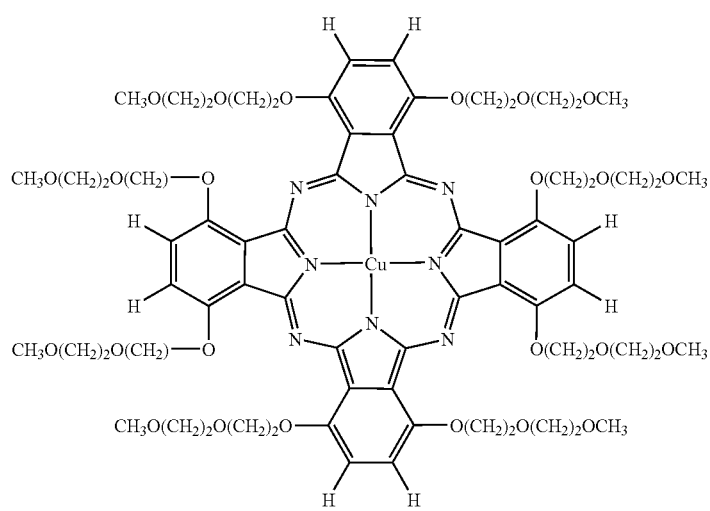
Cc-1
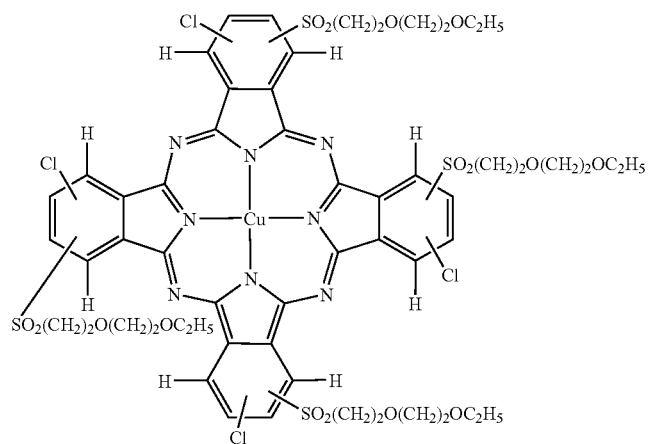
Cc-2

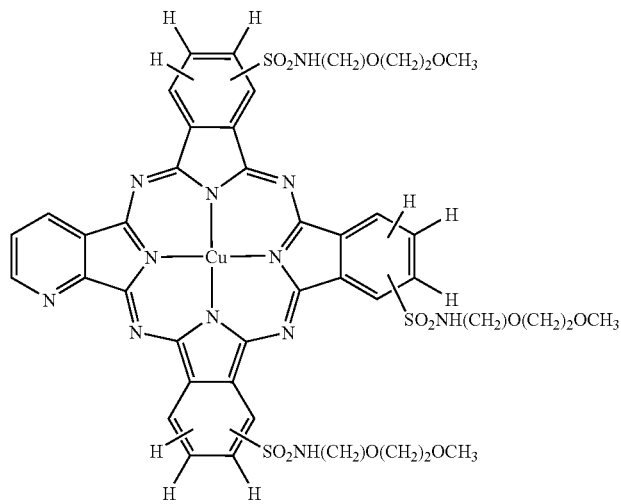

Cc-3

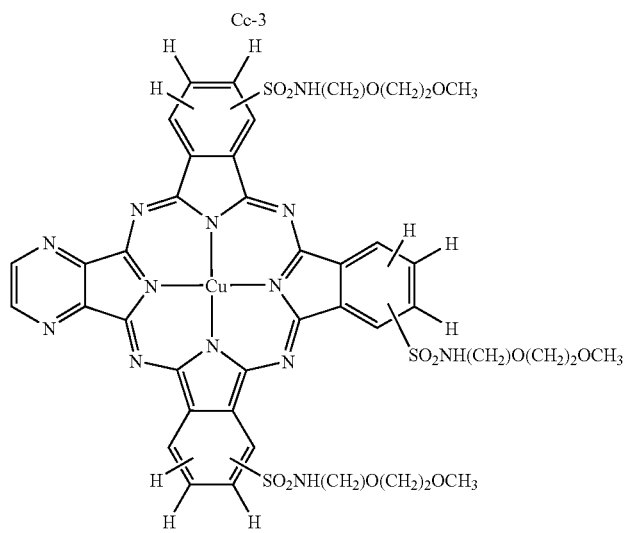

Cc-4

The tetraazaporphyrin dye represented by Formula (A) can be synthesized, for example, with reference to the method described in paragraphs [0107] to [0113] of JP-A No. 2006-58700, which is incorporated herein by reference.

When the dyes are used to form a complementary color system including yellow, magenta and cyan, the dye for each color may be formed of one kind of dye only. When the dyes are used to form a primary color system including red, green and blue, the dye for each color is generally composed of two or more kinds of dyes. In the invention, the dyes may be suitably used to form a mixed system (a mixture) in which at least two kinds of dyes having different absorption characteristics are combined, whereby the hues of a primary color system can be suitably formed.

The content of dye in the colored curable composition varies depending on the kind of dye, but is preferably 40% by mass or more, and more preferably from 40% by mass to 60% by mass, with respect to the total solid content of the colored curable composition.

Polymerizable Monomer

The colored curable composition of the invention contains at least one kind of polymerizable monomer.

The polymerizable monomer is preferably a compound which has at least one addition-polymerizable ethylenic unsaturated group and which has a boiling point of 100° C. or higher at atmospheric pressure. Examples of the compound include a monofunctional acrylate or methacrylate such as polyethylene glycol mono(meth)acrylate, polypropylene glycol mono(meth)acrylate or phenoxyethyl(meth)acrylate; polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol (meth)acrylate, trimethylolpropane tri(acryloyloxypropyl)ether, tri(acryloyloxyethyl)isocyanurate; a compound formed by adding ethyleneoxide or propyleneoxide to a polyfunctional alcohol such as glycerin or trimethylolethane and (meth)acrylating the resultant adduct; urethane acrylates such as those described in JP-B Nos. 48-41708 and 50-6034 and JP-A No. 51-37193; polyester acrylates such as those described in JP-A No. 48-64183 and JP-B Nos. 49-43191 and 52-30490; and polyfunctional acrylates or methacrylates such as epoxy (meth)acrylates formed by reaction of an epoxy resin and (meth)acrylic acid; and mixtures thereof.

Usable monomers are not limited to the above, and radical polymerizable monomers represented by the following Formulae (MO-1) to (MO-5) can be suitably used. In Formulae (MO-1) to (MO-5), when T is an oxyalkylene group, the carbon terminal (rather than the oxygen terminal) of the oxyalkylene group combines with R.

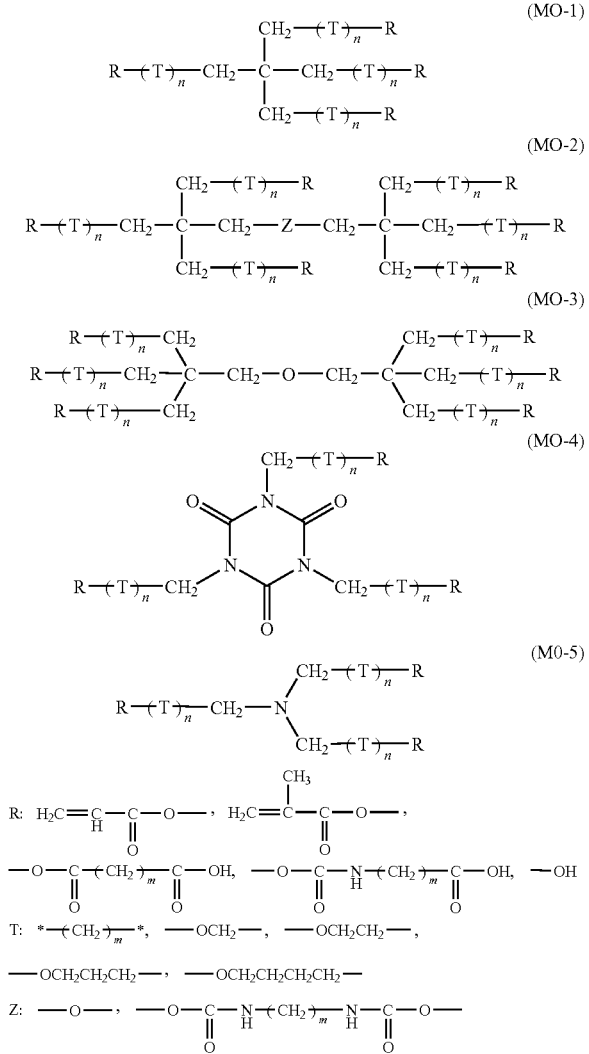

In Formulae (MO-1) to (MO-5), n is an integer of from 0 to 14 and m is an integer of from 1 to 8. Each R present in a molecule may be the same as or mutually different from one another. Each T in a molecule may be the same as or mutually different from one another.

In the colored curable composition of the invention, the polymerizable monomer may be used singly, or in combination of two or more kinds thereof.

The content of the polymerizable monomer in the colored curable composition is preferably from 5% by mass to 90% by mass, more preferably from 10% by mass to 80% by mass, and still more preferably from 15% by mass to 50% by mass, with respect to the total solid content of the colored curable composition. When the content is within the range, sufficient curability and removability of an unexposed area by dissolution can be obtained, as a result of which the removability of an unexposed area by dissolution is prevented from decreasing greatly, while sufficient curability of an exposed area is maintained.

Organic Solvent

The colored curable composition of the invention contains at least one kind of organic solvent. In general, an organic solvent is used during preparation of a colored curable composition. The organic solvent is not specifically limited as long as the solubility of each component or the coatability of a colored curable composition is satisfactory. The organic solvent is preferably selected in consideration of, particularly, the solubility of the dye and the binder component, coatability and safety.

Examples of the organic solvent include:

esters, for example, amyl formate, alkyl esters such as ethyl acetate, n-butyl acetate, isobutyl acetate, isoamyl acetate, or isobutyl acetate, butyl propionate, isopropyl butyrate, ethyl butyrate, butyl butyrate, methyl lactate, ethyl lactate, methyl oxyacetate, ethyl oxyacetate, butyl oxyacetate, methyl methoxyacetate, ethyl methoxyacetate, butyl methoxyacetate, methyl ethoxyacetate, or ethyl ethoxyacetate;

alkyl 3-oxypropionates such as methyl 3-oxypropionate or ethyl 3-oxypropionate, for example, methyl 3-methoxypropionate, ethyl 3-methoxypropionate, methyl 3-ethoxypropionate, or ethyl 3-ethoxypropionate; alkyl 2-oxypropionates such as methyl 2-oxypropionate, ethyl 2-oxypropionate or propyl 2-oxypropionate, for example, methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, or ethyl 2-ethoxy-2-methylpropionate; methyl pyruvate, ethyl pyruvate, propyl pyruvate, methyl acetoacetate, ethyl acetoacetate, methyl 2-oxobutanoate, and ethyl 2-oxobutanoate;

ethers, for example, diethyleneglycol dimethyl ether, tetrahydrofuran, ethyleneglycol monomethyl ether, ethyleneglycol monoethyl ether, methyl cellosolve acetate, ethyl cellosolve acetate, diethyleneglycol monomethyl ether, diethyleneglycol monoethyl ether, diethyleneglycol monobutyl ether, propyleneglycol monomethyl ether, propyleneglycol monomethyl ether acetate, propyleneglycol monoethyl ether acetate, or propyleneglycol monopropyl ether acetate;

ketones, for example, methyl ethyl ketone, cyclohexanone, 2-heptanone, or 3-heptanone; and aromatic hydrocarbons, for example, toluene, or xylene.

The colored curable composition of the invention, constituted using the above components, provides an excellent rectangular pattern at high sensitivity, and is excellent in terms of a high transmittance and a wide development latitude.

Photopolymerization Initiator

It is preferable that the colored curable composition of the invention includes at least one kind of photopolymerization initiator together with a polymerizable monomer. The photopolymerization initiator is not particularly limited as long as the photopolymerization initiator can induce polymerization of radical polymerizable monomers, which will be described below, and the photopolymerization initiator may be preferably selected in consideration of its properties, initiation efficiency, absorption wavelength, availability, cost or the like.

The photopolymerization initiator may be any substance that generate a radical upon irradiation with a radiation such as UV, DUV, visible light, infrared light, or an electron beam, and an oxime-based compound is particularly preferable. As the oxime-based compound, oxime-based initiators described in JP-A No. 2000-80068, WO 02/100903A1, JP-A No. 2001-233842 and the like have been known.

Examples of the oxime-based compound include 2-(O-benzoyloxime)-1-[4-(phenylthio)phenyl]-1,2-butanedione, 2-(O-benzoyloxime)-1-[4-(phenylthio)phenyl]-1,2-pentanedione, 2-(O-benzoyloxime)-1-[4-(phenylthio)phenyl]-1,2-hexanedione, 2-(O-benzoyloxime)-1-[4-(phenylthio)phenyl]-1,2-pentanedione, 2-(O-benzoyloxime)-1-[4-(phenylthio)phenyl]-1,2-octanedione, 2-(O-benzoyloxime)-1-[4-(methylphenylthio)phenyl]-1,2-butanedione, 2-(O-benzoyloxime)-1-[4-(ethylphenylthio)phenyl]-1,2-butanedione, 2-(O-benzoyloxime)-1-[4-(butylphenylthio)phenyl]-1,2-butanedione, 1-(O-acetyloxime)-1-[9-ethyl-6-(2-methylbenzoyl)-9H-carbazole-3-yl]ethanone, 1-(O-acetyloxime)-1-[9-methyl-6-(2-methylbenzoyl)-9H-carbazole-3-yl]ethanone, 1-(O-acetyloxime)-1-[9-propyl-6-(2-methylbenzoyl)-9H-carbazole-3-yl]ethanone, 1-(O-acetyloxime)-1-[9-ethyl-6-(2-ethylbenzoyl)-9H-carbazole-3-yl]ethanone, and 1-(O-acetyloxime)-1-[9-ethyl-6-(2-butylbenzoyl)-9H-carbazole-3-yl]ethanone. However, the invention is not limited thereto.

In particular, it is preferable to use a phenyl-based initiator and a carbazole-based initiator in combination, and it is more preferable to use 2-(O-benzoyloxime)-1-[4-(phenylthio)phenyl]-1,2-octanedione (for example, product manufactured by Ciba Specialty Chemicals), and 1-(O-acetyloxime)-1-[9-ethyl-6-(2-methylbenzoyl)-9H-carbazole-3-yl]ethanone (for example, product manufactured by Ciba Specialty Chemicals) in combination.

The oxime-based compounds represented by following Formulae (p) to (r) may be used. These oxime-based compounds are preferable in view of initiation efficiency and absorption wavelength.

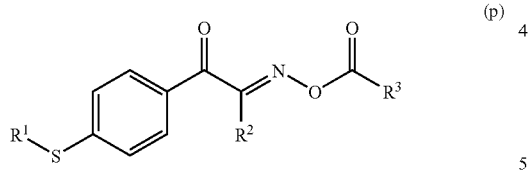

(p)

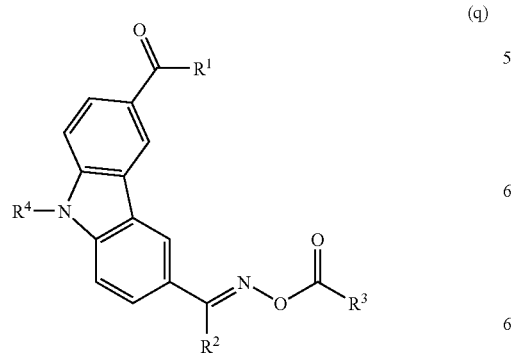

(q)

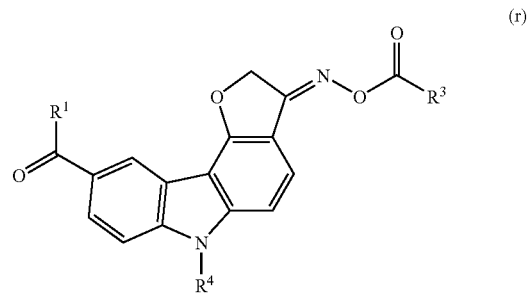

(r)

In Formulae (p) to (r), each $R^1$ independently represents an aromatic group, and $R^2$, $R^3$ and $R^4$ each independently represent an aliphatic group.

$R^1$ preferably represents a phenyl group, $R^2$ preferably represents an alkyl group having 1 to 20 carbon atoms or a cycloalkyl group having 5 to 8 carbon atoms, $R^3$ preferably represents an alkyl group having 1 to 4 carbon atoms, and $R^4$ preferably represents an alkyl group having 1 to 20 carbon atoms.

Among them, in Formula (p), it is more preferable that $R^1$ represents an unsubstituted phenyl group, $R^2$ represents an alkyl group having 1 to 10 carbon atoms or an unsubstituted cycloalkyl group, and $R^3$ represents an alkyl group having 1 to 4 carbon atoms.

Hereinafter, specific examples (compounds 1 to 12) of the compound represented by Formula (p) are shown. However, the invention is not limited thereto.

Compound 1

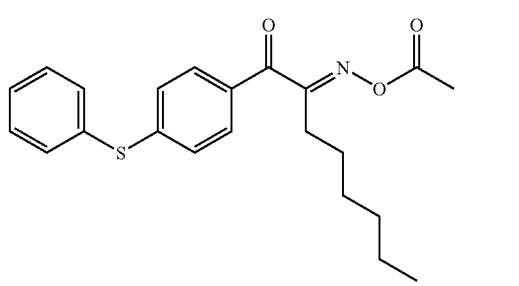

Compound 2

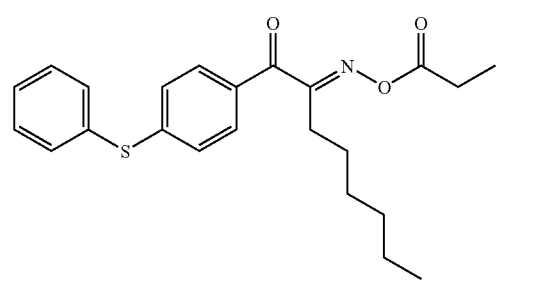

Compound 3

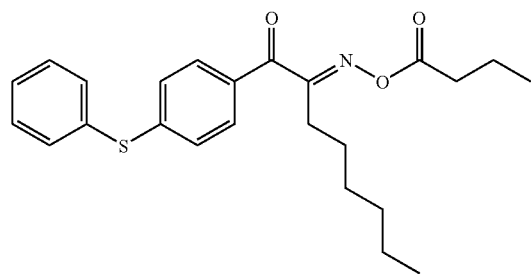

Compound 4

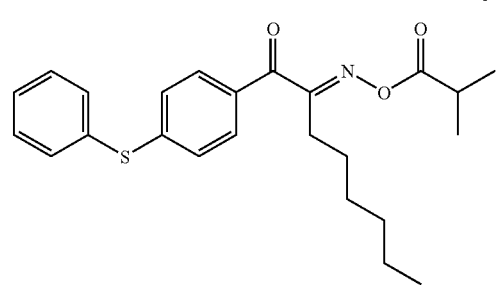

Compound 5

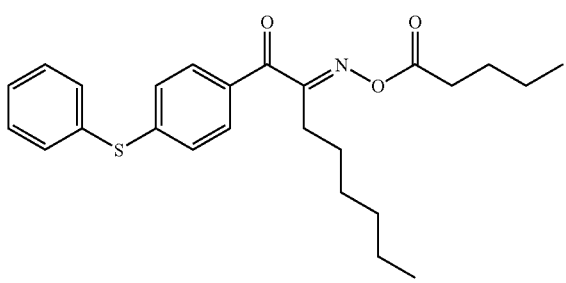

Compound 6

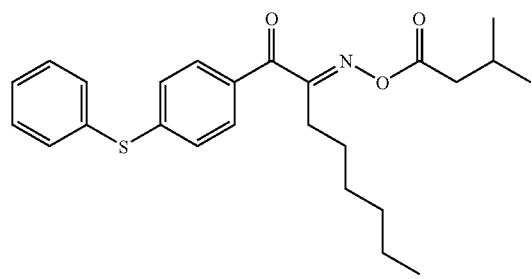

Compound 7

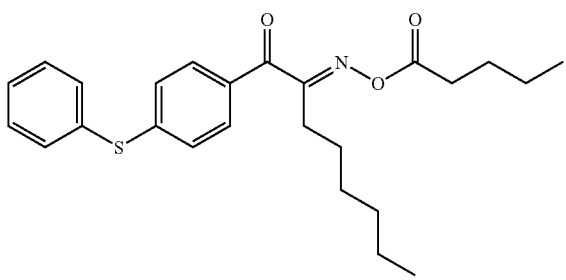

Compound 8

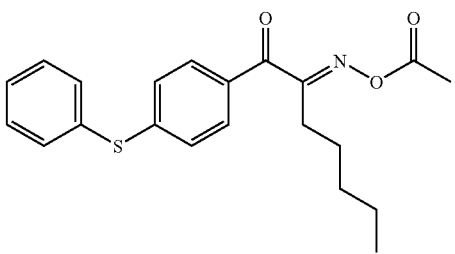

Compound 9

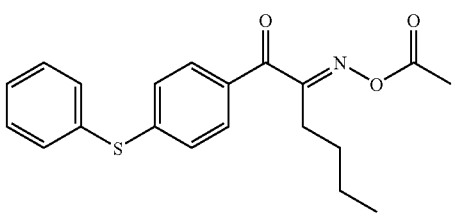

Compound 10

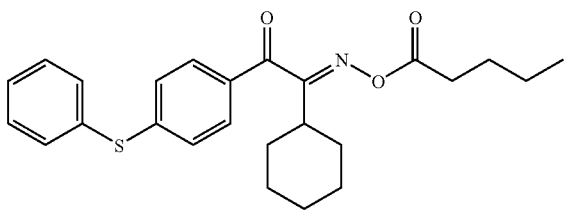

Compound 11

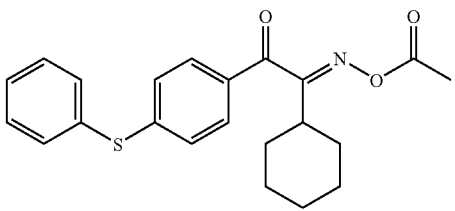

Compound 12

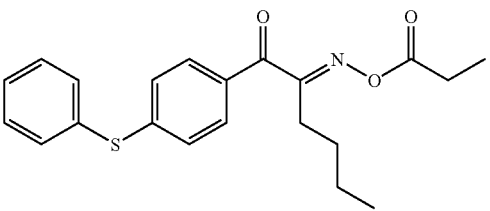

In the present invention, the photopolymerization initiator is not limited to the oxime-based compounds, and photopolymerization initiators other than the oxime-based compounds may be used, such as at least one active halogen compound selected from a halomethyloxadiazole compound or a halomethyl-s-triazine compound; a 3-aryl-substituted coumarin compound; a lophine dimer; a benzophenone compound; an acetophenone compound and derivatives thereof, and a cyclopentadiene-benzene-iron complex and salts thereof.

Further, a vicinal polyketaldonyl compound as described in U.S. Pat. No. 2,367,660, an α-carbonyl compound as described in U.S. Pat. Nos. 2,367,661 and 2,367,670, an acyloin ether as described U.S. Pat. No. 2,448,828, an aromatic acyloin compound substituted with an α-hydrocarbon as described in U.S. Pat. No. 2,722,512, a polynuclear quinone compound as described in U.S. Pat. Nos. 3,046,127 and 2,951,758, a combination of triarylimidazolyl dimer/p-aminophenyl ketone as described in U.S. Pat. No. 3,549,367, and benzothiazole-based compound/trihalomethyl-s-triazine-based compound as described in JP-B No. 51-48516, may be used.

As the active halogen compounds, examples of the halomethyloxadiazole compound include a 2-halomethyl-5-vinyl-1,3,4-oxadiazole compound as described in JP-B No. 57-6096, 2-trichloromethyl-5-styryl-1,3,4-oxadiazole, 2-trichloromethyl-5-(p-cyanostyryl)-1,3,4-oxadiazole, and 2-trichloromethyl-5-(p-methoxystyryl)-1,3,4-oxadiazole.

Examples of the halomethyl-s-triazine-based compound include a vinyl-halomethyl-s-triazine compound as described in JP-B No. 59-1281, and a 2-(naphtho-1-yl)-4,6-bis-halomethyl-s-triazine compound and a 4-(p-aminophenyl)-2,6-dihalomethyl-s-triazine compound as described in JP-A No. 53-133428.

More specifically, examples of the triazine compound include 2,4-bis(trichloromethyl)-6-p-methoxystyryl-s-triazine, 2,6-bis(trichloromethyl)-4-(3,4-methylenedioxyphenyl)-1,3,5-triazine, 2,6-bis(trichloromethyl)-4-(4-methoxyphenyl)-1,3,5-triazine, 2-[4-(2-ethoxyethyl)-naphtho-1-yl]-4,6-bis-trichloromethyl-s-triazine, 2-[4-(2-butoxyethyl)-naphtho-1-yl]-4,6-bis-trichloromethyl-s-triazine, 2-(2-methoxy-naphtho-1-yl)-4,6-bis-trichloromethyl-s-triazine, 2-(6-methoxy-5-methyl-naphtho-2-yl)-4,6-bis-trichloromethyl-s-triazine, 2-(6-methoxy-naphtho-2-yl)-4,6-bis-trichloromethyl-s-triazine, 2-(5-methoxy-naphtho-1-yl)-4,6-bis-trichloromethyl-s-triazine, 4-[p-N-(p-methoxyphenyl)carbonylaminophenyl]-2,6-di(trichloromethyl)-s-triazine, 4-[m-N,N-di(ethoxycarbonylmethyl)aminophenyl]-2,6-di(trichloromethyl)-s-triazine, 4-[m-bromo-p-N,N-di(ethoxycarbonylmethyl)aminophenyl]-2,6-di(trichloromethyl)-s-triazine, 4-[o-fluoro-p-N,N-di(ethoxycarbonylmethyl)aminophenyl]-2,6-di(trichloromethyl)-s-triazine, 4-[o-bromo-p-N,N-di(chloroethyl)aminophenyl]-2,6-di(trichloromethyl)-s-triazine, 4-[o-chloro-p-N,N-di(chloroethyl)aminophenyl]-2,6-di(trichloromethyl)-s-triazine, 4-(o-fluoro-p-N-ethoxycarbonylmethylaminophenyl)-2,6-di(trichloromethyl)-s-triazine, 4-(m-bromo-p-N-chloroethylaminophenyl)-2,6-di(trichloromethyl)-s-triazine, and 4-(m-chloro-p-N-chloroethylaminophenyl)-2,6-di(trichloromethyl)-s-triazine.

In addition, examples of the photopolymerization initiator include TAZ series (for example, TAZ-107, TAZ-110, TAZ-104, TAZ-109, TAZ-140, TAZ-204, TAZ-113, or TAZ-123) manufactured by Midori Kagaku Co., Ltd.; T-series (for example, T-OMS, T-BMP, T-R, or T-B) manufactured by Panchim Ltd., IRGACURE series (for example, IRGACURE 651, IRGACURE 184, IRGACURE 500, IRGACURE 1000, IRGACURE 149, IRGACURE 819 or IRGACURE 261), and DAROCURE series (for example, DAROCURE 1173) manufactured by Ciba Specialty Chemicals; 4,4'-bis(diethylamino)-benzophenone, 2-benzyl-2-dimethylamino-4-morpholinobutyrophenone, 2,2-dimethoxy-2-phenylacetophenone, 2-(o-chlorophenyl)-4,5-diphenylimidazolyl dimer, 2-(o-fluorophenyl)-4,5-diphenylimidazolyl dimer, 2-(o-methoxyphenyl)-4,5-diphenylimidazolyl dimer, 2-(p-methoxyphenyl)-4,5-diphenylimidazolyl dimer, 2-(p-dimethoxyphenyl)-4,5-diphenylimidazolyl dimer, 2-(2,4-dimethoxyphenyl)-4,5-diphenylimidazolyl dimer, 2-(p-methylmercaptophenyl)-4,5-diphenylimidazolyl dimer, and benzoin isopropyl ether.

The photopolymerization initiator may be used singly, or in combination of two or more kinds thereof.

Further, the content of photopolymerization initiator in the colored curable composition is preferably from 1% by mass to 50% by mass, more preferably from 5% by mass to 40% by mass, and still more preferably from 10% by mass to 30% by mass, with respect to the total solid content of the colored curable composition. When the content of photopolymerization initiator is less than 1% by mass, the polymerization does not readily proceed. When the content of photopolymerization initiator exceeds 50% by mass, although the polymerization rate increases, the molecular weight of the resultant polymer tends to decrease, which may result in decrease in the film strength.

The photopolymerization initiator may be used together with a sensitizer, a light stabilizer or a thermal-polymerization inhibitor.

Examples thereof include benzoin, benzoin methyl ether, 9-fluorenone, 9-anthrone, 2-bromo-9-anthrone, 2-ethyl-9-anthrone, 9,10-anthraquinone, xanthone, 2-methylxanthone, 2-methoxyxanthone, acridone, 10-butyl-2-chloroacridone, benzil, dibenzalacetone, p-(dimethylamino)phenylstyrylketone, p-(dimethylamino)phenyl-p-methylstyrylketone, benzophenone, p-(dimethylamino)benzophenone (or Michler's ketone), and benzanthrone, and a benzothiazole compound as described in JP-B No. 51-48516, and TINUVIN 1130 and TINUVIN 400 (trade names, manufactured by NAGASE & co., Ltd.). Examples of the thermal-polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and 2-mercaptobenzoimidazole.

Surfactant

It is preferable that the colored curable composition of the invention contains at least one kind of surfactant. As the surfactant, any of cationic, anionic, nonionic or amphoteric surfactant may be used.

In the invention, in particular, one kind of, or two or more kinds of, surfactant selected from fluorine-based surfactants and/or silicone surfactants may be preferably used. The surfactant may be used singly, or in combination of two or more kinds thereof.

Examples of the surfactant include a surfactant containing a polymer having a fluoroaliphatic group; and fluorine-based surfactants and silicone-based surfactants such as MEGAFACE F-178, F-470, F-473, F-475, F-476 and F-472 (trade names, manufactured by DIC Corporation); EFTOP EF301 and EF303 (trade names, manufactured by Mitsubishi Materials Electronic Chemicals Co., Ltd); FLUORADE FC430 and 431 (trade names, manufactured by Sumitomo 3M Ltd.); MEGAFACE F171, F173, F176, F189 and R08 (trade names, manufactured by DIC Corporation); SURFLON S-382, SC 101, 102, 103, 104, 105 and 106 (trade names, manufactured by Asahi Glass Co., Ltd.); and TROYSOL S-366 (trade name, manufactured by Troy Chemical Industries, Inc.). Further, as a silicone-based surfactant, polysiloxane polymer KP-341 (trade name, manufactured by Shin-Etsu Chemical Co., Ltd.) may be used. Furthermore, examples of the surfactant include a copolymer of (meth)acrylate having a $C_6F_{13}$ group and poly(oxyalkylene) (meth)acrylate; a copolymer of (meth)acrylate having a $C_6F_{13}$ group, poly(oxyethylene) (meth)acrylate, and poly(oxypropylene) (meth)acrylate; a copolymer of (meth)acrylate having a $C_8F_{17}$ group and poly(oxyalkylene) (meth)acrylate; and a copolymer of (meth)acrylate having a $C_8F_{17}$ group, poly(oxyethylene) (meth)acrylate, and poly(oxypropylene) (meth)acrylate.

The content of the surfactant in the colored curable composition is preferably from 0.0001% by mass to 2% by mass, and more preferably from 0.001% by mass to 1% by mass, with respect to the total solid content of the colored curable composition (excluding solvent).

Alkali-Soluble Binder

In the colored curable composition of the invention, at least one kind of alkali-soluble binder may be contained. The film physical property may be improved by containing a binder in the colored curable composition.

The alkali-soluble binder is preferably a linear organic macromolecular polymer, which is soluble in an organic solvent and developable with an aqueous alkali solution. Examples of the linear organic macromolecular polymer include a polymer having carboxylic acid at a side-chain thereof, for example, a methacrylic acid copolymer, an acrylic acid copolymer, an itaconic acid copolymer, a crotonic acid copolymer, a maleic acid copolymer, and a partially-esterified maleic acid copolymer, such as those described in JP-A No. 59-44615, JP-B Nos. 54-34327, 58-12577 and 54-25957, JP-A Nos. 59-53836 and 59-71048; among them, an acidic cellulose derivative having a carboxylic acid at a side-chain thereof is useful.

The binder is not limited to those mentioned above, and a polymer formed by addition of an acid anhydride to a polymer having a hydroxyl group, a polyhydroxystyrene-based resin, a polysiloxane-based resin, a poly(2-hydroxyethyl (meth) acrylate), polyvinyl pyrrolidone, polyethylene oxide, polyvinyl alcohol and the like are also useful.

The binder may be formed from monomers including a monomer having a hydrophilic group as a copolymerization component, and examples of the monomer include an alkoxyalkyl (meth)acrylate, a hydroxyalkyl (meth)acrylate, glycerol (meth)acrylate, (meth)acrylamide, N-methylolacrylamide, a secondary or tertiary alkyl acrylamide, a dialkylaminoalkyl (meth)acrylate, morpholino (meth)acrylate, N-vinylpyrrolidone, N-vinylcaprolactam, vinylimidazole, vinyltriazole, methyl (meth)acrylate, ethyl (meth)acrylate, branched or linear propyl (meth)acrylate, branched or linear butyl (meth) acrylate, and phenoxyhydroxypropyl (meth)acrylate.

Further examples of the monomer having a hydrophilic group include monomers containing a tetrahydrofurfuryl group, phosphoric acid, a phosphoric ester, a quaternary ammonium salt, an ethyleneoxy chain, a propyleneoxy chain, sulfonic acid, a salt of sulfonic acid, or a morpholinoethyl group.

The alkali-soluble binder preferably includes, as an acid group, a structural unit represented by the following Formula (a).

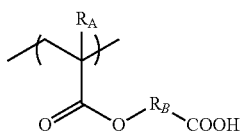

Formula (a)

In Formula (a), $R_A$ represents a hydrogen atom or an alkyl group having 1 to 6 carbon atoms, and $R_B$ represents a divalent linking group. $R_A$ preferably represents a hydrogen atom or a methyl group.

$R_B$ is not limited as long as $R_B$ is a divalent linking group, and examples of $R^B$ include an alkylene group having 1 to 12 carbon atoms which may be substituted or unsubstituted, —U—$R_C$—V— (wherein U and V each independently represent a single bond or an alkylene group having 1 to 3 carbon atoms, and $R_C$ represents a cyclohexyl ring, a benzene ring, or a naphthalene ring, each of which may be substituted or unsubstituted), and -$R_D$-X-$R_E$- (wherein $R_D$ and $R_E$ each independently represent an alkylene group having 1 to 10 carbon atoms which may be substituted or unsubstituted, or a benzene ring or a naphthalene ring, each of which may be substituted or unsubstituted, and X represents an ester bond, an amide bond, a urethane bond, an ether bond, a thioether bond, a carbonate bond, a urea bond, or an imide bond). $R_B$ is preferably a divalent linking group having 1 to 6 carbon atoms.

The acid value of the alkali-soluble binder is preferably from 5 mgKOH/g to 70 mgKOH/g, more preferably from 7 mgKOH/g to 50 mgKOH/g, and still more preferably from 10 mgKOH/g to 45 mgKOH/g. When the acid value is 70 mgKOH/g or less, detachment of the pattern during development can be suppressed, and when the acid value is 5 mgKOH/g or more, sufficient alkali developability can be achieved.

Further, the alkali-soluble binder may have a polymerizable double bond group (ethylenic unsaturated group) in a molecule. In particular, a binder including a structural unit represented by the following Formula (b) is preferable.

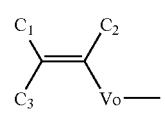

Formula (b)

In Formula (b), $V_0$ represents —COO—, —OCO—, —CH$_2$OCO—, —CH$_2$COO—, —O—, —SO$_2$—, —CO—, —CONHCOO—, —CONHCONH—, —CONHSO$_2$—, —CON(X$^3$)—, —SO$_2$N(X$^3$)—, or —C$_6$H$_4$—; X$^3$ represents a hydrogen atom or a hydrocarbon group; $c_1$, $c_2$ and $c_3$ each independently represent a hydrogen atom, a halogen atom, a cyano group, a hydrocarbon group, —COOZ', or —R—COOZ' (wherein R represents a divalent hydrocarbon group); $c_1$, $c_2$ and $c_3$ may be the same as or mutually different from one another; Z' represents a hydrogen atom or a hydrocarbon group which may be substituted or unsubstituted.

Specific examples of a monomer which forms a structural unit represented by Formula (b) are shown below.

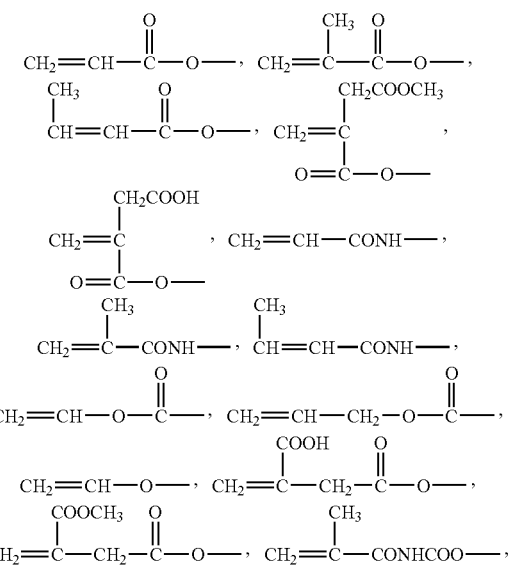

-continued

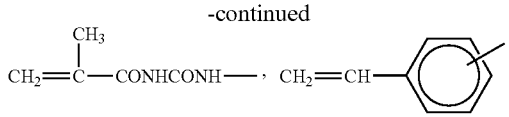

The alkali-soluble binder may include a structural unit represented by any of the following Formulae (1) to (3).

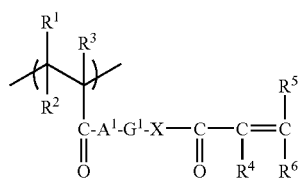

Formula (1)

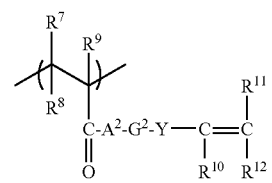

Formula (2)

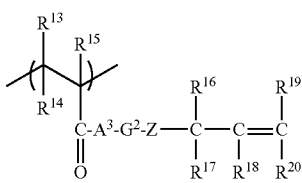

Formula (3)

In Formulae (1) to (3), $A^1$, $A^2$ and $A^3$ each independently represent an oxygen atom, a sulfur atom or —N($R^{21}$)—, wherein $R^{21}$ represents an alkyl group which may have a substituent. $G^1$, $G^2$ and $G^3$ each independently represent a divalent organic group. X and Z each independently represent an oxygen atom, a sulfur atom or —N($R^{22}$)—, wherein $R^{22}$ represents an alkyl group which may have a substituent. Y represents an oxygen atom, a sulfur atom, a phenylene group which may have a substituent, or —N($R^{23}$)—, wherein $R^{23}$ represents an alkyl group which may have a substituent. $R^1$ to $R^{20}$ each independently represent a hydrogen atom or a monovalent substituent.

In Formula (1), $R^1$ to $R^3$ each independently represent a monovalent substituent, and examples thereof include a hydrogen atom and an alkyl group which may have a substituent. $R^1$ and $R^2$ each preferably represent a hydrogen atom, and $R^3$ preferably represents a hydrogen atom or a methyl group.

$R^4$ to $R^6$ each independently represent a hydrogen atom or a monovalent substituent. $R^4$ may represent a hydrogen atom or an alkyl group which may have a substituent, and preferably represent a hydrogen atom, a methyl group, or an ethyl group. $R^5$ and $R^6$ each independently represent a hydrogen atom, a halogen atom, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylsulfonyl group which may have a substituent or an arylsulfonyl group which may have a substituent, and $R^5$ and $R^6$ each independently represent preferably a hydrogen atom, an alkoxycarbonyl group, an alkyl group which may have a substituent, and an aryl group which may have a substituent.

Here, examples of the substituent in "... which may have a substituent" described above include a methoxycarbonyl group, an ethoxycarbonyl group, an isopropyloxycarbonyl group, a methyl group, an ethyl group, and a phenyl group.

$A^1$ represents an oxygen atom, a sulfur atom or —N($R^{21}$)—, and X represents an oxygen atom, a sulfur atom or —N($R^{22}$)—, wherein $R^{21}$ and $R^{22}$ each independently represent an alkyl group which may have a substituent.

$G^1$ represents a divalent organic group, and preferably represents an alkylene group which may have a substituent. It is more preferable that $G^1$ represents an alkylene group having 1 to 20 carbon atoms which may have a substituent, a cycloalkylene group having 3 to 20 carbon atoms which may have a substituent, or an aromatic group having 6 to 20 carbon atoms which may have a substituent. Among these, a linear or branched alkylene group having 1 to 10 carbon atoms which may have a substituent, a cycloalkylene group having 3 to 10 carbon atoms which may have a substituent, and an aromatic group having 6 to 12 carbon atoms which may have a substituent are preferable, in consideration of properties such as film strength and developability.

Preferable examples of the substituent in $G^1$ include a hydroxyl group or a substituent other than a substituent (for example, an amino group, a thiol group, or a carboxyl group, but excluding a hydroxyl group) having a heteroatom to which a hydrogen atom is bonded.

In the structural unit represented by Formula (1), it is preferable that $A^1$ represents an oxygen atom, a sulfur atom, or —N($R^{21}$)—, X represents an oxygen atom, a sulfur atom, or —N($R^{22}$)—, $G^1$ represents an alkylene group which may have a substituent, $R^1$ and $R^2$ each represent a hydrogen atom, $R^3$ represents a hydrogen atom or a methyl group, $R^4$ represents a hydrogen atom or an alkyl group, $R^5$ and $R^6$ each independently represent a hydrogen atom, an alkoxycarbonyl group, an alkyl group, or an aryl group, and $R^{21}$ and $R^{22}$ each represent an alkyl group.

In Formula (2), $R^7$ to $R^9$ each independently represent a hydrogen atom or a monovalent substituent, and preferably represent a hydrogen atom or an alkyl group which may further have a substituent. It is preferable that $R^7$ and $R^8$ each represent a hydrogen atom, and $R^9$ represents a hydrogen atom or a methyl group.

$R^{10}$ to $R^{12}$ each independently represent a hydrogen atom or a monovalent substituent. Specific examples of the substituent include a halogen atom, a dialkylamino group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylsulfonyl group which may have a substituent, and an arylsulfonyl group which may have a substituent. Among them, a hydrogen atom, an alkoxycarbonyl group, an alkyl group which may have a substituent, and an aryl group which may have a substituent are preferable.

Here, examples of the substituent in "... which may have a substituent" include those mentioned above in the description of Formula (1).

A represents an oxygen atom, a sulfur atom, or —N($R^{21}$)—, wherein $R^{21}$ represents a hydrogen atom or an alkyl group which may have a substituent.

$G^2$ represents a divalent organic group, and preferably represents an alkylene group which may have a substituent. Preferable examples of the organic group include an alkylene group having 1 to 20 carbon atoms which may have a substituent, a cycloalkylene group having 3 to 20 carbon atoms which may have a substituent, and an aromatic group having 6 to 20 carbon atoms which may have a substituent. Among them, a linear or a branched alkylene group having 1 to 10 carbon atoms which may have a substituent, a cycloalkylene group having 3 to 10 carbon atoms which may have a substituent, and an aromatic group having 6 to 12 carbon atoms which may have a substituent are preferable, in consideration of properties such as film strength and developability.

Preferable examples of the substituent in $G^2$ include a hydroxyl group or a substituent other than a substituent (for example, an amino group, a thiol group, or a carboxyl group, but excluding a hydroxyl group) having a heteroatom to which a hydrogen atom is bonded.

If $G^2$ has a substituent (excluding a hydroxyl group) having a heteroatom to which a hydrogen atom is bonded, the preservation stability of a curable composition may be deteriorated when used with an onium salt compound as an initiator (described above).

Y represents an oxygen atom, a sulfur atom, —N($R^{23}$)—, or a phenylene group which may have a substituent. Preferable examples of $R^{23}$ include a hydrogen atom and an alkyl group which may have a substituent.

In the structural unit represented by Formula (2), it is preferable that $R^{10}$ represents a hydrogen atom or an alkyl group, $R^{11}$ and $R^{12}$ each independently represent a hydrogen atom, an alkoxycarbonyl group, an alkyl group, or an aryl group, $R^7$ and $R^8$ each represent a hydrogen atoms, $R^9$ represents a hydrogen atom or a methyl group, $A^2$ represents an oxygen atom, a sulfur atom, or —N($R^{21}$)—, $G^2$ represents a linear or branched alkylene group having 1 to 10 carbon atoms which may have a substituent, or a cycloalkylene group having 3 to 10 carbon atoms which may have a substituent, an aromatic group having 6 to 12 carbon atoms which may have a substituent, Y represents an oxygen atom, a sulfur atom, —N($R^{23}$)—, or a phenylene group which may have a substituent, and $R^{21}$ and $R^{23}$ each independently represent a hydrogen atom or an alkyl group which may have a substituent.

In Formula (3), $R^{13}$ to $R^{15}$ each independently represent a hydrogen atom or a monovalent substituent, and preferably represent a hydrogen atom or an alkyl group which may have a substituent. It is preferable that $R^{13}$ and $R^{14}$ each represent a hydrogen atom and $R^{15}$ represents a hydrogen atom or a methyl group.

$R^{16}$ to $R^{20}$ each independently represent a monovalent substituent, and examples of $R^{16}$ to $R^{20}$ include a hydrogen atom, a halogen atom, a dialkylamino group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylsulfonyl group which may have a substituent, and an arylsulfonyl group which may have a substituent. Among them, a hydrogen atom, an alkoxycarbonyl group, an alkyl group which may have a substituent, and an aryl group which may have a substituent are preferable. Here, examples of the substituent in " . . . which may have a substituent" include those mentioned above in the description of Formula (1).

$A^3$ represents an oxygen atom, a sulfur atom, or —N($R^{21}$)—, and Z represents an oxygen atom, a sulfur atom, or —N($R^{22}$)—. The groups represented by $R^{21}$ and $R^{22}$ may be selected from those mentioned above as the groups represented by $R^{21}$ and $R^{22}$ in the description of Formula (1).

$G^3$ represents a divalent organic group, and preferably represents an alkylene group which may have a substituent. Preferable examples of the organic group include an alkylene group having 1 to 20 carbon atoms which may have a substituent, a cycloalkylene group having 3 to 20 carbon atoms which may have a substituent, and an aromatic group having 6 to 20 carbon atoms which may have a substituent. Among them, a linear or a branched alkylene group having 1 to 10 carbon atoms which may have a substituent, a cycloalkylene group having 3 to 10 carbon atoms which may have a substituent, and an aromatic group having 6 to 12 carbon atoms which may have a substituent are preferable, in consideration of properties such as the film strength and developability.

Here, preferable examples of the substituent in $G^3$ include a hydroxyl group or a substituent other than a substituent (for example, an amino group, a thiol group, or a carboxyl group, but excluding a hydroxyl group) having a heteroatom to which a hydrogen atom is bonded.

In the structural unit represented by Formula (3), it is preferable that $R^{13}$ and $R^{14}$ each represent a hydrogen atom, $R^{15}$ represents a hydrogen atom or a methyl group, $R^{16}$ to $R^{20}$ each independently represent a hydrogen atom, an alkoxycarbonyl group, an alkyl group which may have a substituent, or an aryl group which may have a substituent, $A^3$ represents an oxygen atom, a sulfur atom, or —N($R^{21}$)—, Z represents an oxygen atom, a sulfur atom or —N($R^{22}$)—, $R^{21}$ and $R^{22}$ each independently represent an alkyl group, and $G^3$ represents a linear or branched alkylene group having 1 to 10 carbon atoms which may have a substituent, a cycloalkylene group having 3 to 10 carbon atoms which may have a substituent, or an aromatic group having 6 to 12 carbon atoms which may have a substituent.

Specific examples of the alkaline-soluble binder include polymer compounds 1 to 15 shown below. The invention is not limited thereto.

| Polymer Compound | | Acid value [mgKOH/g] | MW |
|---|---|---|---|
| 1 | | 54 | 85000 |

-continued

| | Polymer Compound | Acid value [mgKOH/g] | MW |
|---|---|---|---|
| 2 | (structures) | 49 | 36000 |
| 3 | (structures) | 34 | 62000 |
| 4 | (structures) | 44 | 30000 |
| 5 | (structures) | 43 | 31000 |

-continued

| Polymer Compound | Acid value [mgKOH/g] | MW |
|---|---|---|
| 6 | 31 | 23000 |
| 7 | 40 | 100000 |
| 8 | 36 | 63000 |
| 9 | 42 | 55000 |
| 10 | 16 | 36000 |

-continued
| Polymer Compound | Acid value [mgKOH/g] | MW |
|---|---|---|
| 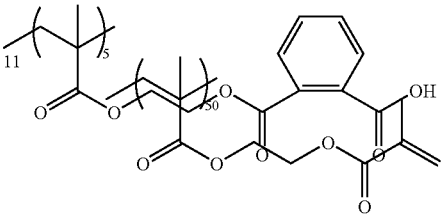 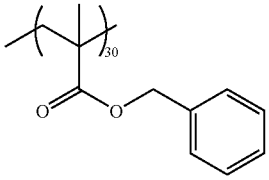 | 30 | 22000 |
| 12 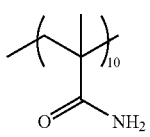 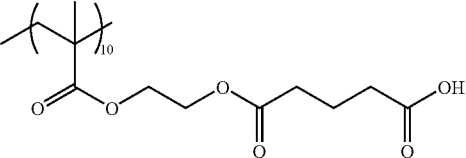 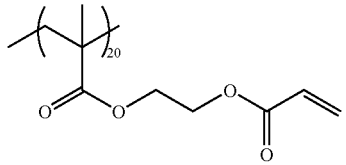 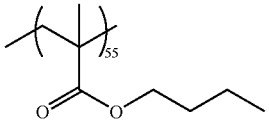 | 47 | 28000 |
| 13 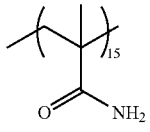 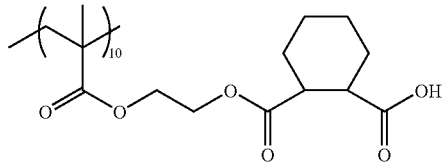 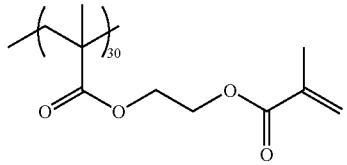 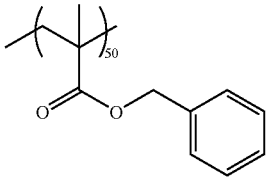 | 16 | 53000 |
| 14 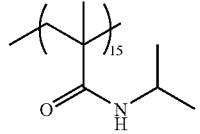 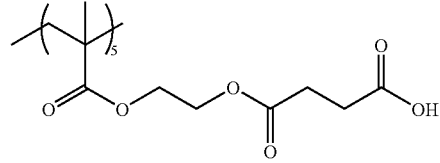 | 32 | 33000 |

-continued

| Polymer Compound | Acid value [mgKOH/g] | MW |
|---|---|---|
| 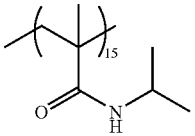 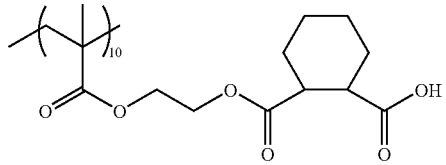 | | |
| 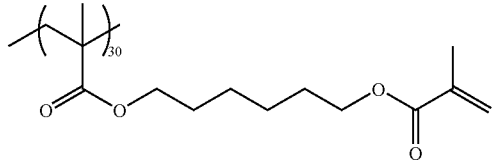 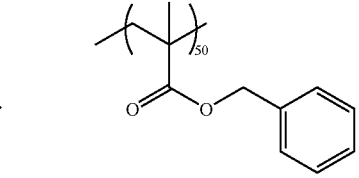 | 15 | 30000 |
| 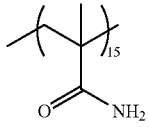 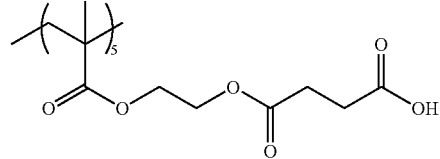 | | |

MW: molecular weight

The proportion of the "structural unit having a polymerizable double bond" to the total mass of the alkali-soluble binder is preferably 10% by mass or more, more preferably 20% by mass or more, and still more preferably 30% by mass or more. When the ratio is 10% by mass or more, the pattern profile of a pixel shows an excellent rectangular shape. The quantity of double bonds in the alkali-soluble binder is preferably from 1 mmol/g to 5 mmol/g, more preferably from 1 mmol/g to 4.5 mmol/g, and still more preferably from 1.5 mmol/g to 4.0 mmol/g, in terms of millimoles per 1 g of resin.

Further, the alkali-soluble binder may have a structural unit represented by any of the following Formulae (4) to (6).

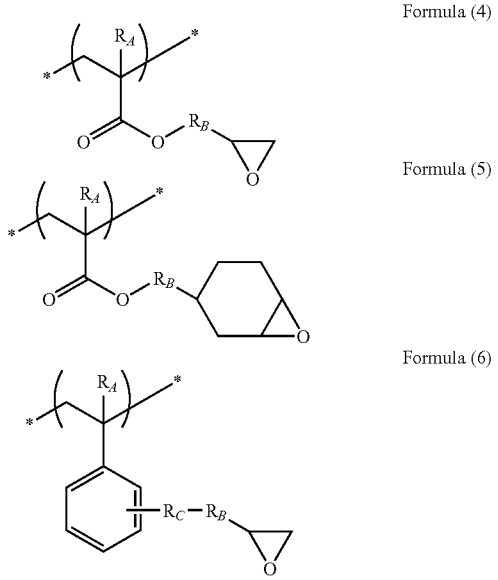

Formula (4)

Formula (5)

Formula (6)

In Formulae (4) to (6), each $R_A$ independently represent a hydrogen atom or an aliphatic group, and preferably represent a hydrogen atom or a methyl group; each $R_B$ independently represent an alkyl group having 1 to 5 carbon atoms; $R_C$ represents an alkylene group or an alkoxylene group, and preferably represents —$CH_2O$— group or —$CH_2$— group.

The epoxy equivalent in the alkali-soluble binder may be from 100 g/mol to 600 g/mol, and is preferably from 150 g/mol to 550 g/mol.

Further, as the alkali-soluble binder, an alkali-soluble phenol resin may be used. The alkali-soluble phenol resin is preferable when a colored curable composition is used as a positive composition.

Examples of the alkali-soluble phenol resin include a novolak resin and a vinyl polymer. Examples of the novolak resin include a resin obtained by condensing a phenolic compound and an aldehyde in the presence of an acid catalyst. Examples of the phenolic compound include phenol, cresol, ethylphenol, butylphenol, xylenol, phenylphenol, catechol, resorcinol, pyrogallol, naphthol, and bisphenol A. Examples of the aldehyde include formaldehyde, paraformaldehyde, acetaldehyde, propionaldehyde and benzaldehyde.

The phenolic compound may be used singly, or in combination of two or more kinds of thereof. The aldehyde may be used singly, or in combination of two or more kinds of thereof.

The weight average molecular weight of the alkali-soluble binder is preferably in the range of from 1,000 to $2\times10^5$, more preferably from 2,000 to $1\times10^5$, and still more preferably from 5,000 to $5\times10^4$ (in terms of polystyrene-converted value measured by a GPC method).

The colored curable composition of the invention does not necessarily contains the alkali-soluble binder, and the content of the alkali-soluble binder is preferably from 0% by mass to 90% by mass, more preferably from 0% by mass to 60% by mass, and still more preferably from 0% by mass to 30% by mass, with respect to the total solid content of the colored curable composition.

Other Components

In addition to the above components, the colored curable composition of the invention may further include a crosslinking agent and/or various other additives.

Crosslinking Agent

In the invention, a crosslinking agent can be used supplementarily to obtain a highly cured film. In this case, the colored curable composition may contain at least one kind of crosslinking agent selected from those described below.

The crosslinking agent is not specifically restricted as long as the crosslinking agent can cure the film by a curing reaction. Examples of the crosslinking agent include (a) an epoxy resin, (b) a melamine compound, a guanamine compound, a glycoluryl compound, or a urea compound, each of which is substituted with at least one group selected from a methylol group, an alkoxymethyl group, or an acyloxymethyl group, and (c) a phenolic compound, a naphthol compound, or a hydroxyanthracene compound, each of which is substituted with at least one group selected from a methylol group, an alkoxymethyl group, or an acyloxymethyl group. Among them, a polyfunctional epoxy resin is preferable.

Other Various Additives

The colored curable composition of the invention may further contain various additives, for example, a filler, an adhesion promoter, an antioxidant, an ultraviolet absorber, or an anti-aggregation agent, if needed.

Examples of the various additives include a filler such as glass or alumina; polymer compounds other than binder resins (examples of the polymer compounds including polyvinyl alcohol, polyacrylic acid, polyethylene glycol monoalkyl ether, and polyfluoroalkyl acrylate); adhesion promoters such as vinyl trimethoxy silane, vinyl triethoxy silane, vinyl tris(2-methoxyethoxy)silane, N-(2-aminoethyl)-3-aminopropylmethyl dimethoxy silane, N-(2-aminoethyl)-3-amino propyl trimethoxy silane, 3-aminopropyl triethoxy silane, 3-glycidoxypropyl trimethoxy silane, 3-glycidoxypropylmethyl dimethoxy silane, 2-(3,4-epoxycyclohexyl)ethyl trimethoxy silane, 3-chloropropylmethyl dimethoxy silane, 3-chloropropyl trimethoxy silane, 3-methacryloxy propyl trimethoxy silane or 3-mercaptopropyl trimethoxy silane; antioxidants such as 2,2-thiobis(4-methyl-6-t-butylphenol) or 2,6-di-t-butylphenol; ultraviolet absorbers such as 2-(3-t-butyl-5-methyl-2-hydroxyphenyl)-5-chlorobenzotriazole, or alkoxy benzophenone; anti-aggregation agents such as sodium polyacrylate.

In order to facilitate the alkali solubility of a radiation uncured area (non-image area), and in order to further improve the developability of the colored curable composition, an organic carboxylic acid, preferably a low-molecular-weight organic carboxylic acid having a molecular weight of 1,000 or less, may be added to the colored curable composition.

Examples of the low-molecular-weight organic carboxylic acid include aliphatic monocarboxylic acids such as formic acid, acetic acid, propionic acid, butyric acid, valeric acid, pivalic acid, caproic acid, diethyl acetic acid, enanthic acid or caprylic acid; aliphatic dicarboxylic acids such as oxalic acid, malonic acid, succinic acid, glutaric acid, adipic acid, pimelic acid, suberic acid, azelaic acid, sebacic acid, brassilic acid, methylmalonic acid, ethylmalonic acid, dimethylmalonic acid, methylsuccinic acid, tetramethylsuccinic acid, or citraconic acid; aliphatic tricarboxylic acids such as tricarballylic acid, aconitic acid or camphoronic acid; aromatic monocarboxylic acids such as benzoic acid, toluic acid, cuminic acid, hemellitic acid or mesitylene acid; aromatic polycarboxylic acids such as phthalic acid, isophthalic acid, terephthalic acid, trimellitic acid, trimesic acid, mellophanic acid or pyromellitic acid; and other carboxylic acids such as phenylacetic acid, hydratropic acid, hydrocinnamic acid, mandelic acid, phenylsuccinic acid, atropic acid, cinnamic acid, methyl cinnamate, benzyl cinnamate, cinnamylidene acetic acid, coumalic acid or umbellic acid.

(b) Transparent Protective Film Forming Process

In a transparent protective film forming process of the invention, a transparent protective film is formed on the colored pattern which has been formed by the above colored pattern forming process.

In the invention, "transparent" means that the ratio of light transmitted through a film to light incident on one side of the film is 90% or more (quantity of transmitted light/quantity of incident light×100(%)), with respect to light in the visible light wavelength range (400 nm to 700 nm).

For example, in a color filter used for a liquid crystal display (LCD), a solid-state image sensor (CCD or the like), an electroluminescence device (ELD), or the like, a layer which is called a protective film is arranged on a colored pattern, such as a colored pattern of R (red), G (green) and B (blue), for the purpose of smoothing out irregularities on the substrate or protecting the colored pattern.

The protective film is desired to have one or more of the following properties: the protective film is highly adhesive to the substrate or a layer on which the protective film is formed; the protective layer is highly adhesive to a layer which is formed on the protective film; the protective film itself is flat, strong; the protective layer is transparent; the protective layer is highly resistant to heat and light; the protective layer is not susceptible to deterioration over long periods of time such as coloration, yellowing or cloudiness; and the protective layer has excellent resistance to water, solvents, acids and alkalis. As a material for forming a protective film which can achieve such characteristics, a thermosetting composition containing a polymer having a glycidyl group, for example, as described in JP-A Nos. 5-78453 and 2001-91732 has been known.

Further, when such a protective film is used as a protective film for a color filter used for a color liquid crystal display device or a charge-coupled device, in particular, it is required that the protective film smoothes out any unevenness with respect to a color filter formed on a base substrate.

For the formation of the protective film, it is preferable to use a transparent curable composition with which a protective film having excellent transparency and hardness is formed using a simple method. As the transparent curable composition, a composition containing a photopolymerization initiator, a polymerizable unsaturated compound and an organic solvent may be used, and the composition preferably further contains a polymer. This transparent curable composition may further contain at least one of a thermal acid generating agent or a curing agent, if needed.

The polymerizable unsaturated compound and the organic solvent may be selected from the above-described polymerizable monomers and organic solvents usable for the colored curable composition. As the polymer, a polymer containing a double bond or a polymer containing an epoxy group (also referred to as an epoxy group-containing polymer) may be used.

Examples of the polymer containing a double bond include the specific examples of the alkali-soluble binder (polymer compounds 1 to 15) described above.

The epoxy group-containing polymer may be, for example, any polymer containing a structural unit derived from an epoxy group-containing monomer. Examples of the epoxy group-containing monomer include a monofunctional epoxy group-containing monomer such as methyl glycidyl ether, butyl glycidyl ether, phenyl glycidyl ether, butylphenyl glycidyl ether, 2-ethylhexyl glycidyl ether, decyl glycidyl ether, stearyl glycidyl ether, allyl glycidyl ether, polypropylene glycol glycidyl ether or butoxypolyethylene glycol monoglycidyl ether; a bifunctional epoxy group-containing monomer such as polypropylene glycol diglycidyl ether, neopentyl glycol diglycidyl ether, polyethylene glycol diglycidyl ether, 2,3-diglycidyloxy styrene, 3,4-diglycidyloxy styrene, 2,4-diglycidyloxy styrene, 3,5-diglycidyloxy styrene, 2,6-diglycidyloxy styrene, 5-vinyl pyrogallol triglycidyl ether, 4-vinyl pyrogallol triglycidyl ether, vinyl phloroglucinol triglycidyl ether, 2,3-dihydroxy methylstyrene diglycidyl ether, 3,4-dihydroxy methylstyrene diglycidyl ether, 2,4-dihydroxy methylstyrene diglycidyl ether, 3,5-dihydroxy methylstyrene diglycidyl ether or 2,6-dihydroxy methylstyrene diglycidyl ether; trimethylol propane triglycidyl ether, 2,3,4-trihydroxy methylstyrene triglycidyl ether and 1,3,5-trihydroxy methylstyrene triglycidyl ether.

Among them, the transparent curable composition is preferably a composition that contains a polymerizable monomer and a polymer containing a double bond, in consideration of the hardness, heat resistance and solvent resistance.

Preparation of Transparent Curable Composition

When the transparent curable composition is prepared, components for constituting the composition may be directly added into the same mixture, or, alternatively, the respective components may be dissolved in two or more different solvents, which are then sequentially added to form a composition. When performing the compounding, the order in which the components are compounded, and condition of operation are not particularly limited. For example, the composition may be formed by simultaneously dissolving all the components in a solvent. In another example, in accordance with the necessity, the components are dissolved in two or more different solutions appropriately, and the obtained solutions are mixed at the time of use (at the time of coating).

The transparent curable composition prepared as above may be filtered before use, using a filter such as the MILLIPORE (trademark) Filter with, preferably using a pore size of from 0.01 µm to 3.0 µm, and more preferably from 0.05 µm to 0.5 µm.

Formation of Transparent Protective Film

Next, a method of forming a transparent protective film using the transparent curable composition is explained.

The transparent curable composition is coated on a substrate, on which the colored pattern has been formed in the colored pattern forming process, and then the coated film formed by the coating is dried. A pre-heating (prebaking) is further performed, if needed.

As the coating method, for example, a method such as a spray coating method, a roll coating method, a rotation coating method, a bar coating method or an ink-jet method may be used alone or two or more kinds of methods may be used in combination. Among them, coating using a spin coater, a spinless coater or a slit-die coater is preferable.

The prebaking condition after coating and drying the transparent curable composition is preferably at about 70° C. to about 130° C. for about 1 min to about 15 min, although the condition may be changed depending on the kind and/or compounding ratio of each component.

The thickness of the coated film after being coated and dried is preferably from 0.15 µm to 8.5 µm, more preferably from 0.15 µm to 6.5 µm, and still more preferably from 0.15 µm to 4.5 µm. Here, the thickness of the coated film refers to a thickness after solvent is removed.

(c) Light Irradiation Treatment Process

The light irradiation treatment process of the invention is a process of irradiating at least the transparent protective film with light after forming the transparent protective film by the transparent protective film formation process.

Examples of the light or the radiation used for the light irradiation treatment include visible light, ultraviolet rays, far ultraviolet rays, electron beam, or X-rays. More specifically, the light irradiation may be conducted by using a UV irradiation apparatus manufactured by Ushio Inc. (for example, UMA-802-HC552FFAL), or by an i-line irradiation apparatus manufactured by Canon Inc. (for example, FPA-3000i5+).

In particular, it is preferable to conduct the light irradiation treatment using light having a wavelength of 365 nm, 405 nm or 436 nm (for example, the i-line, the h-line, or the g-line) in consideration of the transparency of the transparent protective film. The light irradiation treatment is preferably conducted with a ultraviolet radiation having a wavelength of 300 nm or less, or a light including the ultraviolet radiation having a wavelength of 300 nm or less (for example, radiation from a high-pressure mercury lamp), in order to promote curing.

Furthermore, the temperature may be adjusted to a relatively low temperature (for example, 40° C. or less) simultaneously with the light irradiation.

The light exposure condition at the time of light irradiation treatment is preferably from 100 mJ/cm$^2$ to 10,000 mJ/cm$^2$ at 35° C., when the thickness of the transparent protective film is 0.6 µm.

The method and conditions of light irradiation treatment may be suitably selected in accordance with the composition, film thickness and the like. It is preferable that the light irradiation treatment is conducted such that the reaction rate (monomer reaction rate) of the polymerizable group in the polymerizable unsaturated compound in the transparent protective film formed from the transparent curable composition is 50% or more, and more preferably 70% or more. When the monomer reaction rate is 50% or more or, more preferably, 70% or more, exuding of the dye can be effectively prevented, even if the transparent protective film is subjected to a heat treatment at a temperature exceeding 200° C. (for example the post-baking treatment) later.

The monomer reaction rate can be determined by an IR (infrared absorption) spectrometry.

Other Processes

The method of producing a color filter according to the invention may further include other processes in addition to the above processes.

For example, a post-heating (post-baking) treatment may be performed at the same time as, or after, the light irradiation treatment, if needed, so that the film can further be cured.

The post-baking treatment may be carried out by an appropriate heating apparatus such as a hot plate or a clean oven. The temperature of the post-baking treatment is preferably from about 150° C. to about 250° C., and the treatment time is preferably from 5 minutes to 30 minutes when a hot plate is used, and is preferably from 30 minutes to 90 minutes when an oven is used. Even when the transparent protective film is subjected to such a heat treatment, dyes are not exuded from the colored pattern arranged at a lower side of the transparent protective film, whereby a color filter can be prepared which is excellent in color purity (namely, color hue), contrast, and which has improved color vividness and definition (sharpness) of an image.

When the post-heating treatment is performed, it is preferable that the light irradiation treatment is performed in advance, and thereafter the post-heating is performed.

The method of producing a color filter of the invention may preferably be used for producing color filters used for a liquid crystal display device (LCD), or a solid-state image sensor (for example, CCD, or CMOS). In particular, the method of the invention is preferably used for the production of the color filter used for a solid-state image sensor such as a CCD or CMOS.

It is more preferable that the method of producing a color filter of the invention of is used for forming a color filter used for a solid-state image sensor which requires the formation of a colored pattern with minute size in a thin layer, and with a good rectangular cross-sectional profile. When the pixel pattern size (the side length of a pixel pattern viewed from the normal line of a substrate) for forming a color filter is 2 μm or less (for example, from 0.5 μm to 2.0 μm), a quantity of colorant increases, line width sensitivity decreases depending on the hue, and a DOF margin narrows, thereby impairing pattern formability. This tendency becomes particularly noticeable when the pixel pattern size is from 1.0 μm to 1.7 μm (and even more noticeable when from 1.2 μm to 1.5 μm). Moreover, when the thickness of the color filter is 1 μm or less, the quantity of components other than colorants in the film, which contribute to the photolithographic characteristics, is relatively decreased, and the quantity of components other than colorants is further decreased with an increase in the quantity of the colorants, whereby sensitivity decreases, and the pattern in a lower exposure area may be easily detached. In this case, when the pattern is subjected to a heat treatment such as the post-baking, the dye may be easily exuded. These tendencies are particularly noticeable when the film thickness is from 0.005 μm to 0.9 μm (and even more noticeable when from 0.1 μm to 0.7 μm).

Solid-State Image Sensor

The solid-state image sensor of the invention is provided with a color filter formed by the method of producing a color filter according to the invention. Since the solid-state image sensor of the invention is provided with the color filter having a pattern with high color purity and resolution, and in which color mixing is suppressed, excellent color reproducibility can be achieved.

The structure of the solid-state image sensor is not specifically limited, as long as the solid-state image sensor has the color filter of the invention and functions as a solid-state image sensor, and for example, the following constitutions may be exemplified.

A solid-state image sensor includes: a substrate, and plural photodiodes that form light-receiving areas for a CCD image sensor (solid-state image sensor) and transfer electrodes formed of polysilicon or the like on the substrate; a light-shielding film provided on the photodiodes and the transfer electrode, the light-shielding film being formed from tungsten or the like and having an opening only at the light-receiving portion for the photodiodes; a device protective film formed from silicon nitride or the like and provided on the light shielding film so as to cover the entire surface of the light shielding film and the light receiving portion of the photodiodes; and the color filter of the invention provided on the device protective film.

Furthermore, the image sensor may have a configuration in which a light condensing element (for example, a micro lens; this example also applies below as appropriate) is arranged on the device protective film and under the color filter (at a side near the substrate), or may have a configuration in which a light condensing element is arranged on the color filter.

According to the invention, there is provided a method of producing a color filter with high color purity and definition in which exuding of the dye and color mixing is prevented.

According to the invention, there is provided a color filter capable of displaying an image with high color purity and definition and a solid-state image sensor using the color filter.

EXAMPLES

Hereafter, the invention will be explained in more detail with reference to examples, but the invention is not limited to the examples unless departing from the gist of the invention. Further, the "part" indicates quantities in terms of mass, unless otherwise specified.

Example 1

(1) Production of Silicon Wafer with Undercoat Layer

A 6-inch silicon wafer was subjected to heat-treatment in an oven at 200° C. for 30 minutes. Subsequently, CT-4000 (trade name, manufactured by Fujifilm Electronics Materials Co., Ltd.) was coated on the silicon wafer so that the dry film thickness was 1 μm, and then the resultant was heated and dried at 200° C. for 5 minutes on a hot plate to form an undercoat layer, whereby a silicon wafer with an undercoat layer was obtained.

(2) Preparation of Colored Curable Composition

The components of the following composition A-1 were mixed and dissolved to prepare a colored curable composition A-1.

| <Composition A-1> | |
|---|---|
| Cyclohexanone | 80 parts |
| Dye A (ma-1 described above; compound represented by Formula (M1)) | 6.16 parts |
| Dye B (Y-1 described above; compound represented by Formula (Y-1)) | 5.84 parts |
| KAYARAD DPHA (trade name, manufactured by Nippon Kayaku Co., Ltd.) (polymerizable monomer) | 4.91 parts |
| Photopolymerization initiator (trade name: CGI-242, manufactured by Ciba Specialty Chemicals; oxime-based initiator) | 2.00 parts |
| Alkaline-soluble binder (polymer compound 1 described above) | 0.48 parts |
| DCMA (dicyclohexylmethylamine) | 0.61 parts |
| Surfactant (trade name: F-781, manufactured by DIC Corporation) | 0.02 parts |

(3) Coating, Exposure and Development of Colored Curable Composition

The colored curable composition A-1 prepared in (2) above was coated on the undercoat layer of the silicon wafer obtained in (1) above, and a photocurable coated film was thereby formed. Subsequently, the coated film was subjected to a heat treatment (prebaking) using a hot plate at 100° C. for 120 s so that the dry film thickness of the coated film was 0.6 μm.

Next, the photocurable coated film was irradiated with light at a wavelength of 365 nm through a Bayer pattern mask with a pattern of 1.2 μm square at exposure amounts of from 100 mJ/cm$^2$ to 2500 mJ/cm$^2$ in increments of 100 mJ/cm$^2$ by using an i-line stepper exposure apparatus FPA-3000i5+ (trade name, manufactured by Canon Inc.). Thereafter, the silicon wafer with the irradiated coated film was mounted on a horizontal rotating table of a spin shower development machine (DW-30; manufactured by Chemitronics Co., Ltd.), and was subjected to a paddle development at 23° C. for 60 s using CD-2000 (trade name, manufactured by Fujifilm Electronics Materials Co., Ltd.). Subsequently, the silicon wafer was subjected to a rinse treatment in which pure water is showered down on the silicon wafer from a spray nozzle from above the center of rotation of the silicon wafer while the silicon wafer was rotated at 50 rpm, and thereafter, the wafer was spray-dried, thereby forming a colored pattern thereon.

(4) Post-Curing Treatment of Colored Pattern

The obtained colored pattern was irradiated with UV light at 350 mW/cm$^2$ at 35° C. for 30 s using a UV irradiation apparatus (trade name: UMA-802-HC552FFAL, manufactured by Ushio Inc.). Thereafter, the colored pattern was heated at 200° C. for 300 s to cure the pattern.

(5) Preparation of Solution of Transparent Curable Composition

A solution of transparent curable composition (CT-1) was prepared by mixing and dissolving the components of the following composition.

| <Composition> | |
|---|---|
| Propyleneglycol monomethylether acetate (PGMEA) | 63.0 parts |
| Ethyl ethoxy propionate (EEP) | 27.0 parts |
| Alkaline-soluble binder (benzyl methacrylate/methacrylic acid (molar ratio = 70:30) copolymer) | 4.88 parts |
| KAYARAD DPHA (manufactured by Nippon Kayaku Co., Ltd.) (polymerizable monomer) | 4.88 parts |
| AD-1 (p-methoxyphenol) (polymerization inhibitor) | 0.0001 parts |
| Fluorosurfactant (trade name: F-475, manufactured by DIC Corporation) | 0.01 parts |
| Photopolymerization initiator (Oxime A: 2-(O-benzoyloxime)-1-[4-(phenylthio)phenyl]-1,2-octadiene; manufactured by Ciba Specialty Chemicals) | 0.23 parts |

(6) Coating of Transparent Curable Composition

The transparent curable composition CT-1 prepared in (5) above was coated on the colored pattern of the silicon wafer prepared in (4) above, and then the silicon wafer was subjected to a heat-treatment (prebaking) at 100° C. for 120 s using a hot plate.

(7) Light Irradiation Treatment of Transparent Curable Composition

The silicon wafer coated with the transparent curable composition CT-1 was irradiated with light including ultraviolet rays having a wavelength of 300 nm or less with an exposure amount of 350 mW/cm$^2$ at 35° C. for 30 s using a UV irradiation apparatus (trade name: UMA-802-HC552FFAL, manufactured by Ushio Inc.). Thereafter, the silicon wafer was subjected to a heat treatment at 200° C. for 300 s to form a transparent film on the colored pattern. In this manner, a colored pattern with a protective film was prepared.

(8) Evaluation
1. Dye Exuding

Exuding of the dye from the obtained colored pattern (Bayer pattern) after heat treatment was evaluated in the following manner.

The 10.0 μm square colored pattern (Bayer pattern) protected by the transparent film was observed from directly above (in the normal line direction of the surface of the silicon wafer) under an optical microscope at 500-fold magnification, and exuding of the dye from the pattern edge to the transparent layer was evaluated in accordance with the following criteria.

<Evaluation Criteria>
A: Exuding of the dye was not observed, or the extent of exuding was less than 1.0 μm from the pattern edge.
B: Exuding of the dye was observed in the range of from 1.0 μm to less than 5.0 m from the pattern edge, but was practically acceptable.
C: Exuding of the dye from the pattern edge was observed in the range of 5.0 μm or more from the pattern edge, and was not practically acceptable.

2. Monomer Reaction Rate

The monomer reaction rate (%) in the transparent film after the light exposure but before the heat-treatment in the process "(7) light irradiation treatment of the transparent curable composition" was calculated based on the absorption intensity at a wavelength of 810 nm in the IR (infrared absorption) spectrum. The results are shown in Table 1.

Example 2

A colored pattern with a protective film was prepared and evaluated in a manner similar to Example 1, except that the process "(7) light irradiation treatment of the transparent curable composition" was changed to the following. The evaluation results are shown in Table 1.

Light Irradiation Treatment of Transparent Curable Composition

The silicon wafer coated with the transparent curable composition was irradiated with ultraviolet rays at a wavelength of 365 nm with an exposure amount of 5000 mJ/cm$^2$ using an i-line stepper exposure apparatus FPA-3000i5+ (trade name, manufactured by Canon Inc.). Thereafter, the silicon wafer was subjected to a heat treatment at 200° C. for 300 s to form a transparent film on a colored pattern.

Examples 3 to 10 and Comparative Examples 1 to 3

In Examples 3 to 10 and Comparative Examples 1 to 3, colored patterns with protective films were prepared and evaluated in a manner similar to Example 1, except that the colored curable composition and the transparent curable composition were changed as shown in Tables 1 to 3 below, and the conditions of the light irradiation treatment of the transparent curable compositions were changed as shown in Table 1. The evaluation results are shown in Table 1.

TABLE 1

| | Colored Curable Composition | Transparent Curable Composition | Light Irradiation Treatment For Transparent Curable Composition | Monomer Reaction Rate (%) | Exuding |
|---|---|---|---|---|---|
| Example 1 | A-1 | CT-1 | UV irradiation and post-heating (200° C., 300 sec.) | 80 | A |
| Example 2 | A-1 | CT-1 | i-line irradiation (5000 mJ) and post-heating (200° C., 300 sec.) | 75 | A |
| Example 3 | A-1 | CT-1 | i-line irradiation (3000 mJ) and post-heating (200° C., 300 sec.) | 51 | B |
| Example 4 | A-2 | CT-1 | UV irradiation and post-heating (200° C., 300 sec.) | 89 | A |
| Example 5 | A-3 | CT-1 | UV irradiation and post-heating (200° C., 300 sec.) | 82 | A |
| Example 6 | A-4 | CT-1 | UV irradiation and post-heating (200° C., 300 sec.) | 78 | A |
| Example 7 | A-1 | CT-2 | UV irradiation and post-heating (200° C., 300 sec.) | 73 | A |

TABLE 1-continued

| | Colored Curable Composition | Transparent Curable Composition | Light Irradiation Treatment For Transparent Curable Composition | Monomer Reaction Rate (%) | Exuding |
|---|---|---|---|---|---|
| Example 8 | A-2 | CT-2 | UV irradiation and post-heating (200° C., 300 sec.) | 75 | A |
| Example 9 | A-2 | CT-3 | i-line irradiation (500 mJ) and post-heating (220° C., 180 sec.) | 52 | B |
| Example 10 | A-2 | CT-3 | UV irradiation and post-heating (200° C., 300 sec.) | 82 | A |
| Comparative Example 1 | A-1 | CT-1 | Post-heating (150° C., 300 sec.) | 5 | C |
| Comparative Example 2 | A-1 | CT-1 | Post-heating (200° C., 300 sec.) | 13 | C |
| Comparative Example 3 | A-1 | CT-1 | Post-heating (230° C., 300 sec.) | 31 | C |

TABLE 2

Colored Curable Composition

| | Organic Solvent | Dye | Polymerizable Monomer | Alkaline-soluble Binder | Photo-polymerization Initiator | Surfactant | Others |
|---|---|---|---|---|---|---|---|
| A-1 | Cyclohexanone (80) | ma-1 (6.16) Y-1 (5.84) | KAYARAD DPHA (4.91) | Polymer Compound 1 (0.48) | CGI-242 (2.0) | F-781 (0.02) | DCMA (0.61) |
| A-2 | Cyclohexanone (74.24) | Y-8 (6.88) C-1 (6.88) | Monomer A (8.38) | — | Oxime A (3.6) | Surfactant A (0.02) | — |
| A-3 | Cyclohexanone (80.57) | M-1 (4.8) C-1 (3.6) | Monomer B (6.9) | Resin A (1.5) | Oxime B (3.6) | F-781 (0.03) | — |
| A-4 | Ethyl lactate (75.71) | Valifest Yellow 1101 (5.35) Acid Red 57 (6.1) | KAYARAD DPHA (9.3) | — | Triazine A (3.5) | Surfactant A (0.04) | AD-1 (0.0001) |

The unit in the parentheses is parts by mass

The details of the components in Table 2 are as follows.
Dye Y-8: Compound represented by Formula (Y-1) described above;
Dye C-1: tetraazaporphyrin dye represented by Formula (A) described above;
Dye M-1: azomethine dye represented by Formula (1) described above;
Resin A: benzyl methacrylate/methacrylic acid copolymer (=80/20);
Monomer A: TO-1382 (trade name, manufactured by Toagosei Co., Ltd.);
Monomer B: TO-2360 (trade name, manufactured by Toagosei Co., Ltd.);
Oxime A: 2-(O-benzoyloxime)-1-[4-(phenylthio)phenyl]-1,2-octadiene (manufactured by Ciba Specialty Chemicals);
Oxime B: 1-(O-acetyloxime)-1-[9-ethyl-6-(2-methylbenzoyl)-9H-carbazole-3-yl]-ethanone (manufactured by Ciba Specialty Chemicals);
Triazine A: TAZ-107 (trade name, manufactured by Midori Kagaku Co., Ltd);
Surfactant A: F-475 (trade name, manufactured by DIC Corporation);
F-781: surfactant (trade name, manufactured by DIC Corporation); and
AD-1: p-methoxyphenol (polymerization inhibitor).

TABLE 3

Transparent Curable Composition

| | Organic Solvent | Polymerizable Monomer | Alkaline-soluble Binder | Photo-polymerization Initiator | Surfactant | Others |
|---|---|---|---|---|---|---|
| CT-1 | PGMEA (63.0) EEP (27.0) | KAYARAD DPHA (4.88) | Resin (4.88) | Oxime A (0.23) | Surfactant A (0.01) | AD-1 (0.0001) |
| CT-2 | PGEMA (63.0) EEP (27.0) | KAYARAD DPHA (9.76) | — | Oxime B (0.23) | Surfactant A (0.01) | — |
| CT-3 | Cyclohexanone (89.66) | KAYARAD DPHA (4.8) | Resin B (4.88) | Oxime A (0.23) | Surfactant A (0.01) | AD-1 (0.0001) |

The unit in the parentheses is parts by mass

The details of the components in Table 3 are described as follows. In addition, the oximes A and B, the surfactant A and AD-1 are as described above.
PGMEA: propyleneglycol monomethylether acetate;
EEP: ethylethoxy propionate;
KAYARAD DPHA (manufacture by Nippon Kayaku Co., Ltd.); and Resin (benzylmethacrylate/methacrylic acid (molar ratio=70:30) copolymer)
Resin B: the following resin (weight average molecular weight: 16,000)

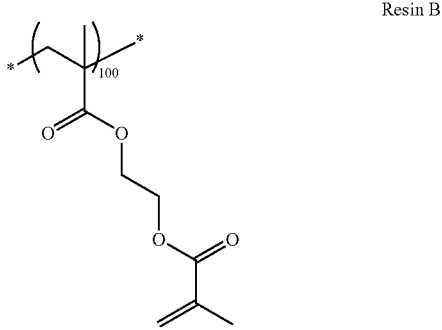

Resin B

As shown in Table 1, in the Example, exuding of the dye is suppressed and the color filters with high color purity and resolution are obtained.

All publications, patent applications, and technical standards mentioned in this specification are herein incorporated by reference to the same extent as if each individual publication, patent application, or technical standard was specifically and individually indicated to be incorporated by reference.

What is claimed is:

1. A method of producing a color filter comprising:
    (a) forming a colored pattern on a substrate by exposing and developing a colored curable composition comprising a dye, a polymerizable monomer and an organic solvent;
    (b) forming a transparent protective film on the colored pattern by using a transparent curable composition composing a photopolymerization initiator, a polymerizable unsaturated compound and an organic solvent, wherein the photopolymerization initiator is an oxime compound; and
    (c) irradiating at least the transparent protective film with light after forming the transparent protective film on the colored pattern, wherein the transparent protective film is irradiated with light including ultraviolet light having a wavelength of 300 nm or less.

2. The method of producing a color filter according to claim 1, wherein the colored curable composition further comprises a photopolymerization initiator and at least one of a fluorine-based surfactant or a silicone-based surfactant.

3. The method of producing a color filter according to claim 1, wherein the transparent protective film in (c) is irradiated with light such that the reaction rate of a polymerizable group of the polymerizable unsaturated compound in the transparent protective film is 50% or more.

4. The method of producing a color filter according to claim 1, wherein the dye is an acid dye.

5. The method of producing a color filter according to claim 1, wherein the content of the dye is 40% by mass or more with respect to the total solid content of the colored curable composition.

6. A color filter formed by the method of producing a color filter according to claim 1.

7. A solid-state image sensor having the color filter according to claim 6.

8. The method of producing a color filter according to claim 1, wherein the content of the polymerizable monomer in the colored curable composition is from 15% by mass to 50% by mass, with respect to the total solid content of the colored curable composition.

* * * * *